(12) United States Patent
Kim et al.

(10) Patent No.: US 10,534,405 B2
(45) Date of Patent: Jan. 14, 2020

(54) SUPPORT STRUCTURE INCLUDING CONDUCTIVE PATHS AND ELECTRONIC DEVICE HAVING THE SAME

(71) Applicant: Samsung Electronics Co., Ltd., Suwon-si, Gyeonggi-do (KR)

(72) Inventors: Min-Soo Kim, Gumi-si (KR); Kyujin Kwak, Daegu (KR); Soo-Gyu Lee, Gumi-si (KR); Sung-Won Park, Suwon-si (KR); Joon Won Chang, Gumi-si (KR); Jin-Wan An, Daegu (KR); Janghoon Lee, Gumi-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/948,799

(22) Filed: Apr. 9, 2018

(65) Prior Publication Data
US 2018/0299929 A1    Oct. 18, 2018

(30) Foreign Application Priority Data
Apr. 12, 2017    (KR) .................. 10-2017-0047482

(51) Int. Cl.
*H05K 7/14*    (2006.01)
*H05K 5/03*    (2006.01)
(Continued)

(52) U.S. Cl.
CPC .......... *G06F 1/1658* (2013.01); *G06F 1/1626* (2013.01); *G06F 1/1635* (2013.01);
(Continued)

(58) Field of Classification Search
CPC ................. G06F 1/1658; G06F 1/1635; G06F 2203/04105; G06F 1/203; G06F 1/20;
(Continued)

(56) References Cited

U.S. PATENT DOCUMENTS 5,739,560 A    4/1998    Tooda et al.
9,832,292 B2 *    11/2017    Moon ....................... G06F 1/20
(Continued)

FOREIGN PATENT DOCUMENTS

| CN | 205749917 U | 11/2016 |
| JP | 2006-289919 A | 10/2006 |

(Continued)

OTHER PUBLICATIONS

European Search Report dated Sep. 21, 2018.
International Search Report dated Jul. 27, 2018.

*Primary Examiner* — Rockshana D Chowdhury
(74) *Attorney, Agent, or Firm* — Jefferson IP Law, LLP

(57) ABSTRACT

An electronic device is provided. The electronic device includes a housing comprising a first plate, a second plate apart from the first plate while facing the first plate, and a side member which surrounds a space between the first plate and the second plate, a touchscreen display exposed through the first plate, a printed circuit board (PCB) disposed between the touchscreen display and the second plate, a mid-plate disposed between the touchscreen display and the PCB, and extending from the side member, and at least one integrated circuit (IC) mounted on the PCB and relating to power, wherein the mid-plate can include at least one conductive path formed on a surface facing the PCB and electrically connected to the at least one IC, and the at least one conductive path can be formed with the same metallic material as the mid-plate.

13 Claims, 30 Drawing Sheets

(51) Int. Cl.
*H05K 1/18* (2006.01)
*G06F 1/16* (2006.01)
*H05K 1/02* (2006.01)
*G06F 1/20* (2006.01)
*H04M 1/02* (2006.01)
*H01Q 1/24* (2006.01)
*H05K 1/14* (2006.01)
*H02J 7/00* (2006.01)
*H05K 1/05* (2006.01)

(52) U.S. Cl.
CPC .......... *G06F 1/1637* (2013.01); *G06F 1/1643* (2013.01); *G06F 1/1656* (2013.01); *G06F 1/1698* (2013.01); *G06F 1/20* (2013.01); *H01Q 1/243* (2013.01); *H04M 1/0277* (2013.01); *H05K 1/028* (2013.01); *H05K 1/144* (2013.01); *H05K 1/181* (2013.01); *H05K 5/03* (2013.01); *H05K 7/1427* (2013.01); *G06F 1/203* (2013.01); *G06F 2203/04105* (2013.01); *H02J 7/0052* (2013.01); *H05K 1/05* (2013.01); *H05K 1/148* (2013.01); *H05K 2201/0311* (2013.01); *H05K 2201/042* (2013.01); *H05K 2201/09227* (2013.01); *H05K 2201/10166* (2013.01)

(58) Field of Classification Search
CPC .... G06F 1/1626; G06F 1/1643; G06F 1/1698; G06F 1/1656; G06F 1/1637; H01Q 1/2266; H04M 1/0277; H05K 1/028; H05K 1/181; H05K 2201/042; H05K 1/148; H05K 2201/10166; H05K 2201/0311; H05K 1/05; H05K 2201/09227; H05K 1/144; H05K 7/1427; H05K 5/03; H02J 7/0052
USPC .................................................... 361/679.55
See application file for complete search history.

(56) References Cited

U.S. PATENT DOCUMENTS

| | | | |
|---|---|---|---|
| 10,038,245 B2* | 7/2018 | Choi | H01Q 1/243 |
| 2011/0228491 A1 | 9/2011 | Sakai et al. | |
| 2011/0291896 A1 | 12/2011 | Pascolini et al. | |
| 2014/0232607 A1* | 8/2014 | Lee | H01Q 1/526 |
| | | | 343/841 |
| 2015/0109170 A1* | 4/2015 | Kang | G06F 1/182 |
| | | | 343/702 |
| 2016/0018856 A1* | 1/2016 | Heo | H05K 9/0064 |
| | | | 361/679.55 |
| 2017/0094818 A1 | 3/2017 | Kim et al. | |
| 2017/0099742 A1 | 4/2017 | Choi et al. | |
| 2017/0281103 A1 | 10/2017 | Han et al. | |

FOREIGN PATENT DOCUMENTS

| | | |
|---|---|---|
| JP | 2010-154291 A | 7/2010 |
| KR | 10-2013-0040891 A | 4/2013 |
| KR | 10-2016-0098099 A | 8/2016 |

* cited by examiner

|  | THICKNESS | WIDTH | LENGTH | VOLUME |
|---|---|---|---|---|
| SIGNAL LINE OF GENERAL PCB | 0.015mm | 0.6mm | 80mm | $0.72mm^3$ |
| SIGNAL LINE OF SUPPORT STRUCTURE 500 | 0.3mm | 0.6mm | 80mm | $14.4mm^3$ |

FIG.13A

| METAL | CONDUCTIVITY (%) | RESISTIVITY (μΩ·cm) | RATIO OF RESISTIVITY TO STANDARD |
|---|---|---|---|
| SILVER | 106 | 1.62 | 0.94 |
| COPPER (STANDARD) | 100 | 1.7241 | 1.00 |
| GOLD | 71.8 | 2.4 | 1.39 |
| ALUMINUM | 62.7 | 2.72 | 1.60 |
| TUNGSTEN | 31.3 | 5.5 | 3.19 |
| ZINC | 29.2 | 5.9 | 3.42 |
| NICKEL | 23.8 | 7.24 | 4.20 |
| PURE IRON | 17.6 | 9.8 | 5.68 |
| STEEL | 17.2 | 10~20 | 5.80~11.6 |

FIG.13B

| IR DROP CALCULATOR | MATERIAL | | COPPER |
|---|---|---|---|
| | CONDUCTIVITY AT ROOM TEMP (20C)(S/m) | | 59500000 |
| | TEMP COEFFICIENT PER DEGREE C | | 0.0039 |
| | TEMP RISE ON MATERIal (C) | | 200 |
| | MATERIAL | | ALUMINIUM |
| | CONDUCTIVITY AT ROMM TEMP (20C)(S/m) | | 35000000 |
| LINE NAME | TICKNESS (um) | WIDTH (um) | DISTANCE (mm) | R (mohm) |
| PART OF SECOND PCB(1420) | 12 | 3000 | 10 | 8.309990663 |
| FIRST CONNECTING MEMBER(1430) | 100 | 1000 | 2.2 | 0.658151261 |
| SIGNAL LINE OF SUPPORT STRUCTURE(1440) | | | | 8.137 |
| SECOND CONNECTING MEMBER(1450) | 100 | 1000 | 2.2 | 0.658151261 |
| LOAD SWITCH(1460) | | | | 23 |
| TOTAL | | | | 40.76329318 |

FIG.14B

| IR DROP CALCULATOR | MATERIAL | COPPER | | |
|---|---|---|---|---|
| | CONDUCTIVITY AT ROOM TEMP (20C)(S/m) | 59500000 | | |
| | TEMP COEFFICIENT PER DEGREE C | 0.0039 | | |
| | TEMP RISE ON MATERIAL (C) | 200 | | |
| LINE NAME | TICKNESS (um) | WIDTH (um) | DISTANCE (mm) | R (mohm) |
| FIRST PART OF SECOND PCB(1520) | 12 | 3000 | 10 | 8.309990663 |
| SECOND PART OF SECOND PCB(1530) | 12 | 4000 | 38 | 23.68347339 |
| BOARD-TO-BOARD CONNECTOR(1540) | | | | 11.8 |
| LOAD SWITCH(1550) | | | | 23 |
| FIRST PCB(1560) | 60 | 550 | 50 | 45.3272218 |
| TOTAL | | | | 112.1206859 |

FIG.15B

SUPPORT STRUCTURE INCLUDING CONDUCTIVE PATHS AND ELECTRONIC DEVICE HAVING THE SAME

CROSS-REFERENCE TO RELATED APPLICATION(S)

The application is based on and claims priority under 35 U.S.C. § 119(a) to a Korean patent application Serial number 10-2017-0047482, filed on Apr. 12, 2017, in the Korean Intellectual Property Office, the entire disclosure of which is incorporated by reference herein in its entirety.

TECHNICAL FIELD

The disclosure relates to a support structure including conductive paths and an electronic device having the same. More particularly, the disclosure relates to a support structure including conductive paths (e.g., signal lines) designed to improve an internal mounting space of an electronic device and to address heat or electromagnetic interference (EMI), and the electronic device having the same.

BACKGROUND

With advances in digital technology, an electronic device is provided in various types, such as a smart phone, a tablet personal computer (PC), and a personal digital assistant (PDA). The electronic device is also developed to be worn by a user so as to improve portability and user accessibility.

The electronic device can include a plurality of signal lines. For example, the electronic device includes a printed circuit board (PCB) and various electronic components mounted thereon. The electronic components can send or receive signals or data through the signal lines of the PCB. The electronic device may include signal lines electrically connecting the PCB and the various electronic components.

An electric current can be set to be below a value (e.g., a maximum current) allowing safe flow in the signal line. The maximum current is a value allowed by an electronic component connected to the signal line, and the signal line can be designed to allow such a maximum current. For example, when the current flows through the signal line, heat can generate due to an electric resistance of the signal line. The heat increases a temperature of the signal line. When this temperature exceeds a limit, the signal line can be damaged (e.g., weakened or broken). For example, the heat produced from the signal line may cause an ignition at the signal line or in its perimeter. To prevent the heat caused by the current flowing through the signal line from damaging the signal line, the signal line can be designed to include a material having a low electrical resistance or to have a considerable volume. In addition, the current flow creates an electric field, and the electric field can cause electromagnetic interference (EMI) by producing noise to a signal transmitted on other signal line or a nearby electronic device. The EMI can interrupt normal operations of the electronic components. To address the EMI (e.g., noise), the signal line can be designed to be distant from the other signal line or the electronic device as far as possible.

The volume of the signal lines or the distance between the signal lines can be increased in design. However, as electronic devices having the portability are preferred and electronic components for various functions and their related signal lines are added to the electronic device, it is more difficult to design the signal lines in the limited space of the electronic device. The increase in volume of the signal lines or the distance between the signal lines in the PCB can be achieved by expanding the PCB, but an internal space of the electronic device can be reduced to make it difficult to mount other elements. The volume of the signal lines electrically connected to the PCB can be increased, but this also reduces the internal space of the electronic device and makes it difficult to mount other elements.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure to provide a support structure including conductive paths (e.g., signal lines) designed to improve an internal mounting space of an electronic device and to address heat or electromagnetic interference (EMI), and the electronic device having the same.

Another aspect of the disclosure is to provide a support structure including conductive paths which can replace at least one signal line on a printed circuit board (PCB) or at least one signal line electrically connected to the PCB, and an electronic device having the same.

According to one aspect of the disclosure, an electronic device can include a housing comprising a first plate, a second plate apart from the first plate while facing the first plate, and a side member which surrounds a space between the first plate and the second plate, a touchscreen display exposed through the first plate, a PCB disposed between the touchscreen display and the second plate, a mid-plate disposed between the touchscreen display and the PCB, and extending from the side member, and at least one integrated circuit (IC) mounted on the PCB and relating to power. The mid-plate can include at least one conductive path formed on a surface facing the PCB and electrically connected to the at least one IC, and the at least one conductive path can be formed with the same metallic material as the mid-plate.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 13A is a table for comparing a signal line of a general PCB (or flexible PCB (FPCB)) and conductive paths of a support structure according to an embodiment of the disclosure;

FIG. 13B is a table illustrating various conductive materials for forming conductive paths according to an embodiment of the disclosure;

FIG. 14B is a table illustrating electrical resistances measured on the power transfer path of FIG. 14A according to an embodiment of the disclosure;

FIG. 15B is a table illustrating electrical resistances measured on the power transfer path of FIG. 15A according to an embodiment of the disclosure;

Throughout the drawings, like reference numerals will be understood to refer to like parts, components and structures.

DETAILED DESCRIPTION

Figure 1:
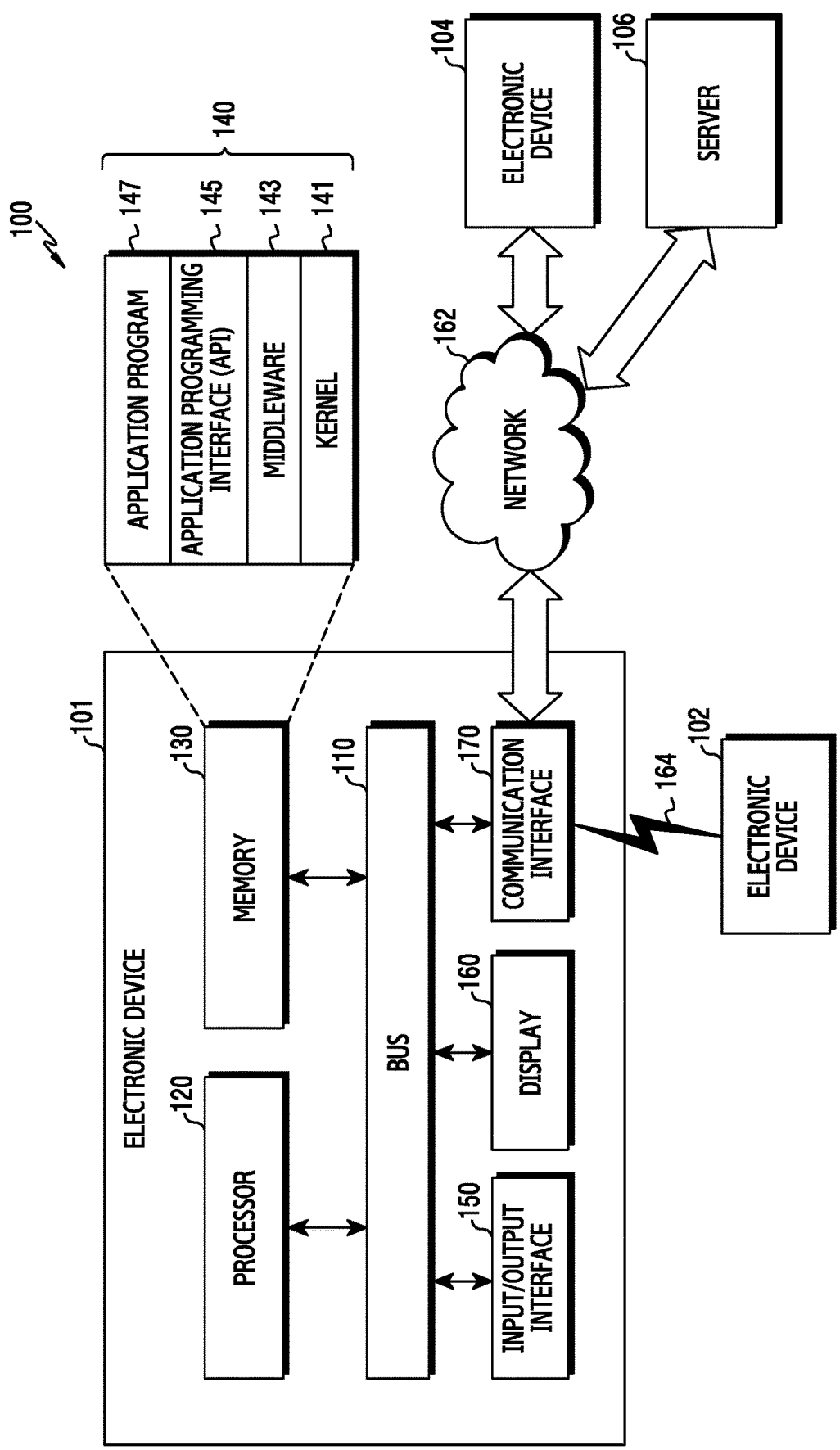
FIG. 1 is a block diagram of a network environment system according to an embodiment of the disclosure.

The following description with reference to the accompanying drawings is provided to assist in a comprehensive understanding of various embodiments of the disclosure as defined by the claims and their equivalents. It includes specific various details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

The singular forms can include plural referents unless the context clearly dictates otherwise. In the disclosure, an expression, such as "A or B," or "at least one of A and/or B," can include all possible combinations of the listed items. Expressions, such as "first," "second," "primarily," or "secondary," can modify corresponding components regardless of order or importance, distinguish one element from another element, and do not limit corresponding elements. When it is described that an element (e.g., a first element) is "(operatively or communicatively) coupled" to or "connected" to another element (e.g., a second element), the element can be directly connected to the other element or can be connected through another element (e.g., a third element).

An expression "configured to (or set to)" used in the disclosure can be used interchangeably with, for example, "suitable for," "having the capacity to," "designed to," "adapted to," "made to," or "capable of" by hardware or by software according to a situation. In some situations, the expression "apparatus configured to" can mean that the apparatus "can" operate together with another apparatus or component. For example, a phrase "a processor configured (or set) to perform A, B, and C" can indicate an exclusive processor (e.g., an embedded processor) for performing a corresponding operation or a generic-purpose processor (e.g., a central processing unit (CPU) or an application processor (AP)) which can perform corresponding operations by executing at least one software program stored at a memory device.

An electronic device according to various embodiments of the disclosure can include, for example, at least one of a smart phone, a tablet personal computer (PC), a mobile phone, a video phone, an e-book reader, a desktop PC, a laptop PC, a netbook computer, a workstation, a server, a personal digital assistant (PDA), a portable multimedia player (PMP), a moving picture experts group phase 1 or phase 2 (MPEG 1 or MPEG-2) audio layer 3 (MP3) player, a medical equipment, a camera, and a wearable device. The wearable device can include at least one of an accessory type (e.g., a watch, a ring, a bracelet, an ankle bracelet, a necklace, glasses, a contact lens, or a head-mounted-device (HMD)), a fabric or clothing embedded type (e.g., electronic garments), a body attachable type (e.g., a skin pad or a tattoo), and an implantable circuit. In some embodiments of the disclosure, the electronic device can include as at least one of, for example, a television, a digital versatile disc (DVD) player, an audio device, a refrigerator, an air-conditioner, a cleaner, an oven, a microwave oven, a washing machine, an air cleaner, a set-top box, a home automation control panel, a security control panel, a media box (e.g., Samsung HomeSync™, Apple TV™, or Google TV™), a game console (e.g., Xbox™, PlayStation™), an electronic dictionary, an electronic key, a camcorder, and an electronic frame.

In other embodiment of the disclosure, the electronic device can include as at least one of various medical devices (e.g., various portable medical measuring devices (a blood sugar measuring device, a heartbeat measuring device, a blood pressure measuring device, or a body temperature measuring device), a magnetic resonance angiography (MRA) device, a magnetic resonance imaging (MRI) device, a computed tomography (CT) device, a scanning machine, and an ultrasonic wave device), a navigation device, a global navigation satellite system (GNSS), an event data recorder (EDR), a flight data recorder (FDR), a vehicle infotainment device, electronic equipment for ship (e.g., a navigation device for ship and gyro compass), avionics, a security device, a head unit for a vehicle, an industrial or home robot, a drone, an automated teller machine (ATM) of a financial institution, a point of sales (POS) device of a store, and an internet of things (IoT) device (e.g., a light bulb, various sensors, a sprinkler device, a fire alarm, a thermostat, a street light, a toaster, sports equipment, a hot water tank, a heater, and a boiler). According to an embodiment of the disclosure, the electronic device can include at least one of a portion of furniture, building/construction or vehicle, an electronic board, an electronic signature receiving device, a projector, or various measuring devices (e.g., water supply, electricity, gas, or electric wave measuring device). According to various embodiments of the disclosure, the electronic device can be flexible or include a combination of two or more of the foregoing various devices. The electronic device according to an embodiment of the disclosure is not limited to the foregoing devices. The term "user", as used herein, can refer to a person using an electronic device or a device using an electronic device (e.g., an artificial intelligence electronic device).

FIG. 1 is a block diagram of a network environment system according to an embodiment of the disclosure.

Referring to FIG. 1, an electronic device 101 resides in a network 100 according to various embodiments. The electronic device 101 can include a bus 110, a processor 120, a memory 130, an input/output interface 150, a display 160, and a communication interface 170. In an embodiment of the disclosure, the electronic device 101 can omit at least one of the components or further include an additional component. The bus 110 can include a circuit for interconnecting the components 120 through 170 and delivering communication signals (e.g., control messages or data) between the components 120 through 170. The processor 120 can include one or more of a CPU, an AP, and a communication processor (CP). The processor 120, for example, can process operations or data regarding control and/or communication of at least other component of the electronic device 101.

The memory 130 can include a volatile and/or nonvolatile memory. The memory 130, for example, can store commands or data relating to at least other component of the electronic device 101. According to an embodiment of the disclosure, the memory 130 can store software and/or a program 140. The program 140 can include, for example, a kernel 141, middleware 143, an application programming Interface (API) 145, and/or an application program (or "application") 147. At least part of the kernel 141, the middleware 143, or the API 145 can be referred to as an operating system (OS). The kernel 141 can control or manage system resources (e.g., the bus 110, the processor 120, or the memory 130) used for performing operations or functions implemented by the other programs (e.g., the middleware 143, the API 145, or the application program 147). Additionally, the kernel 141 can provide an interface for controlling or managing the system resources by accessing the individual component of the electronic device 101 from the middleware 143, the API 145, or the application program 147.

The middleware 143, for example, can serve an intermediary role for exchanging data between the API 145 or the application program 147 and the kernel 141 through the communication. In addition, the middleware 143 can process one or more job requests received from the application program 147, based on their priority. For example, the middleware 143 can assign a priority for using the system resource (e.g., the bus 110, the processor 120, or the memory 130) of the electronic device 101 to at least one of the application programs 147, and process the one or more job requests. The API 145, as an interface through which the application 147 controls a function provided from the kernel 141 or the middleware 143, can include, for example, at least one interface or function (e.g., an instruction) for file control, window control, image processing, or character control. The input/output interface 150 can deliver commands or data inputted from a user or another external device to other component(s) of the electronic device 101, or output commands or data input from the other component(s) of the electronic device 101 to the user or another external device.

The display 160, for example, can include a liquid crystal display (LCD), a light emitting diode (LED) display, an organic light emitting diode (OLED) display, a micro electro mechanical systems (MEMS) display, or an electronic paper display. The display 160, for example, can display various contents (e.g., texts, images, videos, icons, and/or symbols) to the user. The display 160 can include a touch screen, for example, and receive touch, gesture, proximity, or hovering inputs by using an electronic pen or a user's body part. The communication interface 170, for example, can establish communication between the electronic device 101 and an external device (e.g., a first external electronic device 102, a second external electronic device 104, or a server 106). For example, the communication interface 170 can communicate with the external device (e.g., the second external electronic device 104 or the server 106) over a network 162 using wireless communication or wired communication.

The wireless communication, for example, can include cellular communication using at least one of long term evolution (LTE), LTE-Advanced (LTE-A), code division multiple access (CDMA), wideband CDMA (WCDMA), universal mobile telecommunications system (UMTS), wireless broadband (WiBro), and global system for mobile communications (GSM). According to an embodiment of the disclosure, the wireless communication includes a short range wireless communication 164, and the short range wireless communication 164 can include, for example, at least one of Wireless Fidelity (WiFi), Bluetooth (BT), BT low energy (BLE), Zigbee, near field communication (NFC), magnetic secure transmission (MST), radio frequency (RF), or a body area network (BAN). According to an embodiment of the disclosure, the wireless communication can include GNSS. The GNSS can include, for example, global positioning system (GPS), global navigation satellite system (GLONASS), Beidou navigation satellite system (Beidou), or Galileo (the European global satellite-based navigation system). Hereafter, the GPS can be interchangeably used with the GNSS. The wired communication, for example, can include at least one of universal serial bus (USB), high definition multimedia interface (HDMI), Recommended Standard 232 (RS-232), power line communication, and plain old telephone service (POTS). The network 162 can include a telecommunications network, for example, at least one of a computer network (e.g., local area network (LAN) or wide area network (WAN)), Internet, and a telephone network.

Each of the first and second external electronic devices 102 and 104 can be of the same as or a different type from the type of the electronic device 101. According to various embodiments of the disclosure, all or part of the operations executed in the electronic device 101 can be executed by one or more other electronic devices (e.g., the electronic devices 102 and 104, or the server 106). According to an embodiment of the disclosure, when performing a function or a service automatically or by request, instead of or addition to performing the function or the service by the electronic device 101, the electronic device 101 can request at least part of the related function from other device (e.g., the electronic device 102 or 104, or the server 106). The other electronic device (e.g., the electronic device 102 or 104, or the server 106) can perform the requested function or an additional function and provide its result to the electronic device 101. The electronic device 101 can provide the requested function or service by processing the received result as it is or additionally. In doing so, for example, cloud computing, distributed computing, or client-server computing techniques can be used.

Figure 2:
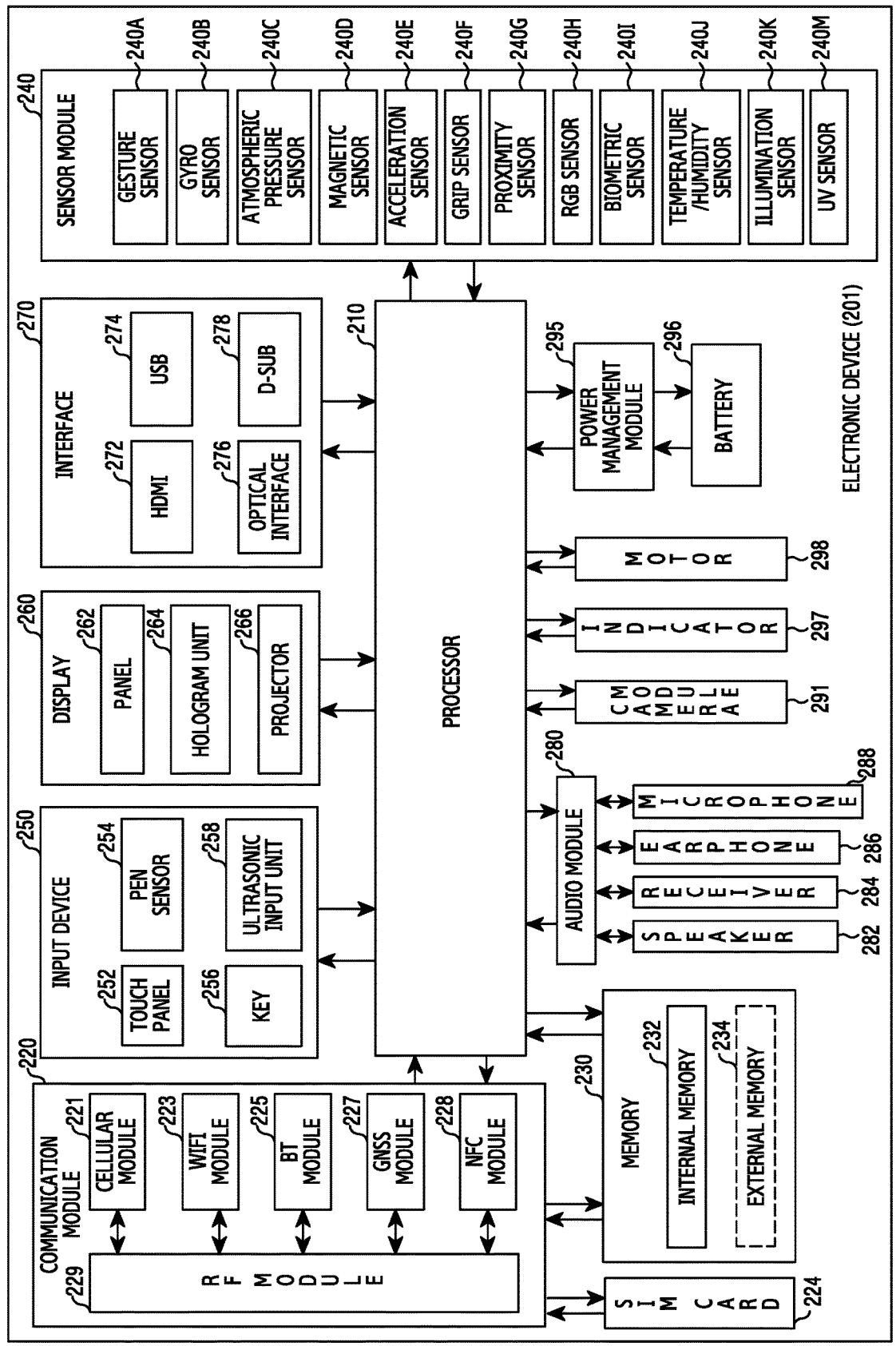
FIG. 2 is a block diagram of an electronic device according to various embodiments of the disclosure.

FIG. 2 is a block diagram of an electronic device according to various embodiments of the disclosure.

Referring to FIG. 2, an electronic device 201, for example, can include all or part of the above-described electronic device 101 of FIG. 1. The electronic device 201 includes one or more processors (e.g., an AP) 210, a communication module 220, a subscriber identification module (SIM) 224, a memory 230, a sensor module 240, an input device 250, a display 260, an interface 270, an audio module 280, a camera module 291, a power management module 295, a battery 296, an indicator 297, and a motor 298.

The processor 210, for example, can control a plurality of hardware or software components connected to the processor 210, and also can perform various data processing and operations by executing an OS or an application program. The processor 210 can be implemented with, for example, a system on chip (SoC). The processor 210 can further include a graphic processing unit (GPU) and/or an image signal processor. The processor 210 may include at least part (e.g., a cellular module 221) of the components of FIG. 2. The processor 210 can load commands or data received from at least one other component (e.g., a nonvolatile memory) into a volatile memory, process them, and store various data in the nonvolatile memory.

The communication module 220 can have the same or similar configuration to the communication interface 170. The communication module 220 can include, for example, the cellular module 221, a WiFi module 223, a BT module 225, a GNSS module 227, an NFC module 228, and an RF module 229. The cellular module 221, for example, can provide voice call, video call, short message service (SMS), or Internet service through a communication network. According to an embodiment of the disclosure, the cellular module 221 can identify and authenticate the electronic device 201 in a communication network by using the SIM (e.g., a SIM card) 224. According to an embodiment of the disclosure, the cellular module 221 can perform at least part of a function of the processor 210. According to an embodiment of the disclosure, the cellular module 221 can further include a CP. According to an embodiment of the disclosure, at least some (e.g., two or more) of the cellular module 221, the WiFi module 223, the BT module 225, the GNSS module 227, and the NFC module 228 can be included in one integrated circuit (IC) or an IC package. The RF module 229, for example, can transmit/receive a communication signal (e.g., an RF signal). The RF module 229, for example, can include a transceiver, a power amp module (PAM), a frequency filter, a low noise amplifier (LNA), or an antenna. According to another embodiment of the disclosure, at least one of the cellular module 221, the WiFi module 223, the BT module 225, the GNSS module 227, and the NFC module 228 can transmit/receive an RF signal through an additional RF module. The SIM 224, for example, can include a card including a SIM or an embedded SIM, and also can contain unique identification information (e.g., an integrated circuit card identifier (ICCID)) or subscriber information (e.g., an international mobile subscriber identity (IMSI)).

The memory 230 (e.g., the memory 130) can include, for example, an internal memory 232 or an external memory 234. The internal memory 232 can include at least one of, for example, a volatile memory (e.g., dynamic RAM (DRAM), static RAM (SRAM), or synchronous dynamic RAM (SDRAM)), and a non-volatile memory (e.g., one time programmable ROM (OTPROM), programmable ROM (PROM), erasable and programmable ROM (EPROM), electrically erasable and programmable ROM (EEPROM), mask ROM, flash ROM, flash memory, hard drive, and solid state drive (SSD)). The external memory 234 can include flash drive, for example, compact flash (CF), secure digital (SD), micro SD, mini SD, extreme digital (xD), multi-media card (MMC), or memory stick. The external memory 234 can be functionally or physically connected to the electronic device 201 through various interfaces.

The sensor module 240 can, for example, measure physical quantities or detect an operating state of the electronic device 201, and thus convert the measured or detected information into electrical signals. The sensor module 240 can include at least one of, for example, a gesture sensor 240A, a gyro sensor 240B, an atmospheric pressure sensor 240C, a magnetic sensor 240D, an acceleration sensor 240E, a grip sensor 240F, a proximity sensor 240G, a color sensor 240H (e.g., a Red, Green, Blue (RGB) sensor), a bio sensor 240I, a temperature/humidity sensor 240J, an illuminance sensor 240K, and an ultra violet (UV) sensor 240M. Additionally or alternately, the sensor module 240 can include an E-nose sensor, an electromyography (EMG) sensor, an electroencephalogram (EEG) sensor, an electrocardiogram (ECG) sensor, an InfraRed (IR) sensor, an iris sensor, and/or a fingerprint sensor. The sensor module 240 can further include a control circuit for controlling at least one sensor therein. According to an embodiment of the disclosure, the electronic device, as part of the processor 210 or individually, can further include a processor configured to control the sensor module 240 and thus control the sensor module 240 while the processor 210 is sleeping.

The input device 250 can include, for example, a touch panel 252, a (digital) pen sensor 254, a key 256, and an ultrasonic input device 258. The touch panel 252 can use at least one of, for example, capacitive, resistive, infrared, and ultrasonic methods. The touch panel 252 can further include a control circuit. The touch panel 252 can further include a tactile layer to provide a tactile response to a user. The (digital) pen sensor 254 can include, for example, part of a touch panel or a sheet for recognition. The key 256 can include, for example, a physical button, a touch key, an optical key, or a keypad. The ultrasonic input device 258 can detect ultrasonic waves from an input means through a microphone (e.g., a microphone 288) and identify data corresponding to the detected ultrasonic waves.

The display 260 (e.g., the display 160) can include a panel 262, a hologram device 264, a projector 266, and/or a control circuit for controlling them. The panel 262 can be implemented to be, for example, flexible, transparent, or wearable. The panel 262 and the touch panel 252 can be configured with one or more modules. According to an embodiment of the disclosure, the panel 262 can include a pressure sensor (or a force sensor) for measuring a pressure level of a user touch. The pressure sensor can be integrated with the touch panel 252, or implemented as one or more sensors separately from the touch panel 252. The hologram device 264 can show three-dimensional images in the air by using the interference of light. The projector 266 can display an image by projecting light on a screen. The screen, for example, can be placed inside or outside the electronic device 201. The interface 270 can include, for example, an HDMI 272, a USB 274, an optical interface 276, or a D-subminiature (D-sub) 278. The interface 270 can be included in, for example, the communication interface 170 of FIG. 1. Additionally or alternately, the interface 270 can include a mobile high-definition link (MHL) interface, a SD card/MMC interface, or an infrared data association (IrDA) standard interface.

The audio module 280, for example, can convert sounds into electrical signals and convert electrical signals into sounds. At least some components of the audio module 280 can be included in, for example, the input/output interface 150 of FIG. 1. The audio module 280 can process sound information inputted or outputted through a speaker 282, a receiver 284, an earphone 286, or the microphone 288. The camera module 291, as a device for capturing still images and videos, can include one or more image sensors (e.g., a front facing sensor or a rear sensor), a lens, an image signal processor (ISP), or a flash (e.g., an LED or a xenon lamp). The power management module 295, for example, can manage the power of the electronic device 201. According to an embodiment of the disclosure, the power management module 295 can include a power management IC (PMIC), a charger IC, or a battery or fuel gauge. The PMIC can have a wired and/or wireless charging method. The wireless charging method can include, for example, a magnetic resonance method, a magnetic induction method, or an electromagnetic method, and can further include an additional circuit for wireless charging, for example, a coil loop, a resonant circuit, or a rectifier circuit. The battery gauge can measure the remaining capacity of the battery 296, or a voltage, current, or temperature of the battery 296 during charging. The battery 296 can include, for example, a rechargeable battery and/or a solar battery.

The indicator 297 can display a specific state of the electronic device 201 or part thereof (e.g., the processor 210), for example, a booting state, a message state, or a charging state. The motor 298 can convert electrical signals into mechanical vibration and generate a vibration or haptic effect. The electronic device 201 can include a mobile TV supporting device (e.g., a GPU) for processing media data according to standards, such as digital multimedia broadcasting (DMB), digital video broadcasting (DVB), or MediaFLOW™.

According to an embodiment of the disclosure, the electronic device 201 can include a first cover (or a first plate) (not shown) forming a first surface facing a first direction, and a second cover (or a second plate) (not shown) forming a second surface facing a second direction which is opposite to the first direction. The electronic device 201 can include a bezel (or a side bezel structure or a side member) surrounding a space between the first cover and the second cover, and a support structure (e.g., a bracket) (not shown) including a mid-plate (or a mounting plate) extending from the bezel to the space.

The components (e.g., the one or more processors (e.g., the AP) 210, the communication module 220, the SIM 224, the memory 230, the sensor module 240, the input device 250, the display 260, the interface 270, the audio module 280, the camera module 291, the power management module 295, the battery 296, the indicator 297, and the motor 298) of the electronic device 201 can be coupled to the support structure. The support structure is designed to improve mechanical characteristics, such as torsional rigidity. When the various components are coupled to the support structure, the electronic device 201 with the improved durability can be formed.

According to an embodiment of the disclosure, the support structure can include at least one conductive path (or signal line). For example, at least part of the support structure can include a nonconductive area (e.g., polymeric material), and the at least one conductive path can be coupled to the nonconductive area. The at least one conductive path can be coupled to a nonconductive material of the support structure, and insulated (or physically separated) from a conductive material of the support structure. The at least one conductive path of the support structure can electrically interconnect the components.

According to various embodiments of the disclosure, the at least one conductive path of the support structure can replace a signal line of a PCB or a signal line electrically connected to the PCB. According to various embodiments of the disclosure, the support structure, which is designed to include at least one signal line without increasing its volume, can improve an internal mounting space of the electronic device or the PCB size and facilitate the signal line design. According to various embodiments of the disclosure, the support structure can be designed substantially not to degrade its rigidity and to include the conductive path (or the signal line). According to various embodiments of the disclosure, the support structure including the conductive path can resolve difficulties in designing the signal line to improve the limited available space of the electronic device or the heat or the electrical interference in the limited region of the PCB. The support structure including the conductive path and the electronic device having the same shall be described by referring to FIGS. 4A through 18.

Each of the above-described components can be configured with one or more components and the name of a corresponding component can vary according to a type of the electronic device. According to various embodiments of the disclosure, an electronic device (e.g., the electronic device 201) can be configured to omit some of the components, to include an additional component, or to combine some of the components as one entity, so that functions of previous corresponding components are performed identically.

Figure 3:
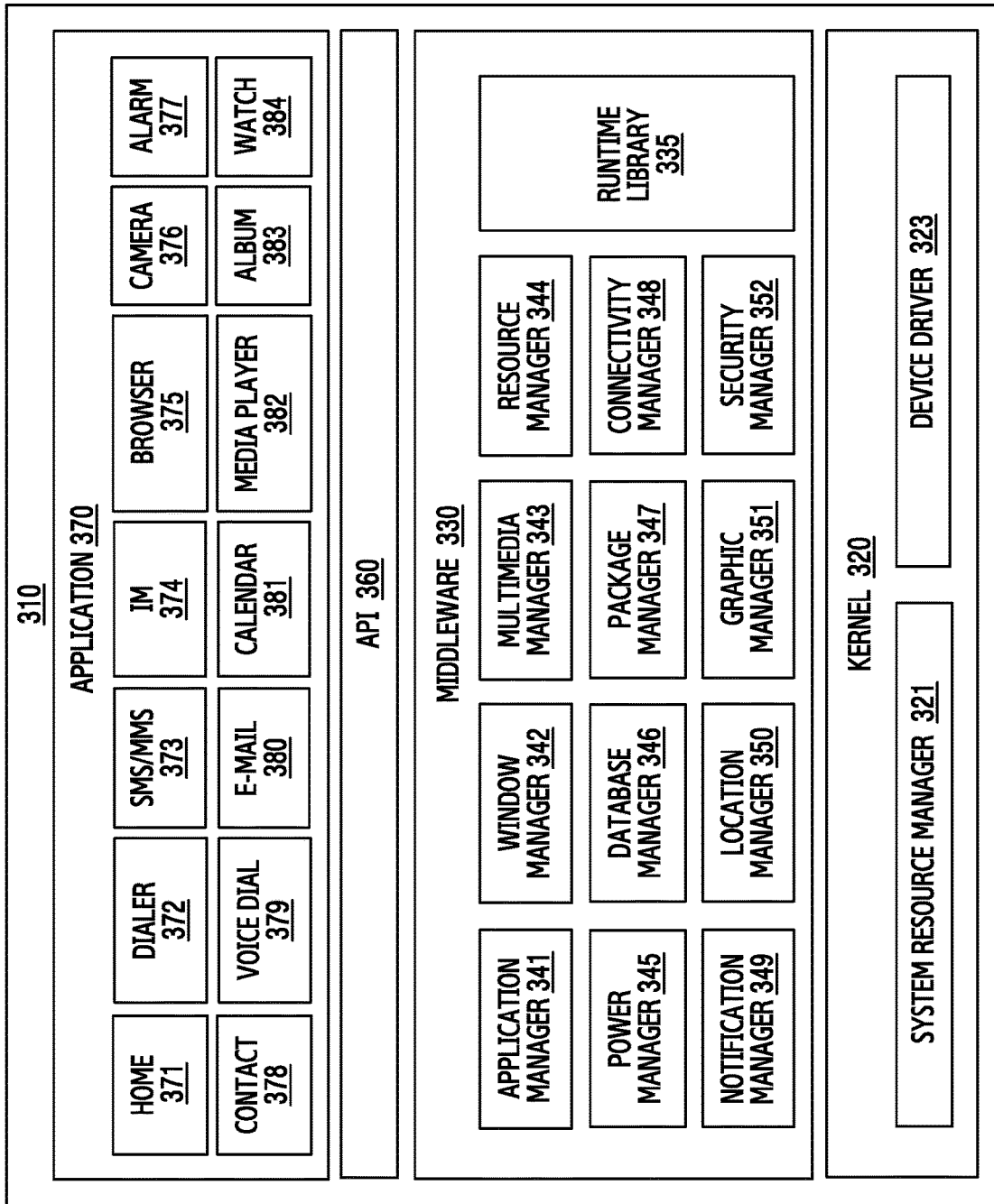
FIG. 3 is a block diagram of a program module according to various embodiments of the disclosure.

FIG. 3 is a block diagram of a program module according to an embodiment of the disclosure.

Referring to FIG. 3, according to an embodiment of the disclosure, a program module 310 (e.g., the program 140) can include an OS for controlling a resource relating to an electronic device (e.g., the electronic device 101) and/or various applications (e.g., the application program 147) running on the OS. The OS can include, for example, Android™, iOS™, Windows™, Symbian™, Tizen™, or Bada™. Referring to FIG. 3, the program module 310 can include a kernel 320 (e.g., the kernel 141), a middleware 330 (e.g., the middleware 143), an API 360 (e.g., the API 145), and/or an application 370 (e.g., the application program 147). At least part of the program module 310 can be preloaded on the electronic device or can be downloaded from an external electronic device (e.g., the electronic device 102, 104, or the server 106).

The kernel 320 includes, for example, at least one of a system resource manager 321 and/or a device driver 323. The system resource manager 321 can control, allocate, or retrieve a system resource. According to an embodiment of the disclosure, the system resource manager 321 can include a process management unit, a memory management unit, or a file system management unit. The device driver 323 can include, for example, a display driver, a camera driver, a Bluetooth driver, a sharing memory driver, a USB driver, a keypad driver, a WiFi driver, an audio driver, or an inter-process communication (IPC) driver. The middleware 330, for example, can provide a function commonly required by the application 370, or can provide various functions to the application 370 through the API 360 in order to allow the application 370 to efficiently use a limited system resource inside the electronic device. According to an embodiment of the disclosure, the middleware 330 includes at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, and a security manager 352.

The runtime library 335 can include, for example, a library module used by a complier to add a new function through a programming language while the application 370 is running. The runtime library 335 can manage input/output, manage memory, or arithmetic function processing. The application manager 341, for example, can manage the life cycle of the applications 370. The window manager 342 can manage a GUI resource used in a screen. The multimedia manager 343 can recognize a format for playing various media files and encode or decode a media file by using the codec in a corresponding format. The resource manager 344 can manage a source code of the application 370 or a memory space. The power manager 345 can manage, for example, the capacity, the temperature, or the power of the battery, and determine or provide power information for an operation of the electronic device using corresponding information. According to an embodiment of the disclosure, the power manager 345 can operate together with a basic input/output system (BIOS). The database manager 346 can create, search, or modify a database used in the application 370. The package manager 347 can manage installation or updating of an application distributed in a package file format.

The connectivity manger 348 can manage, for example, a wireless connection. The notification manager 349 can provide an event, such as incoming messages, appointments, and proximity alerts, to the user. The location manager 350 can manage location information of an electronic device. The graphic manager 351 can manage a graphic effect to be provided to the user or a user interface relating thereto. The security manager 352 can provide, for example, system security or user authentication. According to an embodiment of the disclosure, the middleware 330 can include a telephony manager for managing a voice or video call function of the electronic device, or a middleware module for combining various functions of the above-described components. According to an embodiment of the disclosure, the middleware 330 can provide a module specialized for each type of OS. The middleware 330 can dynamically delete part of the existing components or add new components. The API 360, as a set of API programming functions, can be provided as another configuration according to the OS. For example, Android or iSO can provide one API set for each platform, and Tizen can provide two or more API sets for each platform.

The application 370 can include at least one of a home application 371, a dialer application 372, an SMS/multimedia messaging system (MMS) application 373, an instant message (IM) application 374, a browser application 375, a camera application 376, an alarm application 377, a contact application 378, a voice dial application 379, an e-mail application 380, a calendar application 381, a media player application 382, an album application 383, a clock application 384, health care (e.g., measure an exercise amount or blood sugar level), or environmental information (e.g., air pressure, humidity, or temperature information) provision application. According to an embodiment of the disclosure, the application 370 can include an information exchange application for supporting information exchange between the electronic device and an external electronic device. The information exchange application can include, for example, a notification relay application for relaying specific information to the external device or a device management application for managing the external electronic device. For example, the notification relay application can relay notification information from another application of the electronic device to an external electronic device, or receive and forward notification information from an external electronic device to the user. The device management application, for example, can install, delete, or update a function (e.g., turn-on/turn off of the external electronic device itself (or some components) or display brightness (or resolution) adjustment) of an external electronic device communicating with the electronic device, or an application operating in the external electronic device. According to an embodiment of the disclosure, the application 370 can include a specified application (e.g., a health care application of a mobile medical device) according to a property of the external electronic device. According to an embodiment of the disclosure, the application 370 can include an application received from an external electronic device. At least part of the program module 310 can be implemented (e.g., executed) with software, firmware, hardware (e.g., the processor 210), or a combination of at least two of them, and include a module, a program, a routine, a set of instructions, or a process for executing one or more functions.

Certain aspects of the present disclosure can also be embodied as computer readable code on a non-transitory computer readable recording medium. A non-transitory computer readable recording medium is any data storage device that can store data which can be thereafter read by a computer system. Examples of the non-transitory computer readable recording medium include a Read-Only Memory (ROM), a Random-Access Memory (RAM), Compact Disc-ROMs (CD-ROMs), magnetic tapes, floppy disks, and optical data storage devices. The non-transitory computer readable recording medium can also be distributed over network coupled computer systems so that the computer readable code is stored and executed in a distributed fashion. In addition, functional programs, code, and code segments for accomplishing the present disclosure can be easily construed by programmers skilled in the art to which the present disclosure pertains.

At this point it should be noted that the various embodiments of the present disclosure as described above typically involve the processing of input data and the generation of output data to some extent. This input data processing and output data generation may be implemented in hardware or software in combination with hardware. For example, specific electronic components may be employed in a mobile device or similar or related circuitry for implementing the functions associated with the various embodiments of the present disclosure as described above. Alternatively, one or more processors operating in accordance with stored instructions may implement the functions associated with the various embodiments of the present disclosure as described above. If such is the case, it is within the scope of the present disclosure that such instructions may be stored on one or more non-transitory processor readable mediums. Examples of the processor readable mediums include a ROM, a RAM, CD-ROMs, magnetic tapes, floppy disks, and optical data storage devices. The processor readable mediums can also be distributed over network coupled computer systems so that the instructions are stored and executed in a distributed fashion. In addition, functional computer programs, instructions, and instruction segments for accomplishing the present disclosure can be easily construed by programmers skilled in the art to which the present disclosure pertains.

Figure 4A:
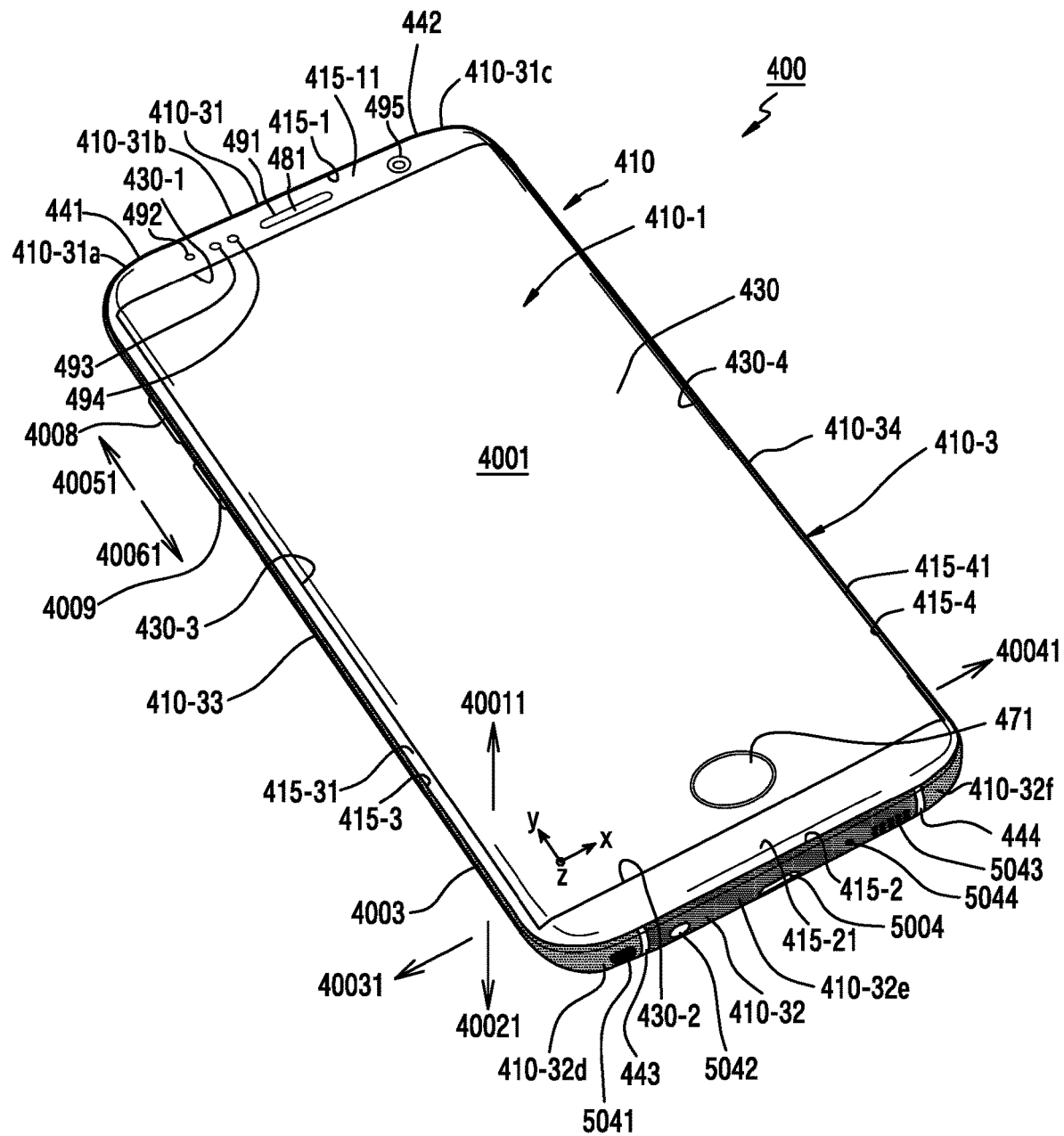
FIGS. 4A, 4B, and 4C are diagrams of a support structure including conductive paths and an electronic device having the same according to various embodiments of the disclosure.
Figure 4B:
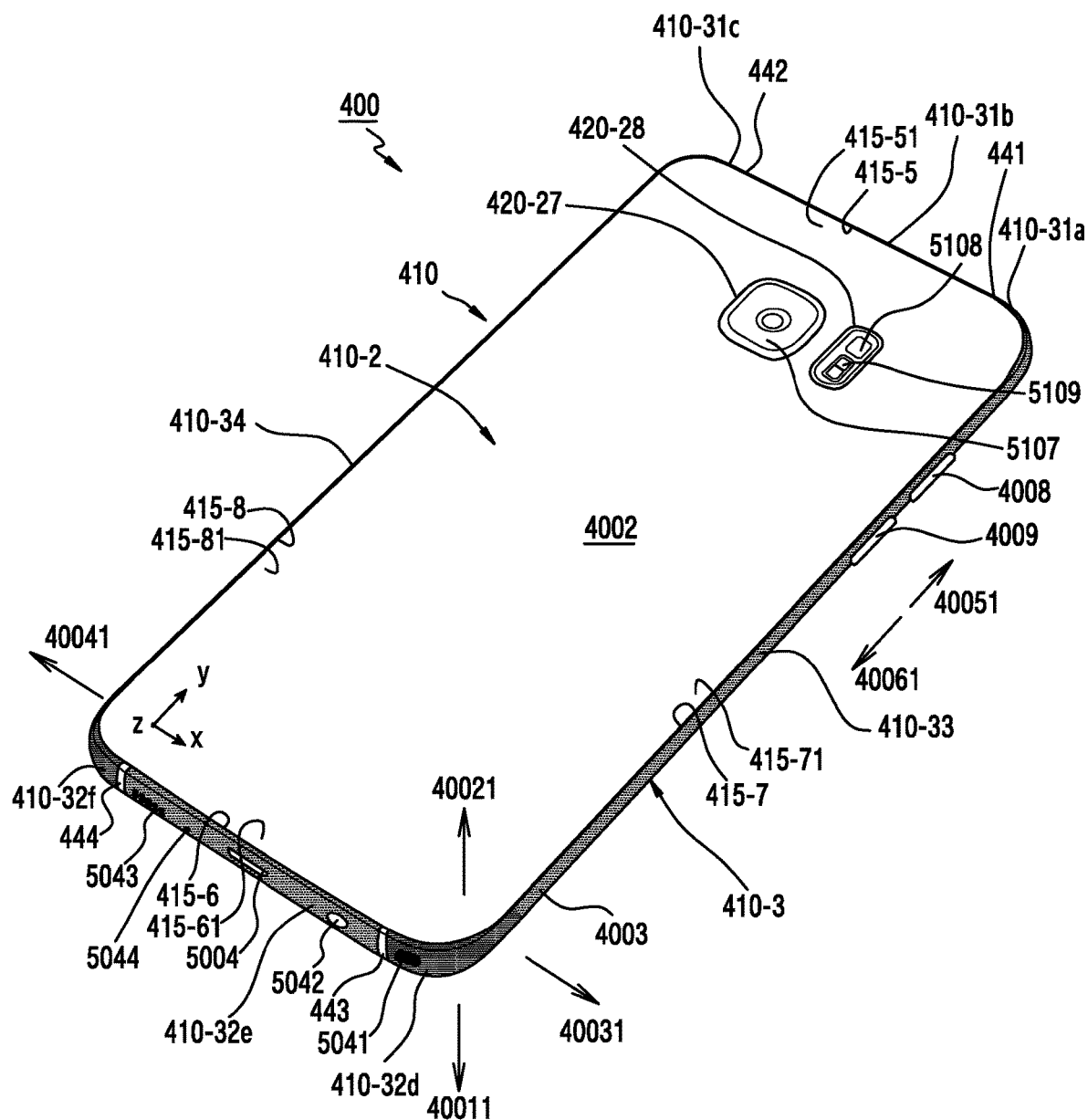
Figure 4C:
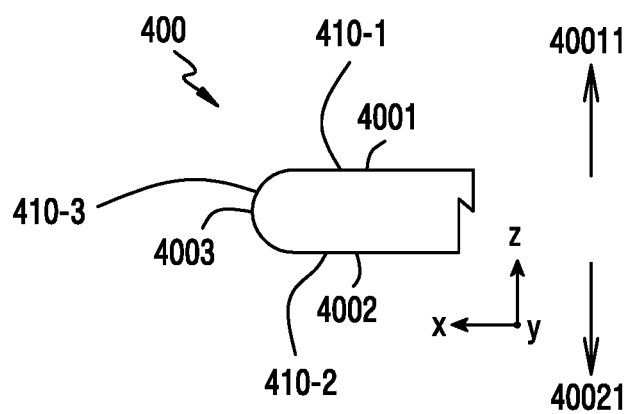
Figure 5:
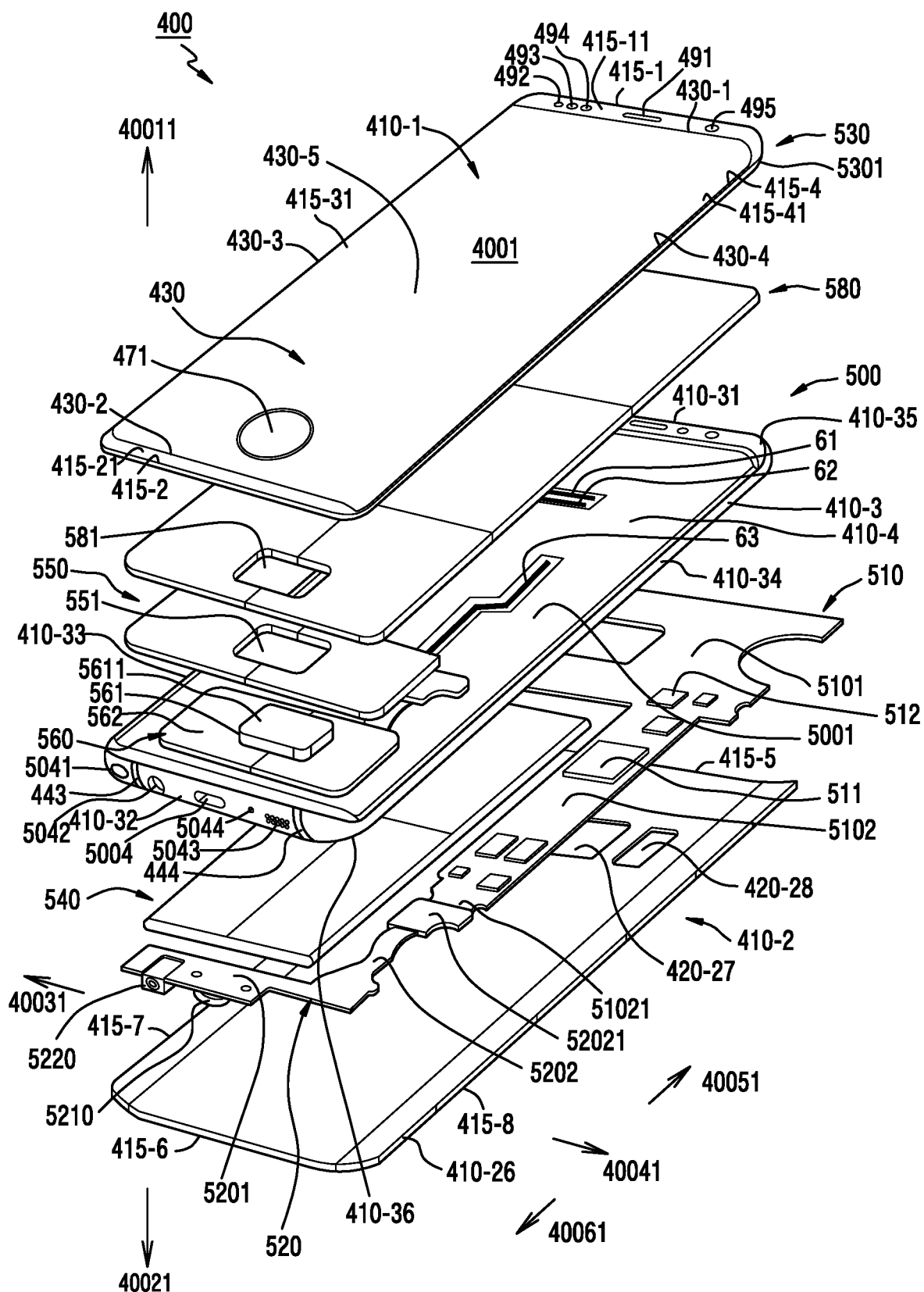
FIG. 5 is an exploded view of a support structure including conductive paths and an electronic device having the same according to an embodiment of the disclosure.

FIGS. 4A, 4B, and 4C are diagrams of a support structure including conductive paths and an electronic device having the same according to various embodiment of the disclosure. FIG. 5 is an exploded view of a support structure including conductive paths and an electronic device having the same according to an embodiment of the disclosure.

Referring to FIGS. 4A, 4B, 4C and 5, in an embodiment of the disclosure, an electronic device 400 can include a housing 410 which forms whole or at least part of an exterior of the electronic device 400. According to various embodiments of the disclosure, the housing 410 can include a nonmetallic material and/or a metallic material. For example, the housing 410 can be formed with a material, such as plastic, metal, carbon fiber and other fiber composites, ceramic, glass, and wood, or a combination of these materials. According to various embodiments of the disclosure, the housing 410 can be formed with a whole material or a combination of materials. According to various embodiments of the disclosure, the housing 410 may be formed with materials partially having different properties.

According to an embodiment of the disclosure, the housing 410 can form the exterior including a first surface 4001, a second surface 4002, and a third surface 4003. The first surface 4001 can face a first direction 40011, and the second surface 4002 can face a second direction 40021 opposite to the first direction 40011. The third surface 4003 can be a side surrounding a space between the first surface 4001 and the second surface 4002.

According to an embodiment of the disclosure, the housing 410 can include a first cover (or a first plate) 410-1 which forms the first surface 4001, and a second cover (or a second plate) 410-2 which forms the second surface 4002. The housing 410 can include a bezel (or a side member) 410-3 surrounding the space between the first cover 410-1 and the second cover 410-2. The bezel 410-3 can form the third surface 4003.

According to an embodiment of the disclosure, the first cover 410-1 can be substantially rectangular, including a first edge 415-1, a second edge 415-2, a third edge 415-3, and a fourth edge 415-4. For example, the first edge 415-1 and the second edge 415-2 can face each other in parallel, and the third edge 415-3 and the fourth edge 415-4 can face each other in parallel.

According to an embodiment of the disclosure, a distance between the first edge 415-1 and the second edge 415-2 can be greater than a distance between the third edge 415-3 and the fourth edge 415-4.

According to various embodiments of the disclosure, a connecting portion (not shown) of the first edge 415-1 and the third edge 415-3, a connecting portion (not shown) of the first edge 415-1 and the fourth edge 415-4, a connecting portion (not shown) of the second edge 415-2 and the third edge 415-3, or a connecting portion (not shown) of the second edge 415-2 and the fourth edge 415-4 can be round.

According to an embodiment of the disclosure, the second cover 410-2 can have a shape similar to or substantially same as to the first cover 410-1. For example, the second cover 410-2 can be substantially rectangular, including a fifth edge 415-5 corresponding to the first edge 415-1, a sixth edge 415-6 corresponding to the second edge 415-2, a seventh edge 415-7 corresponding to the third edge 415-3, and an eighth edge 415-8 corresponding to the fourth edge 415-4.

Referring to FIGS. 4A, 4B, 4C and 5, in an embodiment of the disclosure, the bezel 410-3 can include a first frame 410-31 coupled between the first edge 415-1 of the first cover 410-1 and the fifth edge 415-5 of the second cover 410-2. The bezel 410-3 can include a second frame 410-32 coupled between the second edge 415-2 of the first cover 410-1 and the sixth edge 415-6 of the second cover 410-2. The bezel 410-3 can include a third frame 410-33 coupled between the third edge 415-3 of the first cover 410-1 and the seventh edge 415-7 of the second cover 410-2. The bezel 410-3 can include a fourth frame 410-34 coupled between the fourth edge 415-4 of the first cover 410-1 and the eighth edge 415-8 of the second cover 410-2.

According to various embodiments of the disclosure, a connecting portion (not shown) of the first frame 410-31 and the third frame 410-33, a connecting portion (not shown) of the first frame 410-31 and the fourth frame 410-34, a connecting portion (not shown) of the second frame 410-32 and the third frame 410-33, or a connecting portion (not shown) of the second frame 410-32 and the fourth frame 410-34 can be round.

According to various embodiments of the disclosure, although not depicted, the bezel 410-3 can include an extending portion (e.g., a mid-plate 410-4 of FIG. 5) extending from at least one of the first frame 410-31, the second frame 410-32, the third frame 410-33, and the fourth frame 410-34 to a space (not shown) between the first cover 410-1 and the second cover 410-2. Referring to FIG. 5, for example, a support structure 500 can include the bezel 410-3 including the first frame 410-31, the second frame 410-32, the third frame 410-33, and the fourth frame 410-34, and the mid-plate 410-4 coupled with the bezel 410-3.

According to an embodiment of the disclosure, at least some of the first frame 410-31, the second frame 410-32, the third frame 410-33, and the fourth frame 410-34 of the bezel 410-3 can include a conductive material (e.g., a metallic material).

According to various embodiments of the disclosure, at least one of the first frame 410-31, the second frame 410-32, the third frame 410-33, and the fourth frame 410-34 of the bezel 410-3 can include a plurality of metallic parts physically separated from each other. According to various embodiments of the disclosure, a nonconductive material can be disposed between the metallic parts.

Figure 7:
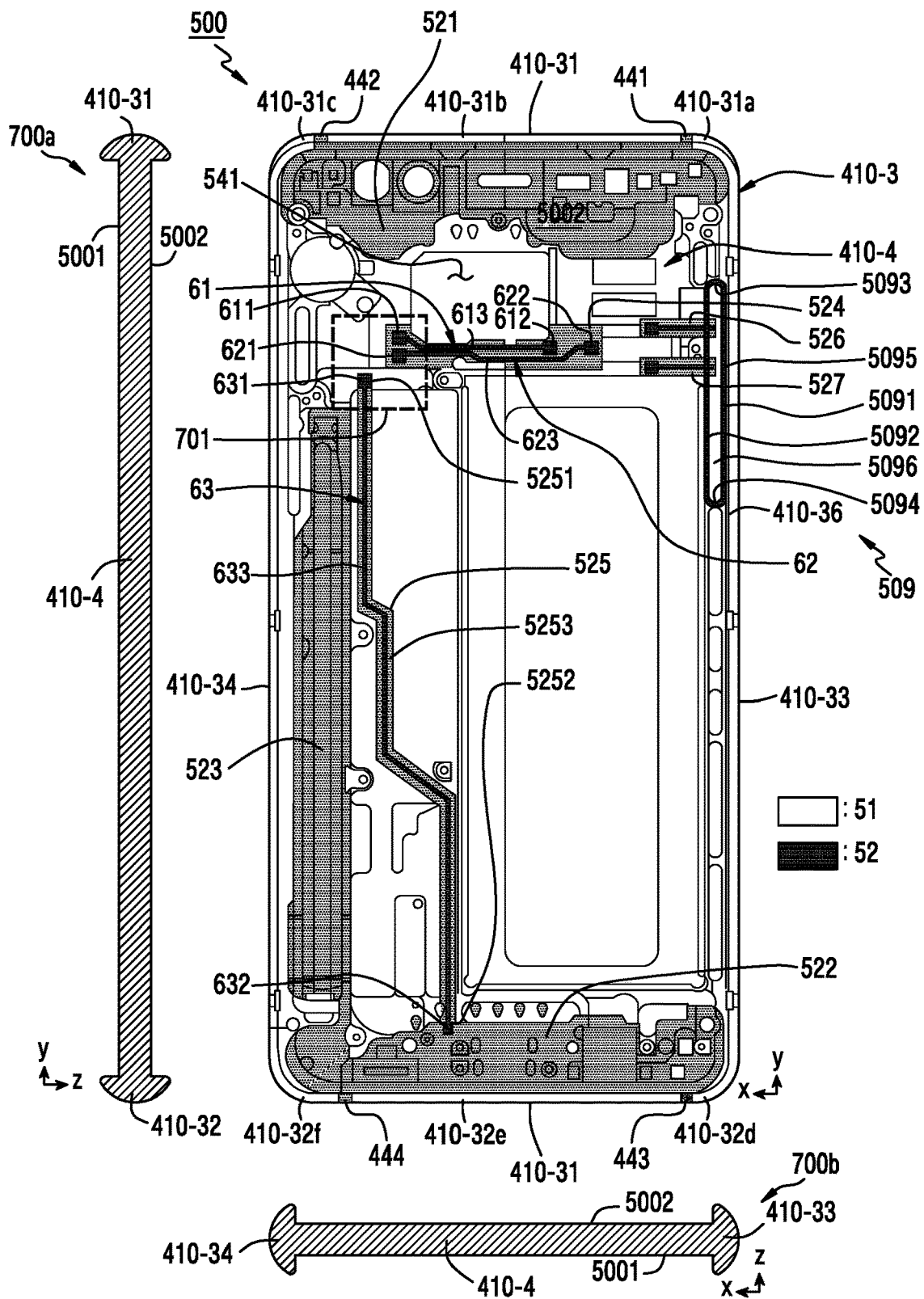
FIGS. 7 and 8 are diagrams of a support structure including conductive paths according to various embodiments of the disclosure.

FIG. 7 depicts a support structure including conductive paths according to an embodiment of the disclosure. Referring to FIGS. 4A, 4B, and 7, for example, the first frame 410-31 of the bezel 410-3 can include a metal sub-frame 410-31a, a metal sub-frame 410-31b, and a metal sub-frame 410-31c, which are physically separated from each other. The metal sub-frame 410-31b can be interposed between the metal sub-frame 410-31a and the metal sub-frame 410-31c. The metal sub-frame 410-31a of the first frame 410-31 can be connected to the third frame 410-33, and the metal sub-frame 410-31c of the first frame 410-31 can be connected to the fourth frame 410-34. The metal sub-frame 410-31a and the third frame 410-33 can be formed with an integral metal, and the metal sub-frame 410-31c and the fourth frame 410-34 can be formed with an integral metal.

Referring to FIGS. 4A, 4B, and 7, in an embodiment of the disclosure, the housing 410 can include a first nonconductive member 441 disposed between the metal sub-frame 410-31a and the metal sub-frame 410-31b of the bezel 410-3. The housing 410 can include a second nonconductive member 442 disposed between the metal sub-frame 410-31b and the metal sub-frame 410-31c. The first nonconductive member 441 and the second nonconductive member 442 can be smoothly connected with the first frame 410-31 and form part of the third surface 4003 of the housing 410.

According to an embodiment of the disclosure, a first gap (not shown) between the metal sub-frame 410-31a and the metal sub-frame 410-31b can be stuffed with the first nonconductive member 441. A second gap (not shown) between the metal sub-frame 410-31b and the metal sub-frame 410-31c can be stuffed with the second nonconductive member 442. Widths of the first gap and the second gap can be the same or different from each other.

Referring to FIGS. 4A, 4B, and 7, for example, the second frame 410-32 of the bezel 410-3 can include a metal sub-frame 410-32d, an metal sub-frame 410-32e, and a metal sub-frame 410-32f which are physically separated from each other. The metal sub-frame 410-32e can be interposed between the metal sub-frame 410-32d and the metal sub-frame 410-32f. The metal sub-frame 410-32d of the second frame 410-32 can be connected to the third frame 410-33, and the metal sub-frame 410-32f of the second frame 410-32 can be connected to the fourth frame 410-34. The metal sub-frame 410-32d and the third frame 410-33 can be integrally formed with a metal, and the metal sub-frame 410-32f and the fourth frame 410-34 can be integrally formed with a metal.

Referring to FIGS. 4A, 4B, and 7, according to an embodiment of the disclosure, the housing 410 can include a third nonconductive member 443 disposed between the metal sub-frame 410-32d and the metal sub-frame 410-32e of the bezel 410-3. The housing 410 can include a fourth nonconductive member 444 disposed between the metal sub-frame 410-32e and the metal sub-frame 410-32f. The third nonconductive member 443 and the fourth nonconductive member 444 can be smoothly connected with the second frame 410-32 and can form part of the third surface 4003 of the housing 410.

According to an embodiment of the disclosure, a third gap (not shown) between the metal sub-frame 410-32d and the metal sub-frame 410-32e can be stuffed with the third nonconductive member 443. A fourth gap (not shown) between the metal sub-frame 410-32e and the metal sub-frame 410-32f can be stuffed with the fourth nonconductive member 444. Widths of the third gap and the fourth gap can be the same or different from each other.

Referring to FIGS. 4A and 5, the first surface 4001 can include a first edge area 415-11 adjacent to (e.g., less than 10 mm) the first edge 415-1, a second edge area 415-21 adjacent to the second edge 415-2, a third edge area 415-31 adjacent to the third edge 415-3, and a fourth edge area 415-41 adjacent to the fourth edge 415-4. According to an embodiment of the disclosure, at least one of the first edge area 415-11, the second edge area 415-21, the third edge area 415-31, and the fourth edge area 415-41 can be an inclined plane. For example, the third edge area 415-31 can be curved downward to the second direction 40021 with respect to coordinates increasing in a direction (hereafter, in a third direction) 40031 from the fourth frame 410-34 to the third frame 410-33. According to various embodiments of the disclosure, the fourth edge area 415-41 can be curved downward to the second direction 40021 with respect to coordinates increasing in a direction (hereafter, in a fourth direction) 40041 from the third frame 410-33 to the fourth frame 410-34. According to other embodiment of the disclosure, although not depicted, the first surface 4001 may be designed as substantially a plane.

Referring to FIGS. 4B and 5, the second surface 4002 can include a fifth edge area 415-51 adjacent to (e.g., less than 10 mm) the fifth edge 415-5, a sixth edge area 415-61 adjacent to the sixth edge 415-6, a seventh edge area 415-71 adjacent to the seventh edge 415-7, and an eighth edge area 415-81 adjacent to the eighth edge 415-8. According to an embodiment of the disclosure, at least one of the fifth edge area 415-51, the sixth edge area 415-61, the seventh edge area 415-71, and the eighth edge area 415-81 can be an inclined plane. For example, the seventh edge area 415-71 can be curved downward to the first direction 40011 with respect to coordinates increasing along the third direction 40031. For example, the eighth edge area 415-81 can be curved downward to the first direction 40011 with respect to coordinates increasing along the fourth direction 40041. According to other embodiment of the disclosure, although not depicted, the second surface 4002 may be designed as substantially a plane.

Referring to FIGS. 4A and 4B, the third surface 4003 can be curved. For example, the first frame 410-31 can include a convex surface in a direction (hereafter, referred to as a fifth direction) 40051 heading from the second frame 410-32 to the first frame 410-31. For example, the second frame 410-32 can include a convex surface in a direction (hereafter, referred to as a sixth direction) 40061 heading from the first frame 410-31 to the second frame 410-32. For example, the third frame 410-33 can include a convex surface in the third direction 40031. For example, the fourth frame 410-34 can include a convex surface in the fourth direction 40041.

According to an embodiment of the disclosure, when an edge area of the first cover 410-1 is curved, the edge area (e.g., the first edge area 415-11, the second edge area 415-21, the third edge area 415-31, or the fourth edge area 415-41) of the first surface 4001 can have an inclined plane. According to various embodiments of the disclosure, when an edge area of the second cover 410-2 is curved, the edge area (e.g., the fifth edge area 415-51, the sixth edge area 415-61, the seventh edge area 415-71, or the eighth edge area 415-81) of the second surface 4004 can have an inclined plane.

The electronic device 400 can include various elements disposed between the first surface 4001 and the second surface 4002. In the following, for example, when an element A, an element B, and an element C area disposed in order along the second direction 40021, it can be defined that the element A is disposed above the element B and the element C is disposed below the element B.

Referring to FIGS. 4A and 5, the electronic device 400 can include a display 530. According to an embodiment of the disclosure, the display 530 can include a display panel 430 (e.g., the panel 262 of FIG. 2) disposed in the space between the first cover 410-1 and the second cover 410-2 of the housing 410. The display panel 430 can include emitting units (e.g., organic light emitting didoes (OLEDs)) including a plurality of pixels, and can be exposed through the first cover 410-1. The display panel 430 can be disposed along at least part of the first cover 410-1. According to various embodiments of the disclosure, the display 530 can be combined with the first cover 410-1 and the display panel 430.

The display panel 430 can be designed to extend along at least part of the first surface 4001. According to an embodiment of the disclosure, the display panel 430 can include a panel edge area (not shown) which overlaps the edge area (e.g., the first edge area 415-11, the second edge area 415-21, the third edge area 415-31, or the fourth edge area 415-41) of the first surface 4001. When at least one edge area of the first surface 4001 is designed as the inclined plane, a corresponding edge area of the display panel 430 can be also curved according to the inclined plane of the first surface 4001. For example, when the third edge area 415-31 or the fourth edge area 415-41 of the first surface 4001 is curved, corresponding edge areas of the first cover 410-1 and the display panel 430 can be also curved.

The display panel 430 can include a panel edge 430-1 adjacent to (e.g., below about 10 mm) the first edge 415-1, a panel edge 430-2 adjacent to the second edge 415-2, a panel edge 430-3 adjacent to the third edge 415-3, and a panel edge 430-4 adjacent to the fourth edge 415-4. According to an embodiment of the disclosure, a gap between the first edge 415-1 and the panel edge 430-1 or a gap between the second edge 415-2 and the panel edge 430-2 can be designed to be greater than a gap between the third edge 415-3 and the panel edge 430-3 or a gap between the fourth edge 415-4 and the panel edge 430-4.

According to various embodiments of the disclosure, an area (e.g., a dead area) between the first edge 415-1 and the panel edge 430-1, between the second edge 415-2 and the panel edge 430-2, between the third edge 415-3 and the panel edge 430-3, or between the fourth edge 415-4 and the panel edge 430-4 can have a color distinguished from an area (e.g., a screen) covered by the display panel 430. For example, the dead area can have a dark color, or a similar color as the same color as a color of the bezel 410-3. According to an embodiment of the disclosure, the dead area of the first cover 410-1 can include a black printed layer.

According to an embodiment of the disclosure, the display 530 can include a first conductive pattern (not shown) interposed between a transparent plate (e.g., the first cover 410-1) and the display panel 430. The first conductive pattern can be used to sense a touch input or a hovering input. For example, the display 530 can be a touchscreen display.

According to various embodiments of the disclosure, the first conductive pattern can include aluminum (Al), copper (Cu), silver (Ag), graphene, indium tin oxide (ITO), or indium zinc oxide (IZO).

According to various embodiments of the disclosure, the first conductive pattern may be disposed inside the display panel 430. For example, the display panel 430 can be an on-cell touch screen panel (TSP) AMOLED (OCTA).

The electronic device 400 can include a touch/hovering input detecting circuit (not shown) electrically connected to the first conductive pattern. The touch/hovering input detecting circuit can activate at least part of the first conductive pattern based on a signal from a control circuit (e.g., the processor 120 of FIG. 1 or the processor 210 of FIG. 2). The touch/hovering input detecting circuit can sense a signal regarding the touch input or the hovering input through the first conductive pattern and provide a result to the control circuit. The control circuit can detect the touch input or the hovering input based on the signal obtained from the touch/hovering input detecting circuit. The touch input can occur when an object (e.g., a finger or a stylus) substantially touches the first surface 4001. The hovering input can occur when an object (e.g., a finger or a stylus) is away from the first surface 4001 within a threshold distance (e.g., about 10 cm).

According to various embodiments of the disclosure, the electronic device 400 can include a second conductive pattern (not shown) disposed along at least part of the first surface 4001, the second surface 4002, and the third surface 4003. According to an embodiment of the disclosure, the second conductive pattern can be disposed along at least part of the display panel 430. According to various embodiments of the disclosure, the second conductive pattern can be disposed along at least part of a rear side of the display panel 430.

The electronic device 400 can include a pressure sensing circuit (not shown) electrically connected to the second conductive pattern. According to an embodiment of the disclosure, the pressure sensing circuit can activate at least part of the second conductive pattern based on a signal from the control circuit (e.g., the processor 120 of FIG. 1 or the processor 210 of FIG. 2). The pressure sensing circuit can detect a pressure signal through the second conductive pattern and provide the detected pressure signal to the control circuit (e.g., the processor 120 of FIG. 1 or the processor 210 of FIG. 2). For example, the second conductive pattern can include a plurality of first electrodes and a plurality of second electrodes. The first electrodes can be arranged on one layer, and the second electrodes can be arranged on another layer. According to various embodiments of the disclosure, the second electrode can be provided in various types of the electronic device 400. For example, the second electrode can include a ground mounted in the electronic device 400. The pressure sensing circuit can apply voltage to the first electrodes and the second electrodes, and accordingly capacitance can occur between the first electrodes and the second electrodes. For example, when an outer surface of the electronic device 400 is pressed, the first electrodes and the second electrodes get close to each other and the capacitance can change (e.g., increase). The pressure sensing circuit can provide the signal based on the capacitance change to the control circuit. The control circuit can detect a location and a level of the pressure based on the signal obtained from the pressure sensing circuit.

According to various embodiments of the disclosure, the electronic device 400 can include a third conductive pattern (not shown) disposed along at least part of the first surface 4001, the second surface 4002, and the third surface 4003. According to an embodiment of the disclosure, the third conductive pattern can be disposed along at least part of the display panel 430. According to various embodiments of the disclosure, the third conductive pattern can be designed to be disposed inside the display 530. For example, the third conductive pattern can be interposed between the transparent plate (e.g., the first cover 410-1) and the first conductive pattern. For example, the third conductive pattern may be interposed between the first conductive pattern and the display panel 430.

According to an embodiment of the disclosure, the third conductive pattern can include an electrode pattern of a mesh structure. The electrode pattern of the mesh structure can be defined as a metal mesh pattern. The metal mesh pattern can include openings. A light produced from the display panel 430 can be emitted to outside through the openings of the metal mesh pattern. According to various embodiments of the disclosure, a mesh shape of the metal mesh pattern can be various. The mesh shape can be, for example, quadrangular or hexagonal. According to various embodiments of the disclosure, the mesh shape of the metal mesh pattern can be consistent on the whole, or partially different. According to various embodiments of the disclosure, a mesh size of the metal mesh pattern can be consistent on the whole, or partially different. According to various embodiments of the disclosure, a thickness of the metal mesh pattern can be consistent on the whole, or partially different.

The electronic device 400 can include a wireless communication circuit (e.g., the communication module 220 of FIG. 2) electrically connected to the third conductive pattern. The wireless communication circuit can activate at least part of the third conductive pattern based on a signal from the control circuit (e.g., the processor 120 of FIG. 1 or the processor 210 of FIG. 2). The wireless communication circuit can wirelessly transmit the signal from the control circuit to the outside using the third conductive pattern. The wireless communication circuit can receive a radio signal from the outside using the third conductive pattern, and provide the signal to the control circuit.

According to an embodiment of the disclosure, the electronic device 400 can include various components (e.g., first components) mounted at locations between the first edge 415-1 and the panel edge 430-1 (e.g., in the area including the first edge area 415-11).

Referring to FIGS. 4A and 5, in various embodiments of the disclosure, the first components can include a receiver 481 for outputting a voice signal received from a counterpart device as a sound during a call. The display 530 (or the first cover 410-1) can include a through hole 491 formed at a location aligned with the receiver 481. The receiver 481 can be coupled with the through hole 491.

Referring to FIGS. 4A and 5, According to various embodiments of the disclosure, the first components can include at least one camera (e.g., a front facing camera (e.g., the camera module 291 of FIG. 2)). The display 530 (or the first cover 410-1) can include a light-transmitting area or a through hole 495 at a location aligned with the at least one camera.

According to various embodiments of the disclosure, the first components can include at least one sensor (e.g., the sensor module 240 of FIG. 2). For example, the first components can include at least one optical sensor (e.g., the illumination sensor 240K, the RGB sensor 240H, the UV sensor 240M, or the gesture sensor 240A of FIG. 2). Referring to FIGS. 4A and 5, the display 530 (or the first cover 410-1) can include one or more light-transmitting areas or through holes 493 and 494 formed at locations aligned with the at least one optical sensor.

According to various embodiments of the disclosure, the electronic device 400 can include optical sensors (not shown) mounted at different locations. For example, the optical sensors can support biometrics (e.g., iris recognition, skin moist detection, skin melanin detection, skin temperature detection). According to various embodiments of the disclosure, the optical sensors can include a spectroscopic sensor.

According to various embodiments of the disclosure, although not depicted, at least one optical sensor may be disposed along at least part of the rear side of the display 530 (or the display panel 430). For example, when at least one optical sensor is disposed on the rear side of the display 530, the display panel 430 can be extended to the first edge area 415-11, or the one or more light-transmitting areas or the through holes 493 and 494 of FIGS. 4A and 5 can be omitted.

According to various embodiments of the disclosure, the first components can include a light emitting element (e.g., an LED) (not shown) indicating various states of the electronic device 400. For example, for a low battery capacity, the electronic device 400 can display a corresponding color through the light emitting element. For example, when a screen is turned off, the electronic device 400 can display a corresponding color through the light emitting element. For example, when the electronic device 400 is connected to a wired charger or a wireless charger, the electronic device 400 can display a corresponding color through the light emitting element. Referring to FIGS. 4A and 5, the display 530 (or the first cover 410-1) can include a light-transmitting area or through hole 492 at a location aligned with the light emitting element. According to various embodiments of the disclosure, when the electronic device 400 is designed to show its various states through the display 530, the light emitting element and the corresponding light-transmitting area or through hole 492 can be omitted in the electronic device 400.

According to various embodiments of the disclosure, in FIGS. 4A and 5, in terms of the third direction 40031 or the fourth direction 40041, the through hole 941 for the receiver 481 can be interposed between the light transmitting areas 493 and 494 for the at least one sensor, and the light transmitting area or the through hole 495 for the camera. According to various embodiments of the disclosure, in terms of the third direction 40031 or the fourth direction 40041, the light transmitting areas 493 and 494 for the at least one sensor can be interposed between the light transmitting area 492 for the light emitting element and the through hole 491 for the receiver 481.

According to various embodiments of the disclosure, although not depicted, when the panel edge 430-1 is further extended toward the first edge 451-1 in the design, the installation structure of the first components can change. For example, the receiver can be mounted near the rear side of the display 530. According to various embodiments of the disclosure, the through hole for emitting the sound of the receiver can be formed at the first frame 410-31. According to various embodiments of the disclosure, the first frame 410-31 can include a groove formed near the first edge 415-1 of the first cover 410-1. When the first cover 410-1 and the first frame 410-31 are coupled, the groove can be used as a hole for the receiver. According to various embodiments of the disclosure, the display 530 can include a through hole for the receiver. According to various embodiments of the disclosure, a bone conductive receiver may be mounted in the electronic device 400. When the bone conductive receiver is mounted, the through hole for emitting the sound from the receiver can be omitted. For example, the location of the front facing camera can change. According to various embodiments of the disclosure, the front facing camera can be aligned with the light transmitting area or the through hole of the second edge area 415-21.

Referring to FIGS. 4A and 5, according to an embodiment of the disclosure, the electronic device 400 can display a software home button 471 through the display panel 430. The control circuit (e.g., the processor 120 of FIG. 1 or the processor 210 of FIG. 2) can display the software home button 471 near (e.g., within 20 mm or so) the panel edge 430-2. The control circuit can display the software home button 471 in the middle of the panel edge 430-3 and the panel edge 430-4. According to various embodiments of the disclosure, although not depicted, the control circuit may display the software home button 471 at other various locations.

According to various embodiments of the disclosure, the control circuit can determine the display location of the software home button 471 according to a user preference or an executed application (or mode).

According to various embodiments of the disclosure, the control circuit can determine the display location of the software home button 471 according to a user's hand (e.g., a left hand or a right hand) in a one-hand mode (e.g., the user holds the electronic device 400 with one hand). Whether the user holds the electronic device 400 with one hand can be determined based at least in part on information from at least one sensor (e.g., the sensor module 240 of FIG. 2). According to various embodiments of the disclosure, the one-hand mode may be selectively executed according to the user input or the executed application. According to various embodiments of the disclosure, the electronic device 400 can be designed to allow the user to select the hand to use (e.g., a left hand or a right hand) in the one-hand mode. According to various embodiments of the disclosure, the electronic device 400 can be designed to allow the user to select a location for easily selecting the software home button 471 with a thumb while holding the electronic device 400 with one hand. According to various embodiments of the disclosure, a shape or a size of the software home button 471 can vary according to the user input or the executed application.

When the software home button 471 is selected by a touch input or a hovering input, the control circuit (e.g., the processor 120 of FIG. 1 or the processor 210 of FIG. 2) can display a main home screen through the display panel 430. The main home screen can be an initial screen displayed on the display panel 430 when the electronic device 400 is turned on. When a plurality of home screens is provided as switchable pages, the main home screen can include icons for executing the applications, time, and date. According to various embodiments of the disclosure, the home screen can show the state of the electronic device 400, such as battery charging state, received signal strength, or current time. According to other embodiment of the disclosure, when the software home button 471 is selected, the control circuit can switch the electronic device 400 into a sleep mode or a low-power mode. In the sleep mode or the low-power mode, the control circuit can perform only basic operations, such as periodically hearing a radio signal from the outside. In the sleep mode or the low-power mode, the control circuit can deactivate at least one element (e.g., the display 530). In the sleep mode or the low-power mode, at least part of the control circuit can be deactivated. According to various embodiments of the disclosure, when the software home button 471 is selected, the control circuit can switch from the sleep mode or the low-power mode to a wake-up mode. For example, in the wake-up mode, the control circuit can activate the display 530.

According to various embodiments of the disclosure, when the main home screen displayed through the display panel 430, the control circuit (e.g., the processor 120 of FIG. 1 or the processor 210 of FIG. 2) may not display the software home button 471. According to various embodiments of the disclosure, the software home button 471 can be selectively displayed according to the user preference or the application execution.

According to various embodiments of the disclosure, the control circuit (e.g., the processor 120 of FIG. 1 or the processor 210 of FIG. 2) may activate only part of the display panel 430 and display the software home button 471 in the activated area. For example, when the software home button 471 is selected, the control circuit can activate the rest area of the display panel 430.

When the software home button 471 is selected by a touch input or a hovering input, the control circuit (e.g., the processor 120 of FIG. 1 or the processor 210 of FIG. 2) can be designed to execute a function of the software home button 471 based on a signal generated from a pressure sensor aligned with the software home button 471. According to an embodiment of the disclosure, the pressure sensor can be included in a force touch panel 550 of FIG. 5. According to other embodiment of the disclosure, although not depicted, at least part of the second conductive pattern of the display 530 aligned with the software home button 471 may be designed as the pressure sensor.

According to various embodiments of the disclosure, the electronic device 400 can be designed to display not only the software home button 471 but also various buttons through the display panel 430. For example, although not depicted, the control circuit (e.g., the processor 120 of FIG. 1 or the processor 210 of FIG. 2) can display a multitasking button of various functions or a cancel button near the software home button 471.

According to various embodiments of the disclosure, although not depicted, when the area between the second edge 415-2 and the panel edge 430-2 is extended, the electronic device 400 may include various electronic components (e.g., second components) provided between the second edge 415-2 and the panel edge 430-2. According to an embodiment of the disclosure, the second components can include a hardware home button (not shown). The hardware home button can replace the software home button 471.

According to various embodiments of the disclosure, the control circuit (e.g., the processor 120 of FIG. 1 or the processor 210 of FIG. 2) may always activate an area (an area adjacent to the panel edge 430-1) of the display panel 430 and thus display a clock, a calendar, a schedule, or user preference information in this area (e.g., an always on display (AOD) function).

Referring to FIG. 5, according to an embodiment of the disclosure, the electronic device 400 can include a digitizer panel 580 disposed under the display 530. The digitizer panel 580 can support a touch input or a hovering input using the stylus. According to various embodiments of the disclosure, the digitizer panel 580 can be disposed along at least part of the screen (or the display panel 430). According to an embodiment of the disclosure, the digitizer panel 580 can be of a quadrangular plate shape in a size overlapping a quadrangular area 430-5 between the panel edge 430-3 and the panel edge 430-4 of the display panel 430. According to various embodiments of the disclosure, although not depicted, the digitizer panel 580 may be extended to overlap curved edge areas (not shown) of the display panel 430, and the extended portion may be curved as well.

According to various embodiments of the disclosure, the digitizer panel 580 can be designed to have flexibility. For example, the digitizer panel 580 can be designed as a flexible PCB (FPCB).

Referring to FIG. 5, in an embodiment of the disclosure, the electronic device 400 can include the force touch panel 550 disposed under the digitizer panel 580. The force touch panel 550 can be aligned under the software home button 471, and have a size overlapping part of the digitizer panel 580 or the display 530.

When an external force is applied to the displayed software home button 471 in the second direction 40021, the force touch panel 550 can generate a pressure signal. According to an embodiment of the disclosure, the force touch panel 550 can include a plurality of first electrodes and a plurality of second electrodes. The first electrodes can be arranged on a first layer, and the second electrodes can be arranged on a second layer under the first layer. A pressure sensing circuit (not shown) can apply voltage to the first electrodes and the second electrodes, and thus capacitance can occur between the first electrodes and the second electrodes. When a finger presses the displayed portion of the software home button 471, the first electrodes and the second electrodes get close to each other and the capacitance can change (e.g., increase). The pressure sensing circuit can provide the capacitance change signal to the control circuit (e.g., the processor 120 of FIG. 1 or the processor 210 of FIG. 2). The control circuit can obtain a pressure level applied to the displayed software home button 471 based on the signal obtained from the pressure sensing circuit. The control circuit can perform a function of the software home button 471 based on the pressure level.

According to an embodiment of the disclosure, when an external force applied to the displayed software home button 471, the pressed area of the display 530 can hang downwards in the second direction 40021 and press the force touch panel 550. According to various embodiments of the disclosure, the display 530 can include the first cover 410-1, and a plurality of layers (e.g., a polarization layer, the display pane 430, an embo/cushion layer, and the like) below the first cover 410-1. At least one of the layers can be designed to have the flexibility. When at least part of the layers of the display 530 have the flexibility, the external force exerted onto the software home button 471 can make part of the display 530 hang downward and press the force touch panel 550.

According to various embodiments of the disclosure, the control circuit (e.g., the processor 120 of FIG. 1 or the processor 210 of FIG. 2) can active a vibrator (e.g., the motor 298 of FIG. 2 based on the pressure signal obtained from the force touch panel 550. For example, when the pressure signal obtained from the force touch panel 550 exceeds a threshold, the control circuit can activate the vibrator.

According to an embodiment of the disclosure, when detecting the touch input or the hovering input which selects the software home button 471, the control circuit (e.g., the processor 120 of FIG. 1 or the processor 210 of FIG. 2) can activate the force touch panel 550 to acquire the pressure signal.

According to various embodiments of the disclosure, the software home button 471 can be limited to the location notification of the force touch panel 550. When detecting the touch input or the hovering input which selects the software home button 471, the control circuit (e.g., the processor 120 of FIG. 1 or the processor 210 of FIG. 2) may invalidate the touch input or the hovering input.

According to various embodiments of the disclosure, although not depicted, in lieu of the software home button 471, the electronic device 400 may be designed to include a hardware home button disposed on the force touch panel 550. The display 530 can include a through hole (not shown) for the hardware home button, and the hardware home button can be coupled with the through hole of the display 530.

According to various embodiments of the disclosure, although not depicted, when the area between the second edge 415-2 and the panel edge 430-2 are extended, the electronic device 400 may include second components provided between the second edge 415-2 and the panel edge 430-2. According to an embodiment of the disclosure, the second components can include the hardware home button (not shown) which can replace the software home button 471.

Referring to FIG. 5, the electronic device 400 can include a fingerprint scanning sensor 560 disposed under the display 530. The fingerprint scanning sensor 560 can be aligned under the software home button 471. When a finger touches the displayed location (or the area) of the software home button 471, the fingerprint scanning sensor 560 can generate an electrical signal regarding fingerprint information. According to an embodiment of the disclosure, the fingerprint scanning sensor 560 can include an optical sensor 561. The optical sensor 561 can include a light receiver (not shown) and a light emitter (not shown). The light emitter can output a light of a corresponding wavelength band for the fingerprint scanning. The light receiver can receive a light of a corresponding wavelength band in the fingerprint scanning. For example, the light of the wavelength band of the fingerprint scan is emitted from the light emitter to the finger covering the software home button 471 through the displayed area of the software home button 471, and at least part of the light (or an optical energy or an optical signal) scattered or reflected from the finger can flow into the light receiver. The light receiver can generate an electrical signal of the fingerprint with the scattered or reflected light, and send the electrical signal to the control circuit (e.g., the processor 120 of FIG. 1 or the processor 210 of FIG. 2).

According to an embodiment of the disclosure, part or whole of the display 530 showing the software home button 471 can be designed to include a light transmitting material.

The optical sensor 561 of the fingerprint scanning sensor 560 can be disposed on the rear side of the display 530. According to an embodiment of the disclosure, the fingerprint scanning sensor 560 can include a panel 562. The optical sensor 561 can be coupled on the panel 562. The panel 562 can include fingerprint scanning components or signal lines (e.g., electrical lines) electrically connected to the optical sensor 561, and can be connected to a PCB (e.g., the first PCB 510). The digitizer panel 580 can include a through hole 581 aligned with the optical sensor 561. The force touch panel 550 can include a through hole 551 aligned with the optical sensor 561. The panel 562 of the fingerprint scanning sensor 560 can be disposed under the force touch panel 550, the optical sensor 561 of the fingerprint scanning sensor 560 can be inserted to the through hole 551 of the force touch panel 550 and the through hole 581 of the digitizer panel 580, and an upper part 5611 of the optical sensor 561 can be disposed near the rear side of the display 530.

According to an embodiment of the disclosure, when detecting the touch input or the hovering input which selects the software home button 471, the control circuit (e.g., the processor 120 of FIG. 1 or the processor 210 of FIG. 2) can activate the fingerprint scanning sensor 560 to acquire a fingerprint signal.

According to an embodiment of the disclosure, when a pressure level obtained through the force touch panel 550 exceeds a threshold, the control circuit (e.g., the processor 120 of FIG. 1 or the processor 210 of FIG. 2) may activate the fingerprint scanning sensor 560 to obtain a fingerprint signal.

According to various embodiments of the disclosure, the software home button 471 can merely indicate the location of the optical sensor 561 of the fingerprint scanning sensor 560. When detecting the touch input or the hovering input which selects the software home button 471, the control circuit (e.g., the processor 120 of FIG. 1 or the processor 210 of FIG. 2) may invalidate the touch input or the hovering input.

Figure 8:
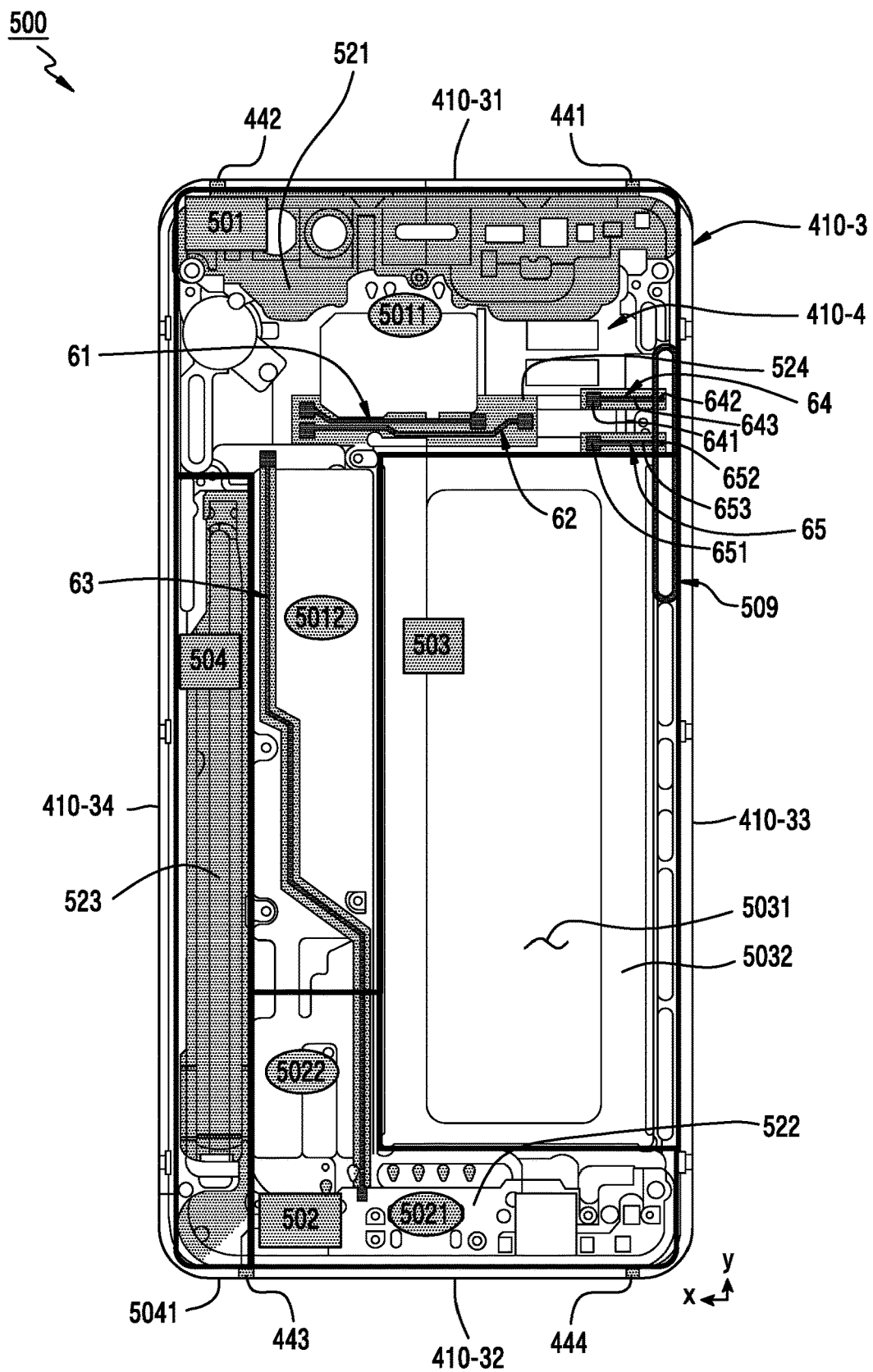

FIGS. 7 and 8 are diagrams of a support structure including conductive paths according to various embodiments of the disclosure.

Figure 6:
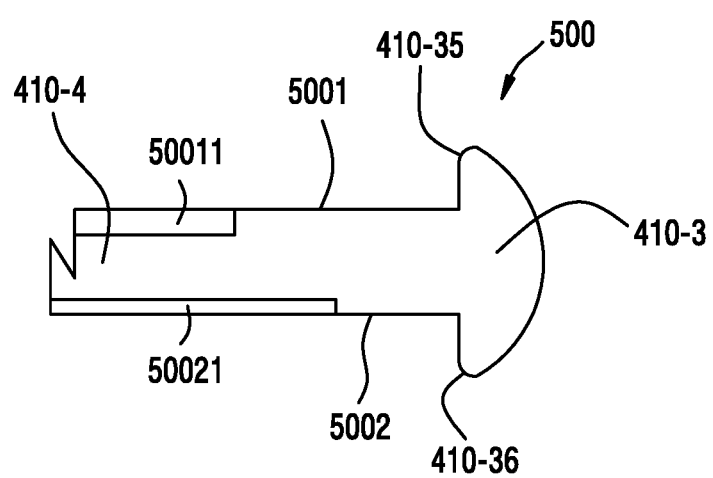
FIG. 6 is a simplified cross-sectional view of a support structure according to an embodiment of the disclosure.

Referring to FIGS. 5, 6, and 7, the support structure 500 can include the bezel (or the side member) 410-3 and the mid-plate 410-4. The bezel 410-3 can be in a substantially rectangular ring shape, including the first frame 410-31, the second frame 410-32, the third frame 410-33, and the fourth frame 410-34. The mid-plate 410-4 can be extended from the frames 410-31 through 410-34 into the bezel 410-3. Referring to FIG. 7, from cross-sectional views 700*a* and 700*b*, the support structure 500 can be designed to have a substantially H-shaped cross-sectional view, which can enhance mechanical features, such as torsional rigidity of the support structure 500. When the components, such as the display 530 and the PCBs 510 and 520 are coupled with the support structure 500, the electronic device 400 with the improved durability can be built.

Referring to FIGS. 5, 6, and 7, in an embodiment of the disclosure, the support structure 500 can include a first mounting surface 5001 facing the first direction 40011 and a second mounting surface 5002 facing the second direction 40021. Referring to FIG. 5, the first mounting surface 5001 of the support structure 500 can include a bezel upper edge 410-35 formed along the frames (e.g., the first frame 410-31, the second frame 410-32, the third frame 410-33, and the fourth frame 410-34) of the bezel 410-3. A display edge 5301 of the display 530 can be coupled to the bezel upper edge 410-35, and a space for mounting the digitizer panel 580, the force touch panel 550, and the fingerprint scanning sensor 560 can be formed between the display 530 and the support structure 500.

Referring to FIGS. 5, 6, and 7, the second mounting surface 5002 of the support structure 500 can include a bezel lower edge 410-36 (FIG. 7) formed along the frames (e.g., the first frame 410-31, the second frame 410-32, the third frame 410-33, and the fourth frame 410-34) of the bezel 410-3. A second cover edge 410-26 of the second cover 410-2 can be coupled to the bezel lower edge 410-36, and a space for mounting other electronic components (e.g., the PCBs 510 and 520, a battery (or a battery pack 540)) can be formed between the second cover 410-2 and the support structure 500.

According to an embodiment of the disclosure, although not depicted, the bezel 410-3 may be integrally formed with the second cover 410-2.

FIG. 6 is a simplified cross-sectional view of a support structure according to an embodiment of the disclosure.

Referring to FIG. 6, the first mounting surface 5001 or the second mounting surface 5002 can include various grooves 50011 and 50021 or ribs for fitting or supporting the components.

According to an embodiment of the disclosure, the second mounting surface 5002 of the support structure 500 can include a plurality of mounting portions for mounting the components.

FIG. 8 depicts a support structure including conductive paths according to an embodiment of the disclosure.

Referring to FIG. 8, the second mounting surface 5002 can include a first mounting portion 501 coupled with the first PCB 510. The second mounting surface 5002 can include a second mounting portion 502 coupled with the second PCB 520. The second mounting surface 5002 can include a third mounting portion 503 coupled with the battery 540.

The battery 540 can be designed to be coupled with the third mounting portion 503 using bolt fastening or an adhesive member, and not to be separated from the electronic device 400. The battery 540 can be separated from the electronic device 400 by force, but is not classified as a detachable component. According to various embodiments of the disclosure, the third mounting portion 503 can include a through part 5031. The battery 540 can be received in an area 5032 around the through part 5031.

According to various embodiments of the disclosure, the battery 540 may be designed as a detachable component. For example, the battery 540 can be coupled (e.g., fitted) to the third mounting portion 503 without using the bolt fastening or the adhesive member. When the second cover 410-2 is detached from the electronic device 400, the battery 540 can be separated from the electronic device 400.

According to various embodiments of the disclosure, the second mounting surface 5002 can include a fourth mounting portion 504 coupled with a stylus (not shown) from the electronic device 400. The electronic device 400 can include a through hole 5041 (FIG. 4A, 4B, 5, 7, or 8) formed at the second frame 410-32. The through hole 5041 can be connected to the fourth mounting portion 504 and used as an entrance for attaching or detaching the stylus.

Referring to FIG. 8, the third mounting portion 503 can be disposed near the third frame 410-33, and be substantially rectangular when viewed from the first direction 40011 of FIG. 5. The fourth mounting portion 504 can be disposed near the fourth frame 410-34, and be substantially rectangular when viewed from the first direction 40011 of FIG. 5.

Referring to FIG. 8, according to an embodiment of the disclosure, the first mounting portion 501 can include a 1-1 mounting portion 5011 and a 1-2 mounting portion 5012. The 1-2 mounting portion 5012 can protrude and extend from the 1-1 mounting portion 5011 in between the third mounting portion 503 and the fourth mounting portion 504. The 1-1 mounting portion 5011 can be surrounded by the first frame 410-31, part of the fourth frame 410-34 connected to the first frame 410-31, the fourth mounting portion 504, the 1-2 mounting portion 5012, the third mounting portion 503, and part of the third frame 410-33 coupled to the first frame 410-31. According to an embodiment of the disclosure, the first mounting portion 501 can be substantially in a T shape.

Referring to FIG. 8, according to an embodiment of the disclosure, the second mounting portion 502 can include a 2-1 mounting portion 5021 and a 2-2 mounting portion 5022. The 2-2 mounting portion 5022 can extend from the 2-1 mounting portion 5021 in between the third mounting portion 503 and the fourth mounting portion 504. The 2-1 mounting portion 5021 can be surrounded by part of the second frame 410-32, part of the third frame 410-33 connected to the second frame 410-32, the third mounting portion 503, the 2-2 mounting portion 5022, and the fourth mounting portion 504. According to an embodiment of the disclosure, the second mounting portion 502 can be substantially in an L shape.

According to various embodiments of the disclosure, when the electronic device 400 is designed not to include the fourth mounting portion 504, the first mounting portion 501 or the second mounting portion 502 can be expanded as at least part of the fourth mounting portion 504.

According to various embodiments of the disclosure, the first mounting portion 501 can include not only an area for mounting the first PCB 510 but also an area for mounting other components electrically coupled to the electronic device 400 (e.g., or the first PCB 510). According to various embodiments of the disclosure, the second mounting portion 502 can include not only an area for mounting the second PCB 520 but also an area for mounting other components electrically coupled to the electronic device 400 (e.g., or the second PCB 520). According to various embodiments of the disclosure, the third mounting portion 503 can also include not only the area for mounting the battery 540 but also an area for mounting other components, and the fourth mounting portion 504 can also include not only the area for mounting the stylus but also an area for mounting other components.

At least part of the bezel 410-3 can include a metallic material or a nonmetallic material. According to an embodiment of the disclosure, the first frame 410-31 can include metal sub-frame 410-31a, the metal sub-frame 410-31b, and the metal sub-frame 410-31c. The first frame 410-31 can include a first non-conductive member 441 interposed between the metal sub-frame 410-31a and the metal sub-frame 410-31b, or a second non-conductive member 442 interposed between the metal sub-frame 410-31b and the metal sub-frame 410-31c. According to an embodiment of the disclosure, the second frame 410-32 can include the metal sub-frame 410-32d, the metal sub-frame 410-32e, and the metal sub-frame 410-32f. The second frame 410-32 can include a third non-conductive member 443 interposed between the metal sub-frame 410-32d and the metal sub-frame 410-32e, or a fourth non-conductive member 444 interposed between the metal sub-frame 410-32e and the metal sub-frame 410-32f. According to an embodiment of the disclosure, the third frame 410-33 or the fourth frame 410-34 can include a metallic material.

Referring to FIG. 7, at least part of the mid-plate 410-4 can include a metallic material or a nonmetallic material. According to an embodiment of the disclosure, the mid-plate 410-4 can include a conductive area (or a metallic material) 51 extending from at least part of the metal sub-frame 410-31a, the metal sub-frame 410-31b, the metal sub-frame 410-31c, the metal sub-frame 410-32d, the metal sub-frame 410-32e, and the metal sub-frame 410-32f of the bezel 410-3. According to various embodiments of the disclosure, the conductive area 51 can form at least part of the first mounting surface 5001 or the second mounting surface 5002.

Referring to FIG. 7, the mid-plate 410-4 can include a nonconductive area 52 coupled to the conductive area 51 of the bezel 410-3. According to an embodiment of the disclosure, the nonconductive area 52 can be formed by removing part of a metal plate for the conductive area 51 and combining a nonmetallic material with the removed area. For example, the nonconductive area 52 can be formed by forming a groove (not shown) dented in the first direction 40011 of FIG. 5 or the second direction 40021 of FIG. 5 in the metal plate for the conductive area 51 and combining the groove with a nonmetallic material. For example, the nonconductive area 52 can be formed by combining the nonmetallic material with the through part (not shown) penetrating between the first mounting surface 5001 and the second mounting surface 5002 in the metal plate for the conductive area 51. The nonconductive area 52 can form at least part of the first mounting surface 5001 or the second mounting surface 5002.

The nonconductive area 52 can be formed to cover at least one electronic component (not shown) of the electronic device 400. According to an embodiment of the disclosure, the nonconductive area 52 can cover at least one antenna (not shown). According to an embodiment of the disclosure, the nonconductive area 52 can include a first nonconductive area 521 disposed near the first frame 410-31, and the first nonconductive area 521 can cover at least part of the at least one antenna coupled to the first PCB 510 of FIG. 5 or the second cover 410-2 of FIG. 5. According to an embodiment of the disclosure, the nonconductive area 52 can include a second nonconductive area 522 disposed near the second frame 410-32, and the second nonconductive area 522 can cover at least part of the at least one antenna coupled to the second PCB 520 of FIG. 5 or the second cover 410-2 of FIG. 5. The first nonconductive area 521 or the second nonconductive area 522 can improve radiation of the at least one antenna.

According to an embodiment of the disclosure, the metal sub-frame 410-31b can be formed by removing two parts of the first frame 410-31 and combining the two parts with the first nonconductive member 441 and the second nonconductive member 442. According to an embodiment of the disclosure, the first nonconductive member 441 and the second nonconductive member 442 can be coupled with the first nonconductive area 421, or extended from the first nonconductive area 421. The metal sub-frame 410-31b can be separated from a metal periphery of the support structure 500 by the first nonconductive member 441, the second nonconductive member 442, and the first nonconductive area 521. When the metal sub-frame 410-31b is designed to be separated from the metal periphery, interference of the support structure 500 (or the bezel 410-3) for the radiation of the at least one antenna can be improved.

Referring to FIG. 7, in an embodiment of the disclosure, the metal sub-frame 410-32e can be formed by removing two parts of the second frame 410-32 and combining the two parts with the third nonconductive member 443 and the fourth nonconductive member 444. According to an embodiment of the disclosure, the third nonconductive member 443 and the fourth nonconductive member 444 can be coupled with the second nonconductive area 522, or extended from the second nonconductive area 522. The metal sub-frame 410-32e can be separated from the metal periphery of the support structure 500 by the third nonconductive member 443, the fourth nonconductive member 444, and the second nonconductive area 522. When the metal sub-frame 410-32*e* is designed to be separated from the metal periphery, the interference of the support structure 500 (or the bezel 410-3) for the radiation of the at least one antenna can be improved.

According to various embodiments of the disclosure, the metal sub-frame 410-31*b* or the metal sub-frame 410-32*e* may be designed as part of the antenna. For example, the metal sub-frame 410-31*b* or the metal sub-frame 410-32*e* can be electrically connected to a wireless communication circuit (e.g., the communication module 220 of FIG. 2) mounted on a PCB (e.g., the first PCB 510 or the second PCB 520 of FIG. 5). According to various embodiments of the disclosure, when the support structure 500 and the PCB 510 or 520 are coupled, part of the metal sub-frame 410-3*lb* or the metal sub-frame 410-32*e* of the support structure 500 or at least one contact extending therefrom can be electrically connected to at least one contact of the PCB 510 or 520. The at least one contact of the PCB 510 or 520 can be electrically connected to at least one antenna or an antenna ground.

Referring to FIG. 7, according to an embodiment of the disclosure, the nonconductive area 52 can include a third nonconductive area 523 including at least part of the fourth mounting portion 504. According to various embodiments of the disclosure, the third nonconductive area 523 can be connected to the second nonconductive area 522.

Referring to FIG. 7, according to an embodiment of the disclosure, the nonconductive area 52 can include a fourth nonconductive area 524 including at least part of the first mounting portion 501. The fourth nonconductive area 524 can substantially extend in shape from the fourth frame 410-34 toward the third frame 410-33. The mid-plate 410-4 can include a through hole 541 (e.g., a rectangular through hole). According to an embodiment of the disclosure, the through hole 541 can be interposed between the first nonconductive area 521 and the fourth nonconductive area 524. According to an embodiment of the disclosure, part of the fourth nonconductive area 524 can be interposed between the first nonconductive area 521 and the 1-2 mounting portion 5012, and another part of the fourth nonconductive area 524 can be interposed between the first nonconductive area 521 and the third mounting portion 503.

Referring to FIGS. 7 and 8, according to an embodiment of the disclosure, the nonconductive area 52 can include a fifth nonconductive area 525 including part of the first mounting portion 501 and part of the second mounting portion 502. For example, the fifth nonconductive area 525 can include a first area 5251 which forms one end of the first mounting portion 501, a second area 5252 which forms the other end of the second mounting portion 502, and a third area 5253 which interconnects the first area 5251 and the second area 5252. Part of the third area 5253 can be disposed in the 1-2 mounting portion 5012 of the first mounting portion 501, and other part of the third area 5253 can be disposed in the 2-2 mounting portion 5022 of the second mounting portion 502.

According to an embodiment of the disclosure, the first area 5251 of the fifth nonconductive area 525 can be disposed between or near (e.g., within 20 mm) the 1-1 mounting portion 5011 and the 1-2 mounting portion 5012 of the first mounting portion 501. According to various embodiments of the disclosure, although not depicted, the first area 5251 of the fifth nonconductive area 525 may be disposed in the 1-1 mounting portion 5011 or the 1-2 mounting portion 5012 of the first mounting portion 501.

According to an embodiment of the disclosure, the second area 5252 of the fifth nonconductive area 525 can be disposed between or near (e.g., within 20 mm) the 2-1 mounting portion 5021 and the 2-2 mounting portion 5022 of the second mounting portion 502. The second area 5252 can be connected to the second nonconductive area 522. According to an embodiment of the disclosure, although not depicted, the second area 5252 may be disposed in the 2-1 mounting portion 5021 or the 2-2 mounting portion 5022 of the second mounting portion 502.

The support structure 500 can include at least signal line (e.g., or conductive path). The at least one conductive path can be coupled with the nonconductive area 52 (e.g., a polymeric material), and physically and electrically separated (e.g., isolated) from the conductive area 51 of the support structure 500.

According to an embodiment of the disclosure, the at least one conductive path of the support structure 500 can be formed with the same metallic material as the conductive area 51.

Referring to FIGS. 5, 7, and 8, the support structure 500 can include a first conductive path (or a first signal line) 61 and a second conductive path (or a second signal line) 62, which are coupled to the fourth nonconductive area 524. The first conductive path 61 or the second conductive path 62 can include a conductive material substantially extending from the fourth frame 410-34 toward the third frame 410-33. The first conductive path 61 can include a first contact 611, a second contact 612, and a first connecting line 613 for interconnecting the first contact 611 and the second contact 612. The second conductive path 62 can include a third contact 621, a fourth contact 622, and a second connecting line 623 for interconnecting the third contact 621 and the fourth contact 622.

According to an embodiment of the disclosure, the first conductive path 61 can be interposed between the through hole 541 and the second conductive path 62.

According to an embodiment of the disclosure, the first contact 611 of the first conductive path 61 and the third contact 621 of the second conductive path 62 can be disposed at the substantially same distance from the fourth frame 410-34. According to various embodiments of the disclosure, the third contact 621 of the second conductive path 62 can be further away from the first frame 410-31 than the first contact 611 of the first conductive path 61.

According to an embodiment of the disclosure, the second contact 612 of the first conductive path 61 can be further away from the third frame 410-33 than the fourth contact 622 of the second conductive path 62. According to various embodiments of the disclosure, the second contact 612 of the first conductive path 61 and the fourth contact 622 of the second conductive path 62 can be disposed at the substantially same distance from the first frame 410-31.

According to various embodiments of the disclosure, a distance between the first contact 611 of the first conductive path 61 and the third contact 621 of the second conductive path 62 can be less than 10 mm or so. According to various embodiments of the disclosure, a distance between the second contact 612 of the first conductive path 61 and the fourth contact 622 of the second conductive path 62 can be less than 10 mm or so.

Referring to FIGS. 5, 7 and 8, according to an embodiment of the disclosure, the support structure 500 can include a third conductive path (or a third signal line) 63 coupled to the fifth nonconductive area 525. The third conductive path 63 can include a conductive material substantially extending from the first frame 410-31 toward the second frame 410-32. The third conductive path 63 can include a fifth contact 631, a sixth contact 632, and a third connecting line 633 for interconnecting the fifth contact 631 and the sixth contact 632. The fifth contact 631 can be coupled to the first area 5251 of the fifth nonconductive area 525. The sixth contact 633 can be coupled to the second area 5252 of the fifth nonconductive area 525. The third connecting line 633 can be coupled to the third area 5253 of the fifth nonconductive area 525.

According to an embodiment of the disclosure, the fifth contact 631 of the third conductive path 63 can be near (e.g., within about 20 mm) the first contact 611 of the first conductive path 61 or the third contact 621 of the second conductive path 62.

Figure 9:
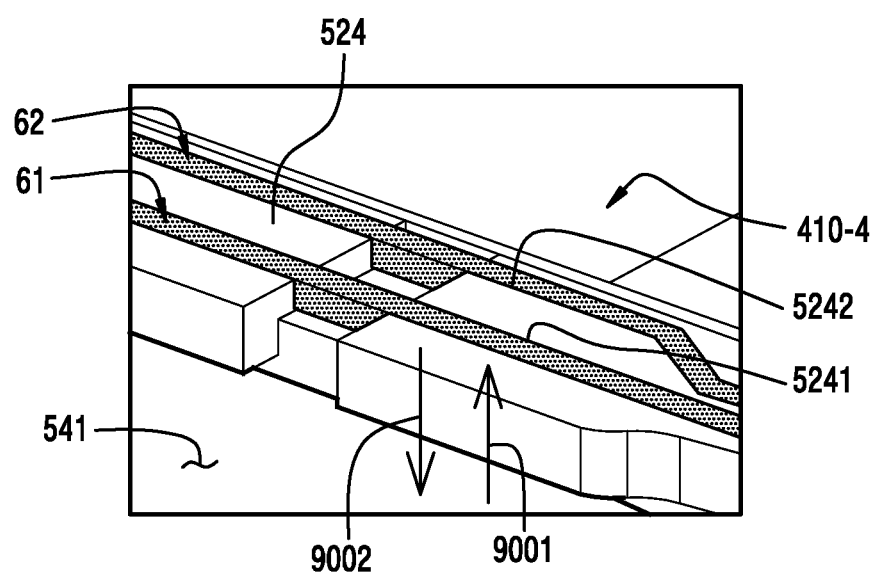
FIG. 9 is a diagram of part of a support structure including other conductive paths according to an embodiment of the disclosure.

FIG. 9 is a diagram of part of a support structure including other conductive paths according to an embodiment of the disclosure.

Referring to FIGS. 6 and 9, according to an embodiment of the disclosure, the fourth nonconductive area 524 of the mid-plate 410-4 can include grooves or through portions 5241 and 5242 dented in a direction 9001 from the first mounting surface 5001 toward the second mounting surface 5002, or in a direction 9002 from the second mounting surface 5002 toward the first mounting surface 5001. The first conductive path 61 and the second conductive path 62 can be coupled with the grooves or the through portions 5241 and 5242 of the fourth nonconductive area 524. Although not depicted, the third conductive path 63 can be formed similarly to the first conductive path 61 or the second conductive path 62.

FIGS. 10A, 10B, 10C, 10D, and 10E are diagrams of a process for forming a support structure including conductive paths (or signal lines) according to an embodiment of the disclosure.

Figure 10A:
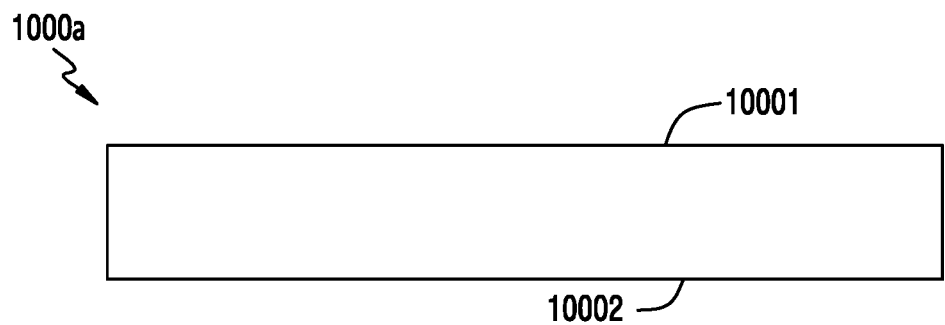
FIGS. 10A, 10B, 10C, 10D, and 10E are diagrams of a process for forming a support structure including conductive paths according to various embodiments of the disclosure.

Referring to FIG. 10A, a first conductive plate 1000*a* including both sides (e.g., a fourth surface 10001 and a fifth surface 10002) can be provided.

Figure 10B:
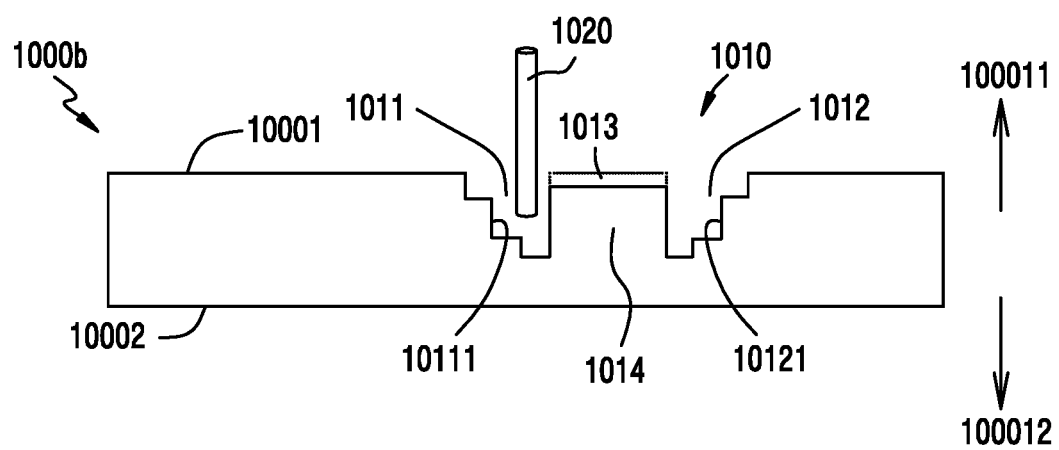

Referring to FIG. 10B, a second conductive plate 1000*b* can be formed by removing (e.g., computer numerical control (CNC) cutting) part of the conductive plate 1000*a* in a direction (hereafter, referred to as an eighth direction) 100012 from the fourth surface 10001 to the fifth surface 10002 using a cutting means 1020. The second conductive plate 1000*b* can include a groove 1010 dented in the eighth direction 100012. According to an embodiment of the disclosure, the groove 1010 can include a first groove 1011 and a second groove 1012 which are separated from each other. Due to the first groove 1011 and the second groove 1012, a protrusion 1014 protruding in a direction (hereafter, referred to as a seventh direction) 100011 from the fifth surface 10002 to the fourth surface 10001 can be formed between the first groove 1011 and the second groove 1012. According to various embodiments of the disclosure, the groove 1010 may include a portion 1013 partially removed from the protrusion 1014 in the eighth direction 100012.

Figure 10C:
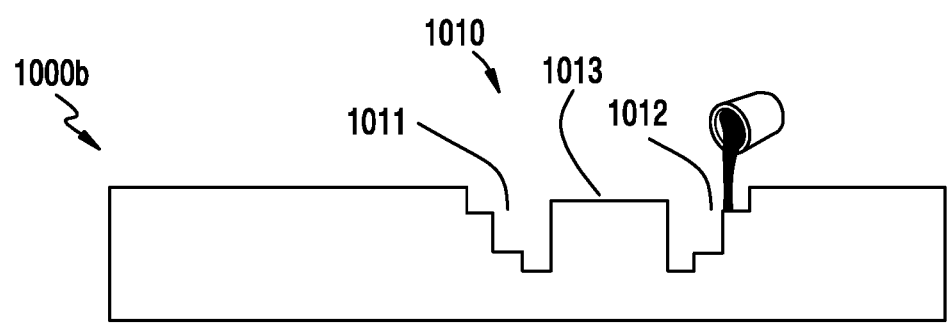
Figure 10D:
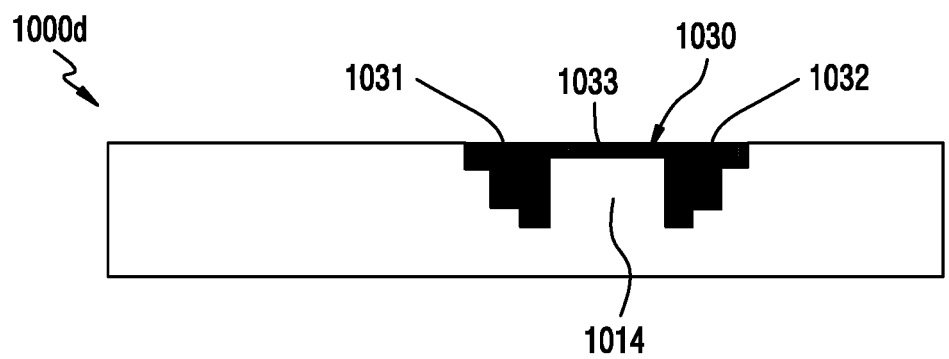

Referring to FIGS. 10C and 10D, a third plate 1000*d* may include a nonconductive member 1030 (e.g., the nonconductive area 52 of FIG. 7) formed by filling and cooling the groove 1010 of the second conductive plate 1000*b* with a melted nonconductive material and coupling with the second conductive plate 1000*b* (e.g., using various molding methods, such as insert molding or double injection). According to an embodiment of the disclosure, the nonconductive member 1030 can include a first part 1031 coupled with the first groove 1011 and a second part 1032 combined with the second groove 1012. According to various embodiments of the disclosure, when the melted nonconductive material covers the protrusion 1014 in design, the nonconductive member 1030 can include a third part 1033 interconnecting the first part 1031 and the second part 1032.

Figure 10E:
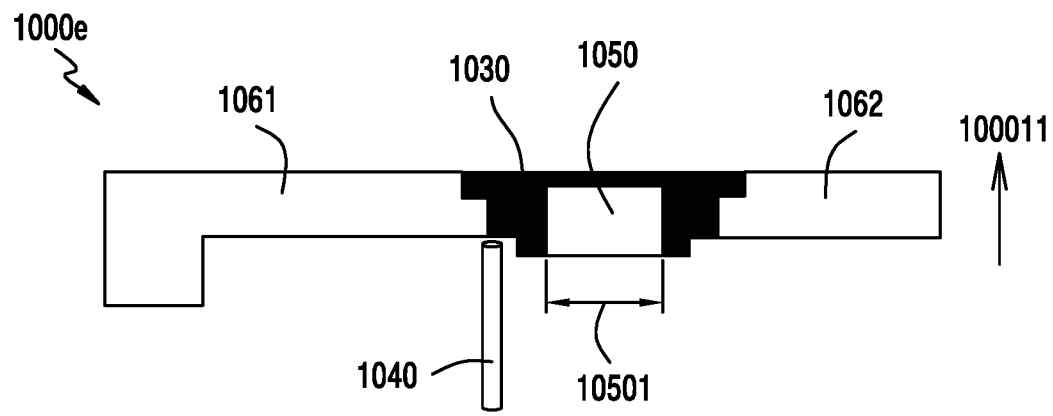

Referring to FIG. 10E, a fourth plate 1000*e* (e.g., the support structure 500 or the mid-plate 410-4 of FIG. 6) can include a metal island by removing part of the third plate 1000*d* of FIG. 10D in the seventh direction 100011 using a cutting means 1040. According to an embodiment of the disclosure, the protrusion 1014 can be coupled with the nonconductive member 1030 and physically separated from nearby conductive parts 1061 and 1062 (the metal island structure). At least part of the protrusion 1014 of the metal island structure can be used as a conductive path 1050 (e.g., the first conductive path 61, the second conductive path 62, or the third conductive path 63 of FIG. 6). According to an embodiment of the disclosure, the protrusion 1014 of the metal island structure can be formed with the same metallic material as the nearby conductive parts 1061 and 1062.

According to various embodiments of the disclosure, a shape and a volume of the conductive path 1050 can vary according to the groove 1010 formed at the second conductive plate 1000*b* of FIG. 10B. For example, a width 10501 of the conductive path 1050 can vary according to a distance between the first groove 1011 and the second groove 1012 of FIG. 10B. While the conductive path 1050 is, but not limited to, rectangular from the cross-sectional view, it can be designed in various shapes.

According to various embodiments of the disclosure, in FIG. 10B, the first groove 1011 or the second groove 1012 can narrow in the eighth direction 100012. For example, in the cross-sectional view, the first groove 1011 can include a stepped surface 10111. The second groove 1012 can also include a stepped surface 10121. The stepped surface 10111 of the first groove 1011 or the stepped surface 10121 of the second groove 1012 can increase a coupling area between the nonconductive member 1030 of FIG. 10D and the second conductive plate 1000*b* of FIG. 10B and improve the coupling between the nonconductive member 1030 and the second conductive plate 1000*b*.

Referring to FIG. 7, according to various embodiments of the disclosure, at least part of the conductive area 51 of the mid-plate 410-4 can be formed with the same material as the metal sub-frames 410-31*a*, 410-31*b*, 410-31*c*, 410-32*d*, 410-32*e*, 410-32*f*, 410-33, or 410-34 of the support structure 500, or with a different conductive material (e.g., magnesium (Mg), aluminum (Al), and the like).

According to various embodiments of the disclosure, the support structure 500 (or the mid-plate 410-4) may be designed as a heat sink plate which blocks electrical noise or improves heating of the electronic component.

Referring to FIGS. 5, 7 and 8, the electronic device 400 can include the battery 540 coupled in the third mounting portion 503 of the support structure 500. According to an embodiment of the disclosure, in the second direction 40021, the third mounting portion 503 can be substantially rectangular and the battery 540 can be in a rectangular plate shape which can be fitted into the third mounting portion 503.

Figure 11A:
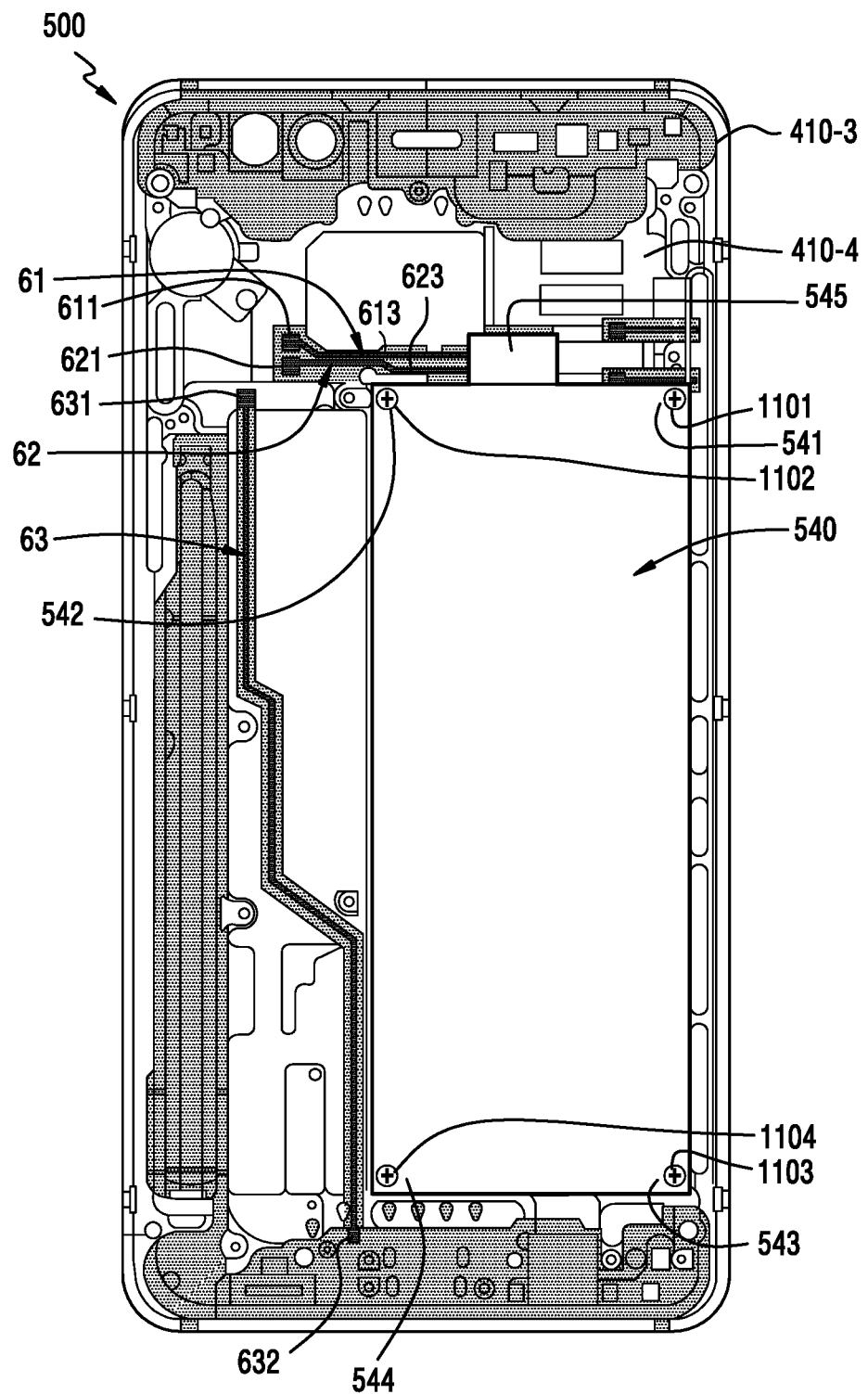
FIG. 11A is a diagram of a support structure coupled with a battery according to an embodiment of the disclosure.
Figure 11B:
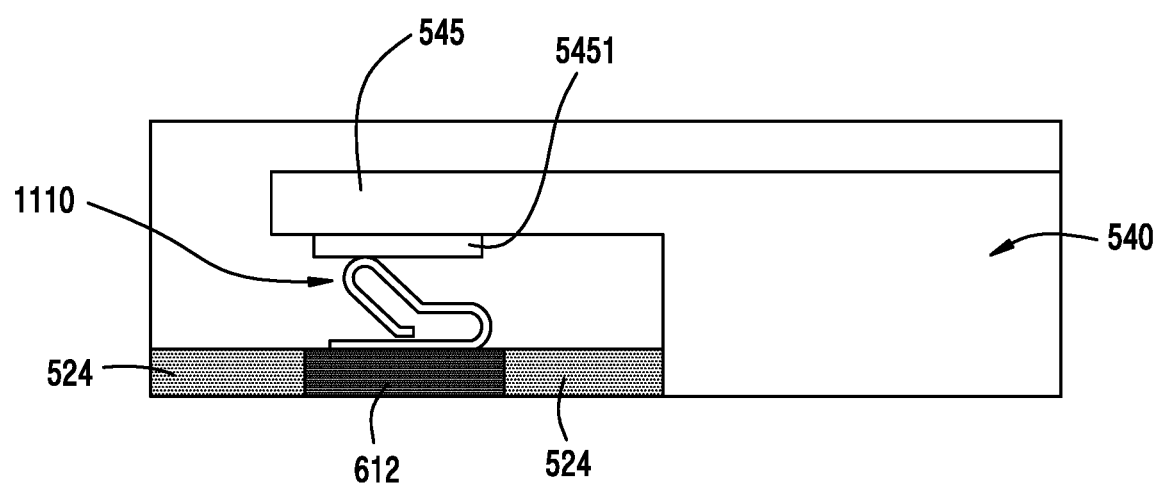
FIG. 11B is a diagram of electrical connections between conductive paths of a support structure and a battery according to an embodiment of the disclosure.

FIG. 11A is a diagram of a support structure coupled with a battery according to an embodiment of the disclosure. FIG. 11B is a diagram of electrical connections between conductive paths of a support structure and a battery according to an embodiment of the disclosure.

Referring to FIG. 11A, the battery 540 can be coupled to the third mounting portion 503 of FIG. 8 using bolts. According to an embodiment of the disclosure, the battery 540 can include bolt fastening holes 541, 542, 543 and 544 formed at four corners respectively. The third mounting portion 503 (FIG. 8) of the mid-plate 410-4 can include bosses (e.g., metallic or nonmetallic cluster including female screws), which are not depicted, corresponding to the bolt fastening holes 541 through 544 of the battery 540. The battery 540 can be coupled to the third mounting portion 503 by putting bolts 1101 through 1104 through the bolt fastening holes 541 through 544 of the battery 540 and then fastening to the bosses of the third mounting portion 503 of FIG. 8. Although not depicted, the battery 540 can be coupled with the third mounting portion 503 of FIG. 8 using various coupling means. For example, the battery 540 and the third mounting portion 503 can be coupled using an adhesive means, such as double-sided tape or bond.

Referring to FIGS. 11A and 11B, according to an embodiment of the disclosure, the battery 540 can include an extending portion 545 projecting to one side. The extending portion 545 can include at least one contact 5451. When the battery 540 is coupled to the support structure 500, the extending portion 545 of the battery 540 can cover part of the first mounting portion 501 of FIG. 8 and the at least one contact 5451 of the extending portion 545 can be electrically connected to the second contact 612 of the first conductive path 61. According to an embodiment of the disclosure, the electronic device 400 can include a flexible conductive member (or a conductive connecting member having elasticity) between the second contact 612 of the first conductive path 61 and the at least one contact 5451 of the extending portion 545. For example, the flexible conductive member can include a C clip 1110, a pogo pin, a spring, conductive poron and rubber, a conductive tape, or a copper connector. The flexible conductive member (e.g., the C clip 1110) can improve the electrical connection between the second contact 612 of the first conductive path 61 and the at least one contact 5451 of the extending portion 545. According to various embodiments of the disclosure, the flexible conductive member (e.g., the C clip 1110) can be disposed in the second contact 612 of the first conductive path 61, or, although not depicted, in the at least one contact 5451 of the extending portion 545. Although not depicted, in the similar manner, the fourth contact 622 of the second conductive path 62 can be electrically connected to the at least one contact 5451 of the extending portion 545 of the battery 540.

Referring to FIGS. 5, 7, and 8, the electronic device 400 can include the first PCB 510 coupled with the first mounting portion 501 of the support structure 500. The first PCB 510 can include a substrate including components for various operations of the electronic device 400 and signal lines (e.g., conductive tracks) or pads electrically connecting the components. According to various embodiments of the disclosure, at least some of the various components (e.g., the one or more processors (e.g., APs) 210, the communication module 220, the SIM 224, the memory 230, the sensor module 240, the input device 250, the display 260, the interface 270, the audio module 280, the camera module 291, the power management module 295, the battery 296, the indicator 297, and the motor 298) of FIG. 2 can be mounted on the first PCB 510 or electrically connected to the first PCB 510. For example, the first PCB 510 can include a processor 511 (e.g., the CPU 120 of FIG. 1 or 210 of FIG. 2). According to an embodiment of the disclosure, the processor 511 can be mounted in a 1-2 PCB part 5102 of the first PCB 510.

According to an embodiment of the disclosure, the first PCB 510 can include a 1-1 PCB part 5101 coupled with the 1-1 mounting portion 5011 of the first mounting portion 501, and the 1-2 PCB part 5102 coupled with the 1-2 mounting portion 5012 of the first mounting portion 501. For example, the first PCB 510 can be substantially in a T shape.

Referring to FIGS. 5, 7, and 8, the electronic device 400 can include a second PCB 520 coupled with the second mounting portion 502 of the support structure 500. The second PCB 520 can include a substrate including components for various operations of the electronic device 400 and signal lines (e.g., conductive tracks) or pads electrically connecting the components. According to various embodiments of the disclosure, at least some of the various components (e.g., the one or more processors (e.g., APs) 210, the communication module 220, the SIM 224, the memory 230, the sensor module 240, the input device 250, the display 260, the interface 270, the audio module 280, the camera module 291, the power management module 295, the battery 296, the indicator 297, and the motor 298) of FIG. 2 can be mounted on the second PCB 520 or electrically connected to the second PCB 520.

According to an embodiment of the disclosure, the second PCB 520 can include a 2-1 PCB part 5201 coupled with the 2-1 mounting portion 5021 of the second mounting portion 502, and a 2-2 PCB part 5202 coupled with the 2-2 mounting portion 5022 of the second mounting portion 502. For example, the second PCB 520 can be substantially in an L shape.

An end of the 1-2 PCB part 5102 of the first PCB 510 can be electrically connected to an end of the 2-2 PCB part 5202 of the second PCB 520. According to an embodiment of the disclosure, an end 51021 of the 1-2 PCB part 5102 of the first PCB 510 can include a first connector (e.g., a female connector or a socket connector), and an end 52021 of the 2-2 PCB part 5202 of the second PCB 520 can include a second connector (e.g., a male connector or a header connector).

According to various embodiments of the disclosure, at least part of the 2-2 PCB part 5202 of the second PCB 520 can be designed to have the flexibility. For example, the 2-2 PCB part 5202 can include an FPCB.

Figure 12A:
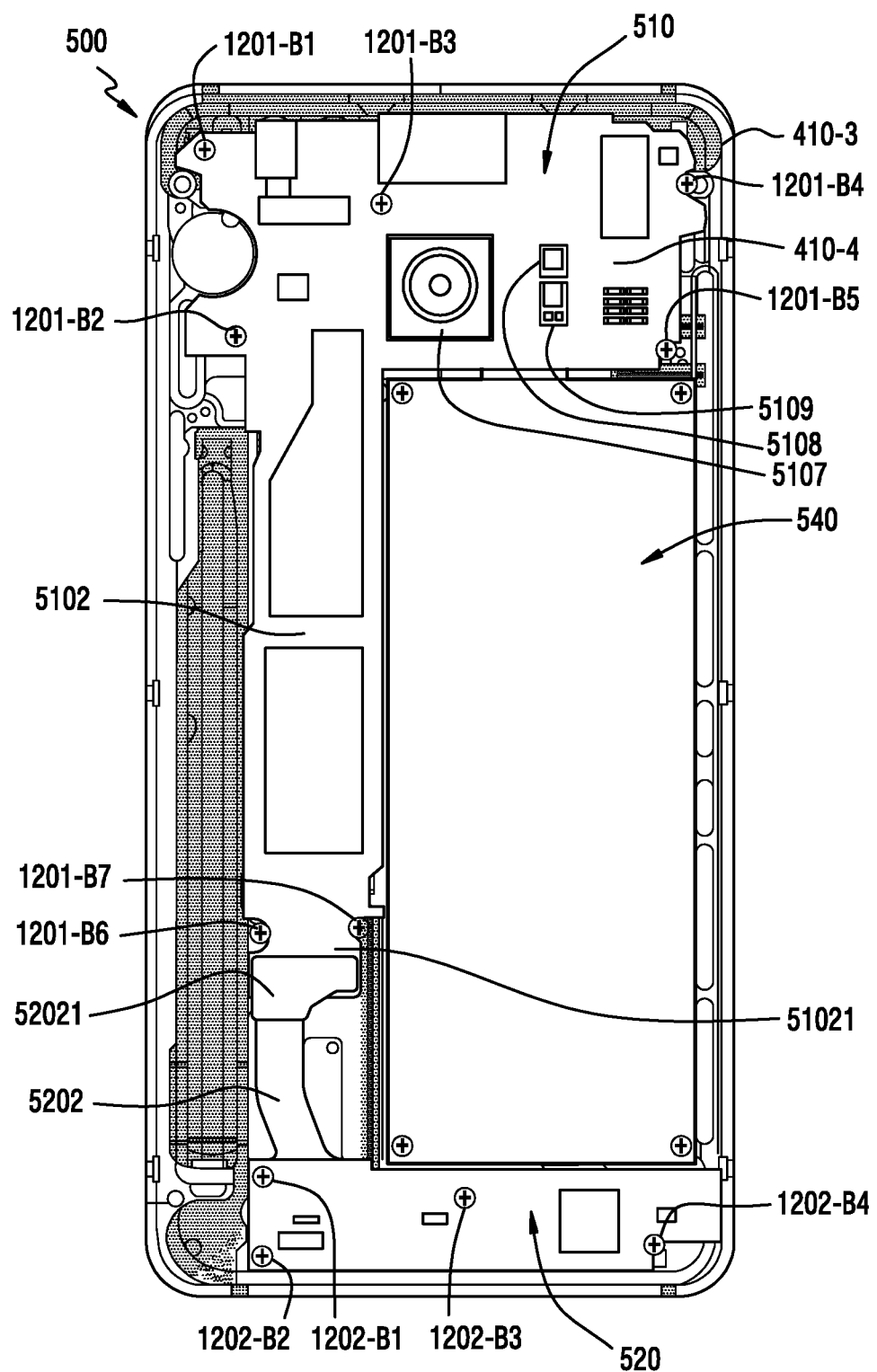
FIG. 12A is a diagram of a support structure coupled with printed circuit boards (PCBs) and a battery according to an embodiment of the disclosure.
Figure 12B:
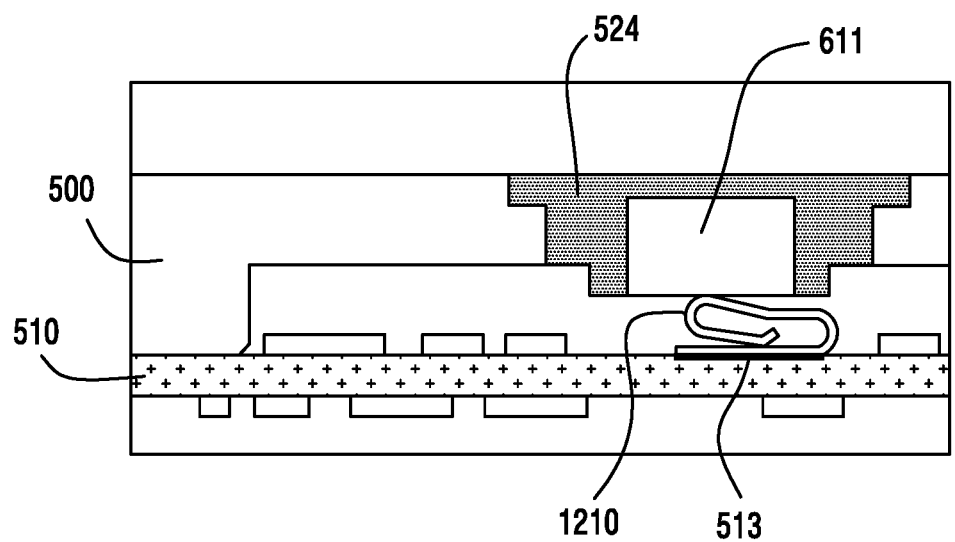
FIG. 12B is a diagram of electrical connections between conductive paths of a support structure and a PCB according to an embodiment of the disclosure.

FIG. 12A is a diagram of a support structure coupled with PCBs and a battery according to an embodiment of the disclosure. FIG. 12B is a diagram of electrical connections between a support structure and a PCB according to an embodiment of the disclosure.

Referring to FIG. 12A, the first PCB 510 can be coupled to the first mounting portion 501 of FIG. 8 using bolts. According to an embodiment of the disclosure, the first PCB 510 can include a plurality of bolt fastening holes (not shown). The first mounting portion 501 (FIG. 8) of the mid-plate 410-4 can include bosses (e.g., a metallic or nonmetallic cluster including female screws) corresponding to the bolt fastening holes of the first PCB 510. The first PCB 510 can be coupled to the first mounting portion 501 of FIG. 8 by putting the bolts 1201-B1 through 1201-B7 through the bolt fastening holes of the first PCB 510 and fastening with the bosses of the first mounting portion 501 of FIG. 8. Locations of the bolt fastening holes of the first PCB 510 can be designed to be coupled with the first mounting portion 501 of FIG. 8 without any gap in at least part of the first PCB 510. Although not depicted, the first PCB 510 can be coupled with the first mounting portion 501 of FIG. 8 using various coupling means (e.g., double-sided tape).

According to various embodiments of the disclosure, when the first PCB 510 is coupled to the mid-plate 410-4, part of the first PCB 510 can cover the extending portion 545 of the battery 540.

Referring to FIG. 12A, the second PCB 520 can be coupled with the second mounting portion 502 of FIG. 8 using bolts. According to an embodiment of the disclosure, the second PCB 520 can include a plurality of bolt fastening holes (not shown). The second mounting portion 502 (FIG. 8) of the mid-plate 410-4 can include bosses (not shown) corresponding to the bolt fastening holes of the second PCB 520. The 2-1 PCB part 5201 of the second PCB 520 can be coupled to the second mounting portion 502 of FIG. 8 by putting the bolts 1202-B1 through 1202-B4 through the bolt fastening holes of the second PCB 520 and fastening with the bosses of the second mounting portion 502 of FIG. 8. Locations of the bolt fastening holes of the second PCB 520 can be designed to be coupled with the second mounting portion 520 of FIG. 8 without any gap in at least part of the 2-1 PCB part 5201 of the second PCB 520.

The second PCB 520 can be electrically connected to the first PCB 510. According to an embodiment of the disclosure, the 2-2 PCB part 5202 of the second PCB 520 can be an FPCB including a second connector (e.g., a male connector or a header connector) at the end 52021. The 1-2 PCB part 5102 of the first PCB 510 can include a first connector (e.g., a female connector or a socket connector) at the end 51021. The second connector of the 2-2 PCB part 5202 can be electrically connected to the connector of the 1-2 PCB part 5102.

Referring to FIG. 12B, according to an embodiment of the disclosure, the first PCB 510 can include at least one contact 513. When the first PCB 510 is coupled to the support structure 500, the first PCB 510 can cover part of the first mounting portion 501 of FIG. 8 and the at least one contact 513 of the first PCB 510 can be electrically connected to an area (e.g., the first contact 611) of the first conductive path 61. According to an embodiment of the disclosure, the electronic device 400 can include a flexible conductive member having the elasticity (e.g., a C clip 1210, a pogo pin, a spring, conductive poron and rubber, a conductive tape, or a copper connector) between the first contact 611 of the first conductive path 61 and the at least one contact 513 of the first PCB 510. The flexible conductive member (e.g., the C clip 1210) can improve the electrical connection between the first contact 611 of the first conductive path 61 and the at least one contact 513 of the first PCB 510. According to various embodiments of the disclosure, the flexible conductive member (e.g., the C clip 1210) can be disposed at the at least one contact 513 of the first PCB 510, or, although not depicted, at the first contact 611 of the first conductive path 61. Although not depicted, in the similar manner, the third contact 621 (FIG. 11A) of the first conductive path 61 can be electrically connected to the at least one contact 513 of the first PCB 510. Although not depicted, in the similar manner, the fifth contact 631 (FIG. 11A) of the third conductive path 63 can be electrically connected to the at least one contact 513 of the first PCB 510. Although not depicted, in the similar manner, the sixth contact 632 (FIG. 11A) of the third conductive path 63 can be electrically connected to the contact of the second PCB 520.

Referring to FIGS. 11A and 11B, when the battery 540 is coupled to the mid-plate 410-4, the extending portion 545 of the battery 540 can be electrically connected to the second contact 612 of the first conductive path 61 and the fourth contact 622 of the second conductive path 62. Referring to FIG. 12B, when the first PCB 510 is coupled to the mid-plate 410-4, the first contact 611 of the first conductive path 61 and the third contact 621 of the second conductive path 62 can be electrically connected to the at least one contact of the first PCB 510. Referring to FIGS. 7 and 12A, the battery 540 can be electrically connected to the first PCB 510 through the first conductive path 61 and the second conductive path 62 of the support structure 500.

Referring to FIGS. 7 and 12A, when the first PCB 510 is coupled to the mid-plate 410-4, the fifth contact 631 of the third conductive path 63 can be electrically connected to the at least one contact of the first PCB 510. When the second PCB 520 is coupled to the mid-plate 410-4, the sixth contact 632 of the third conductive path 63 can be electrically connected to at least one contact of the second PCB 520. The first PCB 510 can be electrically connected to the second PCB 520 through the third conductive path 63 of the support structure 500.

Referring to FIGS. 5 and 7, the first PCB 510 can include at least one IC 512 (e.g., the power management module 295 of FIG. 2) regarding the power. According to various embodiments of the disclosure, the at least IC 512 can include a PMIC, a charger IC, or a battery or fuel gauge. According to an embodiment of the disclosure, the at least one IC 512 can be disposed between or near (e.g., within 20 mm or so) the 1-1 PCB part 5101 and the 1-2 PCB part 5102.

According to an embodiment of the disclosure, the at least one IC (e.g., the power management module) 512 regarding the power can be disposed near contacts (not shown) (e.g., within about 20 mm) for electrically connecting to the first contact 611 of the first conductive path 61, the third contact 621 of the second conductive path 62 or the fifth contact 631 of the third conductive path 63. Referring to FIG. 7, For example, the contacts of the first PCB 510 connected to the at least one IC 512 can be disposed to overlap in an area 701 including the first contact 611, the third contact 621, or the fifth contact 631.

The first PCB 510 can include an a contact (not shown) electrically connected to the first contact 611 of the first conductive path 61. According to an embodiment of the disclosure, the first PCB 510 can include at least one a conductive line (not shown) for electrically connecting the at least one IC 512 and the a contact. The first PCB 510 can include a b contact (not shown) electrically connected to the third contact 621 of the second conductive path 62. According to an embodiment of the disclosure, the first PCB 510 can include at least one b conductive line (not shown) for electrically connecting the at least one IC 512 and the b contact. According to various embodiments of the disclosure, the a contact or the b contact may be part of the at least one IC 512, and the a conductive line or the b conductive line may be omitted. When the battery 540 and the first PCB 510 are coupled to the support structure 500, the battery 540 can be electrically connected to the at least one IC 512 of the first PCB 510 through the first conductive path 61 and the second conductive path 62.

The first PCB 510 can include a c contact (not shown) electrically connected with the fifth contact 631 of the third conductive path 63. According to an embodiment of the disclosure, the first PCB 510 can include at least one c conductive line (not shown) for electrically connecting the at least one IC 512 and the c contact. According to various embodiments of the disclosure, the c contact can be part of the at least one IC 512, and the c conductive line may be omitted.

Referring to FIG. 5, the second PCB 520 can include an external port 5210 (e.g., an interface of the USB 274 of FIG. 2). Referring to FIGS. 4A, 4B, and 5, the second frame 410-32 can include a through hole 5004 for the external port 5210. An external device can be electrically connected to the external port 5210 through the through hole 5004, and the electronic device 400 can exchange signals or data with the external device. Referring to FIGS. 5, 7, and 12A, the second PCB 520 can include a d contact (not shown) electrically connected to the sixth contact 632 of the third conductive path 63. According to an embodiment of the disclosure, the external port 5210 can include at least one d conductive line (not shown) electrically connected with the d contact. According to various embodiments of the disclosure, the d contact can be part of the external port 5210, and the d conductive line may be omitted.

According to an embodiment of the disclosure, the external device can be electrically connected to the external port 5210, and power from the external device can be provided to the at least one IC 512 (e.g., the power management module 295 of FIG. 2) of the first PCB 510 through the third conductive path 63 of the support structure 500.

According to an embodiment of the disclosure, the at least one IC 512 can receive the power from the battery 540 through the first conductive path 61 and the second conductive path 62 of the support structure 500, and output driving power to the components (e.g., the one or more processors (e.g., the APs) 210, the communication module 220, the SIM 224, the memory 230, the sensor module 240, the input device 250, the display 260, the interface 270, the audio module 280, the camera module 291, the power management module 295, the battery 296, the indicator 297, and the motor 298 of FIG. 2) of the electronic device 400.

According to an embodiment of the disclosure, the external device can be electrically connected to the external port 5210, and the electronic device 400 can receive the power from the external device. The power from the external device (e.g., a charger device or a power device) can be provided to the at least one IC 512 of the first PCB 510 through the third conductive path 63. The at least one IC 512 (e.g., a charger IC) can perform a charging operation which provides at least part of the power from the external device to the battery 540 through the first conductive path 61 and the second conductive path 62 of the support structure 500.

The electric current can be set to be lower than a value (e.g., a maximum current) enabling safe flow in the signal line (or the conductive path). The maximum current is a value allowed by the electronic component connected to the signal line, and the signal line can be designed to allow the maximum current. For example, when the current flows through the signal line, electrical resistance of the signal line can generate heat. The heat increases the temperature of the signal line, and the signal line can be damaged (e.g., weakened or broken) when the temperature increases over a limit. The heat produced from the signal line may cause an ignition at the signal line or in its perimeter. To prevent the heat caused by the current flowing through the signal line from damaging the signal line, the signal line can be designed to include a material having as low electrical resistance as possible or to have as great volume as possible. In addition, the current flow creates an electric field along the signal line, and the electric field can cause EMI by exerting noise to a signal transmitted on other signal line or a nearby electronic device. The EMI can interrupt normal operations of the electronic components. To improve the EMI (e.g., noise), the signal line can be designed to be distant from the other signal line or the electronic device as far as possible. According to an embodiment of the disclosure, the support structure 500 can include at least one signal line (e.g., the first conductive path 61, the second conductive path 62, or the third conductive path 63) which replaces the signal line included in the PCB or replaces the signal line electrically connected the PCB. Since the support structure 500 is designed to include the at least one signal line (e.g., the first conductive path 61, the second conductive path 62, or the third conductive path 63) without increasing its volume, it can enhance the internal mounting space of the electronic device 400 or the size of the first PCB 510 or the second PCB 520 and facilitate the signal line design. According to various embodiments of the disclosure, when the internal mounting space of the electronic device 400 or the size of the first PCB 510 or the second PCB 520 is improved, it can be easy to secure the mounting space of the battery 540 of a larger capacity. According to various embodiments of the disclosure, the support structure 500 can be designed substantially not to degrade its rigidity and to include the signal line (e.g., the first conductive path 61, the second conductive path 62, or the third conductive path 63). According to various embodiments of the disclosure, the support structure 500 including the signal line (e.g., the first conductive path 61, the second conductive path 62, or the third conductive path 63) can solve difficulties in designing the signal line to improve the heat or the electrical interference in the limited available space of the electronic device 400 or the limited area of the PCB.

According to an embodiment of the disclosure, the first conductive path 61 or the second conductive path 62 of the support structure 500 can enable the electric current from the battery 540 to safely flow to the at least one IC 512 (e.g., the power management module 295 of FIG. 2). According to an embodiment of the disclosure, the third conductive path 63 of the support structure 500 can enable the external power from the external port 5210 to safely flow to the at least one IC 512. According to an embodiment of the disclosure, the first conductive path 61 or the second conductive path 62 of the support structure 500 can enable the current from the at least one IC 512 to flow to the battery 540. For example, to prevent the signal line from being damaged by the heat caused by the current flowing through the signal line (or the conductive path), the first conductive path 61, the second conductive path 62, or the third conductive path 63 of the support structure 500 can facilitate the design to include a material of as low electrical resistance as possible or to have as great volume as possible.

FIG. 13A is a table for comparing a signal line of a general PCB (or FPCB) and a signal line of a support structure according to an embodiment of the disclosure.

Referring to FIG. 13A, a signal line of the general PCB can be designed to have the thickness of 0.015 mm, the width of 0.6 mm, the length of 80 mm, and the volume of 0.72 mm$^3$. According to an embodiment of the disclosure, when the signal line (e.g., the first conductive path 61, the second conductive path 62, or the third conductive path 63 of FIG. 7) of the support structure 500 is designed to have the same width 0.6 mm and the same length 80 mm, it can be designed with the greater thickness 0.3 mm than the thickness 0.015 mm of the signal line of the general PCB. The signal line (e.g., the first conductive path 61, the second conductive path 62, or the third conductive path 63 of FIG. 7) of the support structure 500 according to an embodiment can have the greater volume 14.4 mm$^3$ than the volume (0.72 mm$^3$) of the signal line of the general PCB. It is possible to design a plurality of signal lines having the thickness 0.015 mm, the width 0.6 mm, and the length 80 mm in the PCB, but this requires the PCB expansion. It is possible to design one signal line having the thickness 0.3 mm, the width 0.6 mm, and the length 80 mm in the PCB, but this can also require the PCB expansion.

FIG. 13B is a table illustrating various conductive materials for forming conductive paths according to an embodiment of the disclosure.

Referring to FIG. 13B, according to various embodiments of the disclosure, the signal line (e.g., the first conductive path 61, the second conductive path 62, or the third conductive path 63 of FIG. 7) of the support structure 500 can include various conductive materials. The signal line of the general PCB can be formed with the copper. Although the signal line (e.g., the first conductive path 61, the second conductive path 62, or the third conductive path 63 of FIG. 7) of the support structure 500 according to an embodiment is formed with the aluminum having a greater electrical conductivity (e.g., a ratio of resistivity to the copper is 1.60) than the copper (standard), it can be designed to have a relatively greater volume (e.g., 20 times) than the signal line of the general PCB which has the same width 0.6 mm and the same length 80 mm and accordingly can have 1/12.5 value of the electrical resistance of the signal line of the general PCB. Since the signal line (e.g., the first conductive path 61, the second conductive path 62, or the third conductive path 63 of FIG. 7) of the support structure 500 according to an embodiment has the 1/12.5 value of the electrical resistance of the signal line of the general PCB, it can allow relatively more currents to flow than the signal line of the general PCB. Since the signal line (e.g., the first conductive path 61, the second conductive path 62, or the third conductive path 63 of FIG. 7) of the support structure 500 according to an embodiment has the 1/12.5 value of the electrical resistance of the signal line of the general PCB, it can also reduce the heat occurred when the same amount of the current flows, compared with the signal line of the general PCB.

Figure 14A:
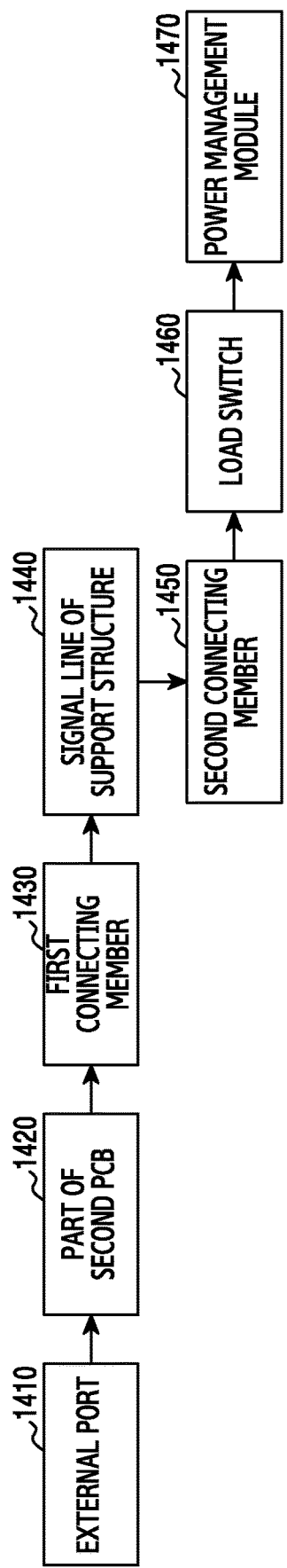
FIG. 14A is a block diagram of a path which transfers power from an external device connected to an external port to a power management module in an electronic device including a support structure having conductive paths according to an embodiment of the disclosure.

FIG. 14A is a block diagram of a path which transfers power from an external device connected to an external port to a power management module in an electronic device including the support structure having conductive paths according to an embodiment of the disclosure. FIG. 14B is a table illustrating electrical resistances measured on the power transfer path of FIG. 14A according to an embodiment of the disclosure.

Referring to FIG. 14A, the external device can be electrically connected to an external port 1410 (e.g., the external port 5210 of FIG. 5). For example, the external port 1410 can be a USB connector. According to an embodiment of the disclosure, the external port 1410 can be a connector which supports USB 3.0 protocol. According to various embodiments of the disclosure, the external port 1410 can be a connector (e.g., a C-type connector or a reversible connector which can connect a plug without distinguishing top and bottom) of the external device. The power (e.g., electric current) from the external device can pass through a part 1420 (e.g., the 2-1 PCB part 5201) of the second PCB. The power passing through the part 1420 of the second PCB can pass through a first connecting member (or a first flexible conductive member) 1430. According to an embodiment of the disclosure, the first connecting member 1430 can electrically connect a contact disposed at the second PCB with a contact (e.g., the sixth contact 632 of the third conductive path 63 of FIG. 7) of the signal line of the support structure. The power passing through the first connecting member 1430 can pass through a signal line 1440 (e.g., the third conductive path 63 of FIG. 7) of the support structure. The power passing through the signal line 1440 of the support structure can pass through a second connecting member (or a second flexible conductive member) 1450. According to an embodiment of the disclosure, the second connecting member 1450 can electrically connect the contact (e.g., the fifth contact 631 of the third conductive path 63 of FIG. 7) of the signal line of the support structure with an end of a load switch 1460. The power passing through the second connecting member 1450 can pass through the load switch 1460. According to various embodiments of the disclosure, the first connecting member 1430 or the second connecting member 1450 can include a C clip, a pogo pin, a spring, conductive poron and rubber, a conductive tape, or a copper connector.

The power passing through the load switch 1460 can be provided to a power management module 1470 (or at least one IC regarding the power 295 of FIG. 2) (e.g., a PMIC or a charger IC).

Referring to FIG. 14B, total electrical resistance of the power transfer path of FIG. 14A can be 40.76329318 mΩ (ohm).

Figure 15A:
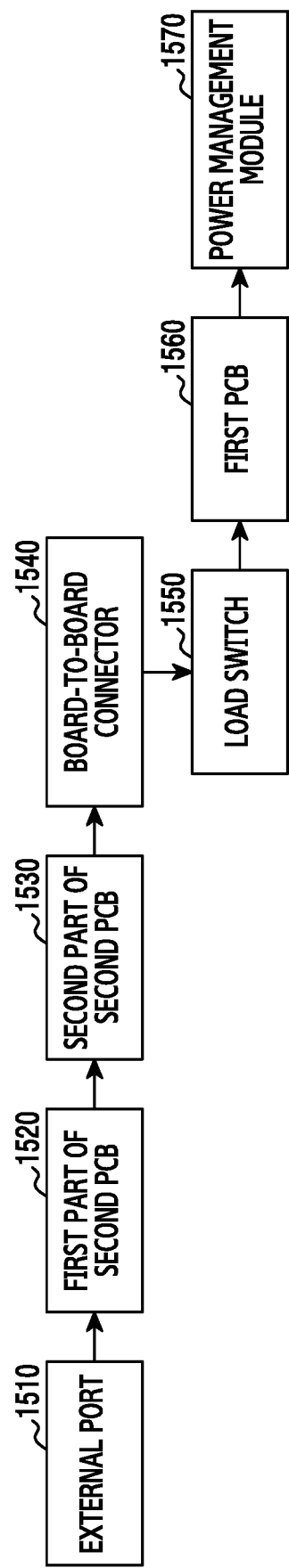
FIG. 15A is a block diagram of a path which transfers power from an external device connected to an external port to a power management module in an electronic device including no conductive paths of a support structure according to an embodiment of the disclosure.

FIG. 15A is a block diagram of a path which transfers power from an external device connected to an external port to a power management module in an electronic device including no conductive paths (or signal lines) of a support structure according to an embodiment of the disclosure. FIG. 15B is a table illustrating electrical resistances measured on the power transfer path of FIG. 15A according to an embodiment of the disclosure. The electronic device of FIG. 15A is merely designed to include a signal line which replaces the third conductive path 63 of the support structure, in the PCB in order to compare experiments with the electronic device 400 of FIG. 5 according to an embodiment under the same experimental condition, and cannot be a general electronic device.

Referring to FIG. 15A, the external device can be electrically connected to an external port 1510. The power (e.g., electric current) from the external device can pass through a first part 1520 (e.g., the 2-1 PCB part 5201 of FIG. 5) of the second PCB. The power passing through the first part 1520 of the second PCB can pass through a second part 1530 (e.g., similar to the 2-2 PCB part 5202 of FIG. 5) of the second PCB. The power passing through the second part 1530 of the second PCB can pass through a board-to-board connector 1540. The power passing through the board-to-board connector 1540 can pass through a load switch 1550. The power passing through the load switch 1550 can pass through a first PCB 1560 (e.g., similar to the first PCB 510 of FIG. 5). The power passing through the first PCB 1560 can be provided to a power management module 1570. Referring to FIG. 15B, total electrical resistance of the power transfer path of FIG. 15A can have 112.1206859 mΩ (ohm).

The total electrical resistance of the path which transfers the power from the external device to the power management module 512 in the electronic device 400 (FIG. 5) including the support structure 500 (FIG. 5) having the signal line (or the conductive path) is smaller than the total electrical resistance of the path of FIG. 15A. The electronic device 400 according to an embodiment can receive and forward relatively more current from the external device to the power management module 1470, compared with the electronic device of FIG. 15A. The electronic device 400 according to an embodiment can also reduce the heat occurring when the electric current of the same amount flows, compared with the electronic device of FIG. 15A.

Figure 16:
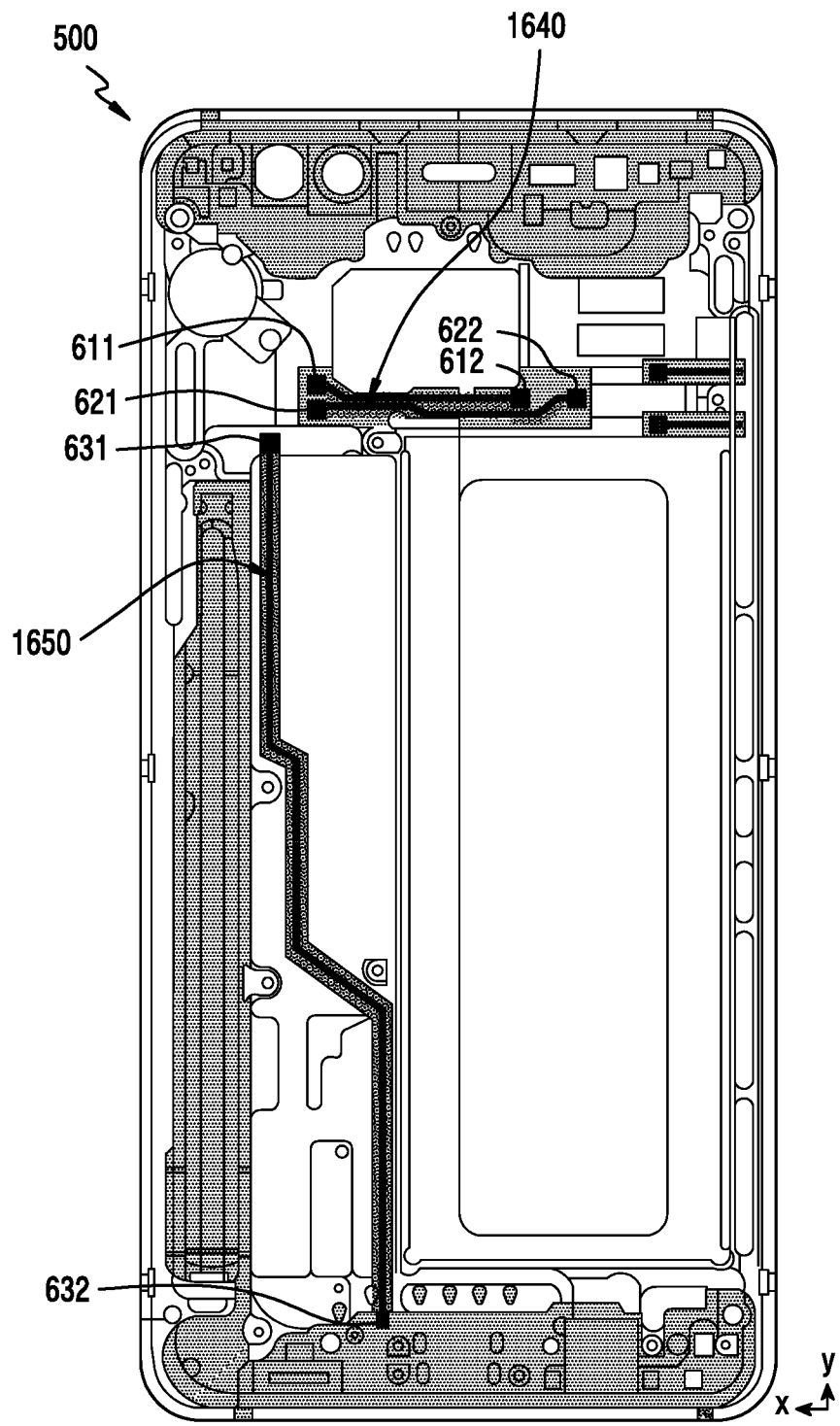
FIG. 16 is a diagram of a support structure including conductive paths according to an embodiment of the disclosure.

FIG. 16 is a diagram of a support structure including conductive paths according to embodiments of the disclosure.

Referring to FIG. 16, the support structure 500 can further include an electrical shielding member which covers at least part of the first connecting line 613 (FIG. 7) of the first conductive path 61, the second connecting line 623 (FIG. 7) of the second conductive path 62, or the third connecting line 633 (FIG. 7) of the third conductive path 63. According to an embodiment of the disclosure, the support structure 500 can include an electrical shielding area (or layer) 1640 covering all of the first connecting line 613 of the first conductive path 61 and the second connecting line 623 of the second conductive path 62. According to an embodiment of the disclosure, the support structure 500 can include an electrical shielding area 1650 covering the third connecting line 633 of the third conductive path 63. According to various embodiments of the disclosure, the electrical shielding areas 1640 and 1650 can be formed in various manners, for example, by spreading an electrical shielding material or attaching an insulating tape.

According to an embodiment of the disclosure, when the electric current flows in the signal line (e.g., the first conductive path 61, the second conductive path 62, or the third conductive path 63) of the support structure 500, an electric field can be created in the signal line due to the current flow and cause electromagnetic interference (EMI) by exerting noise to a signal transmitted in other nearby signal line or to a nearby electronic component. The EMI can disturb normal operations of the electronic components. According to an embodiment of the disclosure, the electrical shielding areas 1640 and 1650 can enhance the EMI (e.g., noise).

Referring to FIG. 5, the second cover 410-2 can be coupled with the bezel lower edge 410-36 of the support structure 500, and a space for mounting the electronic components (e.g., the PCBs 510 and 520, the battery 540, and the like) can be formed between the second cover 410-2 and the support structure 500.

The second cover 410-2 can include through holes (or light transmitting areas) 420-27 and 420-28. Referring to FIGS. 4B and 12A, a camera 5107 (or a rear facing camera) or a flash 5108 can be mounted on the first PCB 510 (or the 1-1 PCB part 5101). An optical sensor 5109 (e.g., a heart rate monitoring sensor) including a light emitter and a light receiver can be mounted on the first PCB 510. According to an embodiment of the disclosure, the camera 5107 can be aligned with one through hole 420-27 of the second cover 410-2 and coupled with the through hole 420-27. The flash 5108 and the optical sensor 5109 can be aligned with the other through hole 420-28 of the second cover 410-2 and coupled with the through hole 420-28.

According to various embodiments of the disclosure, the second cover 410-2 can include at least one antenna (not shown). According to an embodiment of the disclosure, the at least one antenna can include a conductive pattern including windings which are extended from one end to the other end and have a plurality of turns. Although not depicted, the second cover 410-2 can include an antenna first contact disposed at or near the one end of the at least one antenna, and an antenna second contact disposed at or near the other end of the at least one antenna. When the second cover 410-2 is coupled to the electronic device 400, the antenna first contact and the antenna second contact can be electrically connected to the contacts of the first PCB 510. According to various embodiments of the disclosure, the contacts of the first PCB 510 can include a connecting member, such as C clip, pogo pin, spring, conductive poron and rubber, conductive tape, or copper connector.

According to various embodiments of the disclosure, the at least one antenna of the second cover 410-2 may be electrically connected to the first PCB 510 through signal lines (e.g., conductive paths or conductive tracks) of the support structure 500. For example, one end of one signal line of the support structure 500 can be electrically connected to the one end of the at least one antenna of the second cover 410-2 using a connecting member, such as a C clip. One end of another signal line of the support structure 500 can be electrically connected to the other end of the at least one antenna of the second cover 410-2 using a connecting member, such as a C clip. The other ends of the signal lines of the support structure 500 can be electrically connected to the first PCB 510 using connecting members, such as C clips.

According to an embodiment of the disclosure, the at least one antenna of the second cover 410-2 can be electrically connected to a wireless charging circuit (not shown). The wireless charging circuit can support, for example, the magnetic resonance method, the magnetic induction method, or the electromagnetic method. According to various embodiments of the disclosure, when the at least one antenna of the second cover 410-2 is electrically connected to the first PCB 510 through the signal lines of the support structure 500, the contacts of the first PCB 510 electrically connected to the signal lines of the support structure 500 can be electrically connected to the wireless charging circuit.

According to various embodiments of the disclosure, the at least one antenna of the second cover 410-2 may be electrically connected to a communication circuit (e.g., the communication module 220 of FIG. 2) which supports various wireless communications.

According to various embodiments of the disclosure, although not depicted, the at least one antenna is not limited to the structure coupled to the second cover 410-2 but may be designed in various structures. For example, the at least one antenna may be designed to be coupled to or included in the PCB (e.g., the first PCB 510 or the second PCB 520 of FIG. 5). For example, the at least one antenna can be designed to be coupled to or included in the support structure 500 (or the nonconductive area 52 of FIG. 7). For example, the at least one antenna can be designed to be coupled to or included in the battery 540. Besides, the at least one antenna can be included in the support structure 500 in other various structures.

Referring to FIGS. 4A, 4B, and 5, the electronic device 400 can include a socket 5220 mounted on the second PCB 520. The support structure 500 (or the second frame 410-32) can include a through hole 5042 aligned with the socket 5220. For example, a plug (e.g., an ear jack) of the external device can be connected to the socket 5220 through the through hole 5042.

Referring to FIGS. 4A, 4B, and 5, the electronic device 400 can include a speaker (not shown) or a microphone (not shown) mounted on the second PCB 520. The support structure 500 (or the second frame 410-32) can include through holes 5043 and 5044 aligned with the speaker or the microphone.

According to an embodiment of the disclosure, when the second cover edge 410-26 (FIG. 5) of the second cover 410-2 is coupled to the bezel lower edge 410-36 of the support structure 500, the second cover edge 410-26 and the bezel lower edge 410-36 can closely contact each other. According to various embodiments of the disclosure, an adhesive means (e.g., a double-sided tape) may be interposed between the second cover edge 410-26 and the bezel lower edge 410-36. Foreign substances (e.g., water or dust) cannot flow into the electronic device 400 through the space between the second cover edge 410-26 and the bezel lower edge 410-36.

According to an embodiment of the disclosure, the support structure 500 can include at least one double-wall structure disposed along at least part of the frame (e.g., the first frame 410-31, the second frame 410-32, the third frame 410-33, or the fourth frame 410-34).

According to various embodiments of the disclosure, the electronic device 400 of FIG. 5 is a mere example of an embodiment of the disclosure, and an electronic device of different or modified structures including the support structure 500 having the conductive paths (or signal lines) can be designed.

The components of the electronic device 400 (e.g., FIG. 5) can be variously modified according to convergence trend of digital devices, and cannot be all enumerated. The electronic device 400 can further include components equivalent to the above-mentioned elements. The electronic device 400 according to various embodiments can exclude particular components from the above-described components or may replace particular components with other components according to a provision form thereof. A person ordinarily skilled in the art shall easily understand this.

Figure 17A:
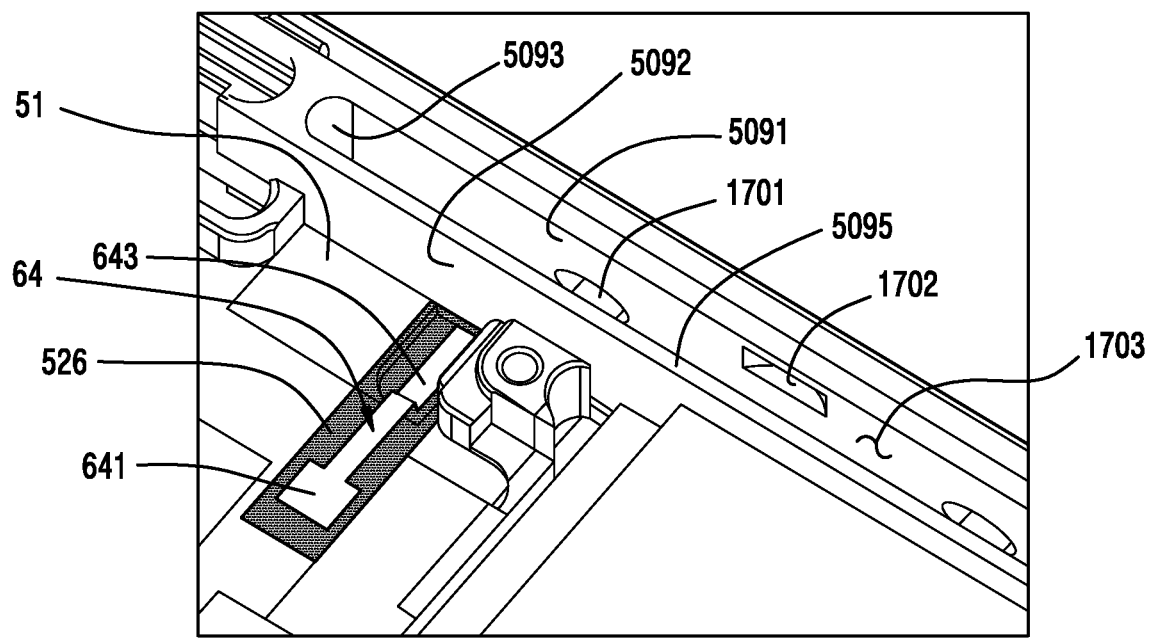
FIG. 17A is a diagram of part of a support structure including conductive paths according to an embodiment of the disclosure.

FIG. 17A is a diagram of part of a support structure including conductive paths according to an embodiment of the disclosure.

Referring to FIGS. 7 and 17A, for example, one double-wall structure 509 can include a first wall 5091 and a second wall 5092. The first wall 5091 can be disposed between the second wall 5092 and the third frame 410-33. The first wall 5091 or the second wall 5092 can have a length extending along the third frame 410-33 in a direction (e.g., the fifth direction 40051 or the sixth direction 40061 of FIG. 5) between the first frame 410-31 and the second frame 410-32. According to various embodiments of the disclosure, the third frame 410-33 may be designed to include the first wall 5091 and the second wall 5092.

According to various embodiments of the disclosure, the first wall 5091 and the second wall 5092 can be extended substantially in parallel with the direction (e.g., the direction 40051 or 40061 of FIG. 5) between the first frame 410-31 and the second frame 410-32.

According to various embodiments of the disclosure, the double-wall structure 509 can include a third wall 5093 which interconnects one end of the first wall 5091 and one end of the second wall 5092. The double-wall structure 509 can include a fourth wall 5094 interconnecting the other end of the first wall 5091 and the other end of the second wall 5092. For example, the walls 5091 through 5094 of the double-wall structure 509 can be similar to a cylinder which encloses an area (hereafter, referred to as a bottom side) 5096 of the second mounting surface 5002.

According to various embodiments of the disclosure, at least part of the first wall 5091, the second wall 5092, the third wall 5093, or the fourth wall 5094 of the double-wall structure 509 can include a conductive material or a nonconductive material. For example, the first wall 5091 can be metallic, and at least one of the second wall 5092, the third wall 5093, and the fourth wall 5094 can be nonmetallic.

According to an embodiment of the disclosure, when the support structure 500 and the second cover 410-2 are coupled, an upper portion 5095 of the double-wall structure 509 can be coupled to the second cover 410-2 and the double-wall structure 509 can make a space 1703 of FIG. 17A with the walls 5091 through 5094, the bottom side 5096 of the double-wall structure 509, and the second cover 410-2.

Referring to FIGS. 7 and 17A, according to an embodiment of the disclosure, the nonconductive area 52 can include a sixth nonconductive area 526 or a seventh nonconductive area 527 which forms at least part of the midplate 410-4. The sixth nonconductive area 526 or the seventh nonconductive area 527 can be shaped to have the length extending substantially from the fourth frame 410-34 toward the third frame 410-33. According to an embodiment of the disclosure, the sixth nonconductive area 526 or the seventh nonconductive area 527 can be extended from an outer area of the double-wall structure 509 to an inner area (e.g., the bottom side 5096) of the double-wall structure 509. For example, according to an embodiment of the disclosure, the sixth nonconductive area 526 or the seventh nonconductive area 527 can include a nonconductive material coupled with the groove or the through hole (not shown) of the conductive area 51.

Referring to FIG. 8, the support structure 500 can include a fourth conductive path (or a fourth signal line) 64 coupled to the sixth nonconductive area 526. The support structure 500 can include a fifth conductive path (or a fifth signal line) 65 coupled to the seventh nonconductive area 527. According to an embodiment of the disclosure, the fourth conductive path 64 or the fifth conductive path 65 can be formed in the manner described in FIGS. 10A through 10E. The fourth conductive path 64 or the fifth conductive path 65 can include a conductive material extending substantially from the fourth frame 410-34 toward the third frame 410-33. The fourth conductive path 64 can include a seventh contact 641, an eighth contact 642, and a fourth connecting line 643 which interconnects the seventh contact 641 and the eighth contact 642. The fifth conductive path 65 can include a ninth contact 651, a tenth contact 652, and a fifth connecting line 653 which interconnects the ninth contact 651 and the tenth contact 652.

According to an embodiment of the disclosure, the seventh contact 641 of the fourth conductive path 64 or the ninth contact 651 of the fifth conductive path 65 can be disposed outside the double-wall structure 509. The eighth contact 642 of the fourth conductive path 64 or the tenth contact 652 of the fifth conductive path 65 can be disposed inside the double-wall structure 509. The fourth connecting line 643 or the fifth connecting line 653 can be extended from the outer area of the double-wall structure 509 to the inner area 5096 of the double-wall structure 509.

Figure 17B:
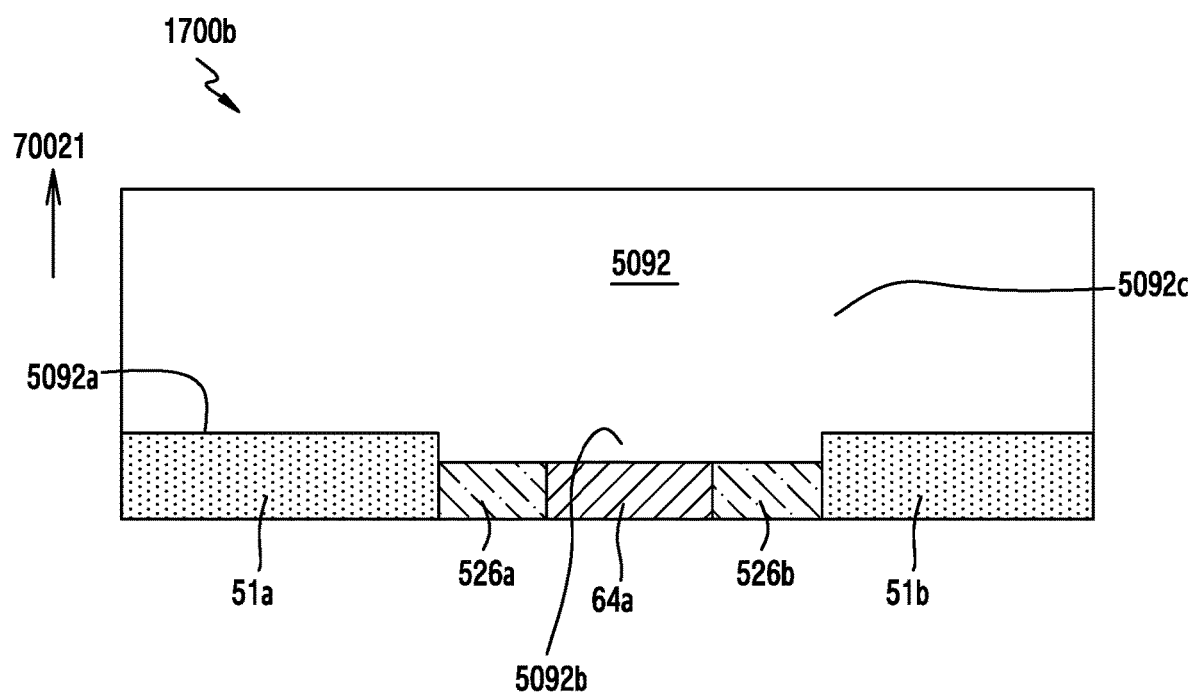
FIG. 17B is a cross-sectional view of part of a support structure according to an embodiment of the disclosure.

FIG. 17B is a cross-sectional view of a portion of a support structure according to an embodiment of the disclosure.

Referring to FIGS. 7, 8, 17A, and 17B, according to an embodiment of the disclosure, the portion 1700b of the support structure can include the second wall 5092, parts 51a and 51b of the conductive area 51 connected to the second wall 5092, parts 526a and 526b of the sixth nonconductive area 526, and part 64a of the fourth conductive path 64.

Referring to FIG. 17B, according to an embodiment of the disclosure, a surface (hereafter, referred to as a coupling surface) 5092a where the second wall 9052 is coupled with the components (e.g., the parts 51a and 51b of the conductive area 51, the parts 526a and 526b of the sixth nonconductive area 526, and the part 64a of the fourth conductive path 64) may not be even. For example, the part 51a or 51b of the conductive area 51 can be designed to further protrude than the part 64a of the fourth conductive path 64 and the parts 526a and 526b of the sixth nonconductive area 526 in a second direction 70021 (e.g., the direction 40021 of FIGS. 4A to 4C). For example, although not depicted, the part 64a of the fourth conductive path 64 of FIG. 17A may be designed to further protrude than the parts 526a and 526b of the sixth nonconductive area 526 of FIG. 17A in the second direction 70021. For example, although not depicted, the parts 526a and 526b of the sixth nonconductive area 526 may be designed to further protrude than the part 64*a* of the fourth conductive path 64 in the second direction 70021. The coupling surface 5092*a* of FIG. 17B is merely an embodiment and can be designed in various shapes. According to various embodiments of the disclosure, although not depicted, the coupling surface 5092*a* may be designed substantially to be flat. According to an embodiment of the disclosure, the part 64*a* of the fourth conductive path 64 of FIG. 17B can be the fourth connecting line 643 of the fourth conductive path 64.

According to various embodiments of the disclosure, the structure where the part 64*a* of the fourth conductive path 64 further protrudes or does not protrude than the parts 526*a* and 526*b* of the sixth nonconductive area 526 in the second direction 70021 may be applied to the first conductive path 61 of FIG. 7, the second conductive path 62 of FIG. 7, or the third conductive path 63 of FIG. 7. According to various embodiments of the disclosure, the structure where the part 64*a* of the fourth conductive path 64 further protrudes or does not protrude than the parts 51*a* and 51*b* of the conductive area 51 in the second direction 70021 may be applied to the first conductive path 61 of FIG. 7, the second conductive path 62 of FIG. 7, or the third conductive path 63 of FIG. 7.

Referring to FIG. 17B, according to an embodiment of the disclosure, the second wall 5092 can include a 2-1 part 5092*b* covering the part 64*a* of the fourth conductive path 64. The 2-1 part 5092*b* can include a nonconductive material, and the part 64*a* of the fourth conductive path 64 (e.g., the fourth connecting line 643 of FIG. 17A) can be electrically separated from the second wall 5092. The 2-1 part 5092*b* may be designed to extend and cover the parts 526*a* and 526*b* of the sixth nonconductive area 526 or the parts 51*a* and 51*b* of the conductive area 51. According to various embodiments of the disclosure, other part (hereafter, referred to as a 2-2 part) 5092*c* than the 2-1 part 5092*b* in the second wall 5092 can include a nonconductive material or a conductive material.

According to various embodiments of the disclosure, although not depicted, the design of the fifth connecting line 653 of the fifth conductive path 65 and its coupled components (e.g., the conductive area 51 and the second wall 5092) can follow various designs as explained in FIG. 17B.

According to various embodiments of the disclosure, the seventh contact 641 of the fourth conductive path 64 and the ninth contact 651 of the fifth conductive path 65 can be disposed between the double-wall structure 509 and the fourth contact 622 of the second conductive path 62 (or the second contact 612 of the first conductive path 61). The seventh contact 641 of the fourth conductive path 64 and the ninth contact 651 of the fifth conductive path 65 can be disposed substantially at the same distance from the third frame 410-33. The ninth contact 651 of the fifth conductive path 65 can be further apart from the first frame 410-31 than the seventh contact 641 of the fourth conductive path 64.

According to an embodiment of the disclosure, the electronic device 400 can include at least one electronic component disposed in the space 1703 of the double-wall structure 509. According to an embodiment of the disclosure, the at least one electronic component can include a circuit (e.g., an FPCB including a metal dome switch) including a push button switch, which is not depicted. The circuit including the push button switch can be electrically connected to the eighth contact 642 of the fourth conductive path 64 and the tenth contact 652 of the fifth conductive path 65.

According to an embodiment of the disclosure, the support structure 500 can include one or more through holes 1701 and 1702 penetrating the third frame 410-33 and the first wall 5091. The electronic device 400 can include buttons 4008 and 4009 of FIG. 4A, coupled with the one or more through holes 1701 and 1702. For example, when buttons 4008 and 4009 of FIG. 4A are pressed in a direction (e.g., the direction 40041 of FIG. 5) from the third frame 410-33 toward the fourth frame 410-34, the electric current is applied to the push button switch and an electric signal can be provided to the first PCB 510 (or the control circuit (e.g., the processor 120 of FIG. 1 or the processor 210 of FIG. 2)) through the fourth conductive path 64 or the fifth conductive path 65.

Referring to FIG. 17A, according to an embodiment of the disclosure, foreign substances (e.g., water or dust) can flow merely into the space 1703 of the double-wall structure 509 through the one or more through holes 1701 and 1702, and cannot enter the inner space of the electronic device 400.

Figure 18:
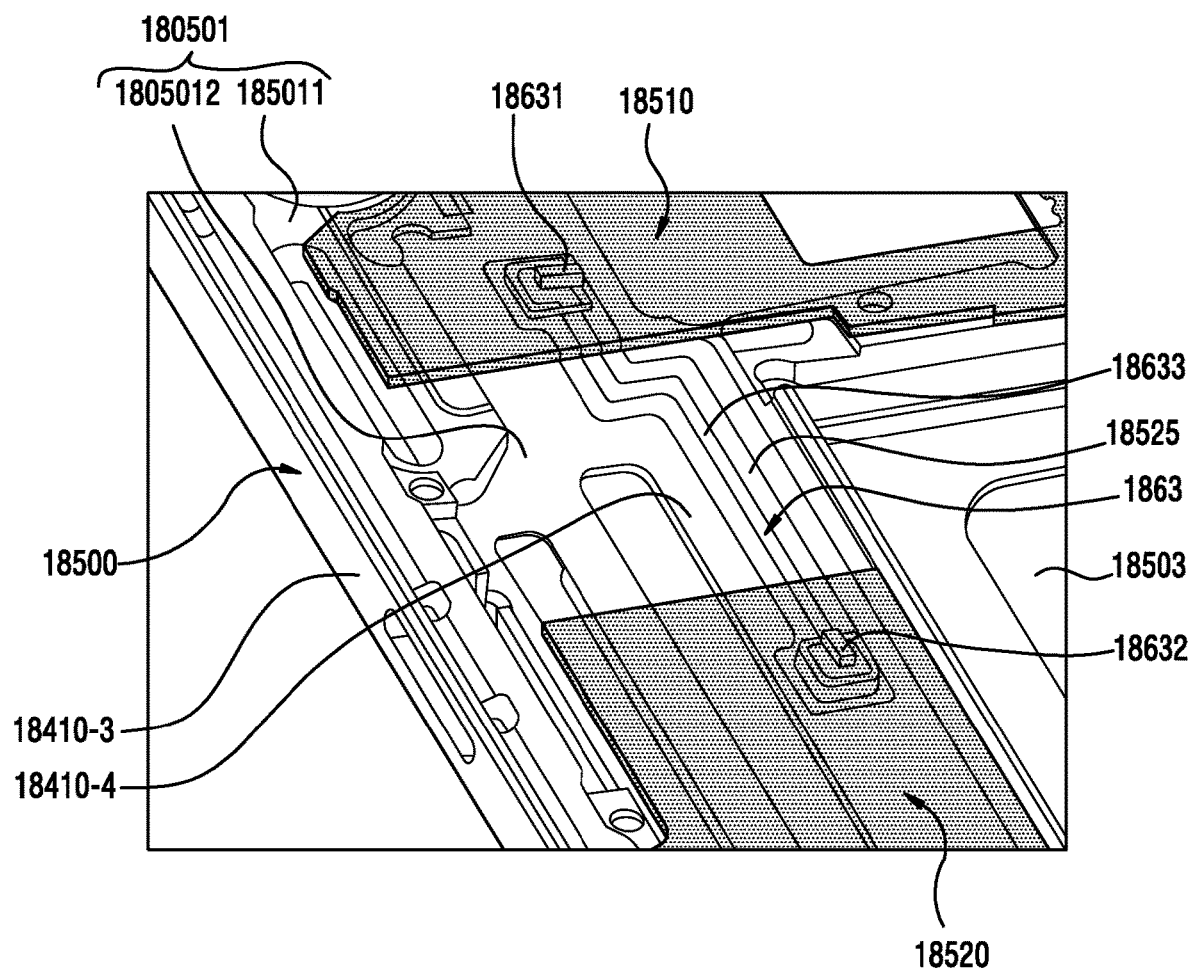
FIG. 18 is a diagram of coupling between a support structure and PCBs according to an embodiment of the disclosure.

FIG. 18 is diagram of coupling between a support structure and PCBs according to various embodiments of the disclosure. According to various embodiments of the disclosure, the support structure 18500 can be similar to or the same as the support structure 500 of FIG. 5. For example, a bezel 18410-3 of the support structure 18500 can be similar to or the same as the bezel 410-3 of FIG. 5. A mid-plate 18410-4 of the support structure 18500 can be similar to or the same as the mid-plate 410-4 of FIG. 5. A first mounting portion 180501 of the support structure 18500 can be similar to or the same as the first mounting portion 501 of FIG. 8. The first mounting portion 180501 can include a 1-1 mounting portion 185011 and a 1-2 mounting portion 1805012, and the 1-1 mounting portion 185011 and the 1-2 mounting portion 1805012 can be similar to or the same as the 1-1 mounting portion 5011 and the 1-2 mounting portion 5012 of FIG. 8. A third mounting portion 18503 of the support structure 18500 can be similar to or the same as the third mounting portion 503 of FIG. 8.

Referring to FIG. 18, a third PCB 18510 can be coupled to the first mounting portion 180501. According to an embodiment of the disclosure, the third PCB 18510 can be designed to cover at least part of the 1-1 mounting portion 185011 and the 1-2 mounting portion 1805012 of the first mounting portion 180501. At least part of a fourth PCB 18520 can be designed to extend and cover at least part of the 1-2 mounting portion 1805012 of the first mounting portion 180501.

The support structure 18500 can include a nonconductive area 18525 disposed at the mid-plate 18410-4. According to an embodiment of the disclosure, the nonconductive area 18525 can have a length extending from the 1-1 mounting portion 185011 to the 1-2 mounting portion 1805012.

The support structure 18500 can include a conductive path (or a signal line) 1863 which is coupled to the nonconductive area 18525 and extended along the nonconductive area 18525. The conductive path 1863 can include an eleventh contact 18631, a twelfth contact 18632, and a sixth connecting line 18633 which interconnects the eleventh contact 18631 and the twelfth contact 18632. According to an embodiment of the disclosure, when the third PCB 18510 is coupled to the support structure 18500, the eleventh contact 18631 of the conductive path 1863 can be electrically connected to a contact (not shown) of the third PCB 18510. According to an embodiment of the disclosure, when the fourth PCB 18520 is coupled to the support structure 18500, the twelfth contact 18632 of the conductive path 1863 can be electrically connected to a contact (not shown)

of the fourth PCB 18520. According to various embodiments of the disclosure, the eleventh contact 18631 or the twelfth contact 18632 can include a connecting member (not shown) having elasticity, which can enhance electrical connections with the PCBs 18510 and 18520.

According to an embodiment of the disclosure, an electronic device (e.g., 101 of FIG. 1, 201 of FIG. 2, or 400 of FIGS. 4A to 4C) can include a housing 410 including a first plate (e.g., 410-1 of FIG. 5), a second plate (e.g., 410-2 of FIG. 5) apart from the first plate 410-1 while facing the first plate 410-1, and a side member 410-3 which surrounds a space between the first plate 410-1 and the second plate 410-2, a touchscreen display (e.g., the display panel 430) exposed through the first plate 410-1, a PCB (e.g., the first PCB 510 of FIG. 5) disposed between the touchscreen display 430 and the second plate (e.g., 410-2 of FIG. 5), a mid-plate 410-4 disposed between the touchscreen display 430 and the PCB 510, and extending from the side member 410-3, and at least one IC (e.g., 512 of FIG. 5) (e.g., the PMIC) mounted on the PCB 510 and relating to power. The mid-plate 410-4 can include at least one conductive path (e.g., the first conductive path 61, the second conductive path 62, or the third conductive path 63 of FIG. 7) formed on a surface facing the PCB 510 and electrically connected to the at least one IC 512. The at least one conductive path 61, 62, or 63 can be formed with the same metallic material (e.g., the conductive area 51 of FIG. 7) as the mid-plate 410-4.

According to an embodiment of the disclosure, the at least one conductive path (e.g., 61, 62, or 63 of FIG. 7) can be coupled with a nonconductive material (e.g., the nonconductive area 52 of FIG. 7) of the mid-plate (e.g., 410-4 of FIG. 7) and insulated from other part of the mid-plate formed with the metallic material.

According to an embodiment of the disclosure, the electronic device (e.g., 101 of FIG. 1, 201 of FIG. 2, or 400 of FIGS. 4A to 4C) can further include a flexible conductive member (e.g., the C clip 1210 of FIG. 12B) disposed between part (e.g., the first contact 611, the second contact 612, the third contact 621, the fourth contact 622, the fifth contact 631, or the sixth contact 632 of FIG. 7) of the at least one conductive path (e.g., 61, 62, or 63 of FIG. 7) and the PCB (e.g., the first PCB 510 or the second PCB 520). The conductive path (e.g., 61, 62, or 63 of FIG. 7) can be electrically connected to the at least one IC 512 through the flexible conductive member.

According to an embodiment of the disclosure, the flexible conductive member can include at least one of a C clip (e.g., 1210 of FIG. 12B), a pogo pin, a spring, conductive poron and rubber, a conductive tape, and a copper connector.

According to an embodiment of the disclosure, the PCB (e.g., the first PCB 510 of FIG. 5) can further include a contact (e.g., 513 of FIG. 12B) electrically connected to the at least one IC 512. The flexible conductive member (e.g., the C clip 1210 of FIG. 12B) is disposed between part (e.g., the first contact 611, the third contact 621, or the fifth contact 631 of FIG. 7) of the at least one conductive path (e.g., 61, 62, or 63 of FIG. 7) and the contact (e.g., 513 of FIG. 12B).

According to an embodiment of the disclosure, the contact (e.g., 513 of FIG. 12B) can be disposed within 10 mm from the at least one IC 512.

According to an embodiment of the disclosure, the electronic device (e.g., 101 of FIG. 1, 201 of FIG. 2, or 400 of FIGS. 4A to 4C) can further include at least one power related component disposed between the mid-plate (e.g., 410-4 of FIG. 5) and the second plate (e.g., 410-2 of FIG. 5). The at least one power related component is electrically connected to the at least one IC 512 through the at least one conductive path.

According to an embodiment of the disclosure, the at least one power related component can include a battery (e.g., 540 of FIG. 5), or a connector (e.g., the external port 5210 of FIG. 5) which is mounted on the PCB (e.g., the second PCB 520) and electrically connected with an external power device.

According to an embodiment of the disclosure, the electronic device (e.g., 101 of FIG. 1, 201 of FIG. 2, or 400 of FIGS. 4A to 4C) can further include a flexible conductive member (e.g., the C clip disposed between part (e.g., the second contact 612, the fourth contact 622, or the sixth contact 632 of FIG. 7) of the at least one conductive path (e.g., 61, 62, or 63 of FIG. 7) and the PCB. The at least one power related component can be electrically connected to the at least one conductive path 61, 62, or 63 through the flexible conductive member.

According to an embodiment of the disclosure, the PCB (e.g., the first PCB 510 or the second PCB 520 of FIG. 5) can further include a contact (e.g., 513 of FIG. 12B) electrically connected to the at least one power related component. The flexible conductive member (e.g., the C clip 1210 of FIG. 12B) is disposed between part (e.g., the second contact 612, the fourth contact 622, or the sixth contact 632 of FIG. 7) of the at least one conductive path (e.g., 61, 62, or 63 of FIG. 7) and the contact (e.g., 513 of FIG. 12B).

According to an embodiment of the disclosure, the PCB can include a first PCB (e.g., 510 of FIG. 5) for mounting the at least one IC (e.g., 512 of FIG. 5), and a second PCB (e.g., 520 of FIG. 5) for mounting the at least one power related component (e.g., the external port 5210 of FIG. 5).

According to an embodiment of the disclosure, the at least one IC (e.g., 512 of FIG. 5) can include a PMIC or a charger IC.

According to an embodiment of the disclosure, the metallic material (e.g., the conductive area 51 of FIG. 5) can include at least one of copper, aluminum, tungsten, zinc, nickel, and magnesium.

According to an embodiment of the disclosure, the electronic device (e.g., 101 of FIG. 1, 201 of FIG. 2, or 400 of FIGS. 4A to 4C) an electrical shielding member (e.g., the electrical shielding member 1640 or 1650 of FIG. 16) disposed between the conductive path (e.g., 61, 62, or 63 of FIG. 5) and the PCB (e.g., 510 or 520 of FIG. 5) and covering at least part of the conductive path.

According to an embodiment of the disclosure, the side member (e.g., 410-3 of FIG. 5) is attached to the second plate (e.g., 410-2 of FIG. 5) or integrally formed with the second plate.

According to various embodiments of the disclosure, an electronic device (e.g., 101 of FIG. 1, 201 of FIG. 2, or 400 of FIGS. 4A to 4C) can include a first cover (e.g., 410-1 of FIG. 5) forming a first surface 4001 which faces a first direction 40011, a second cover (e.g., 410-2 of FIG. 5) forming a second surface 4002 which faces a second direction 40021 opposite to the first direction, a support structure including a bezel (e.g., 410-3 of FIG. 5) surrounding a space between the first cover 410-1 and the second cover 410-2, and a mid-plate (e.g., 410-4 of FIG. 5) extending from the bezel 410-3 to the space, and a first component and a second component disposed between the support structure 500 and the second cover 410-2 and coupled to the mid-plate 410-4. The mid-plate can include at least one conductive path (e.g., 61, 62, or 63 of FIG. 7) which electrically connects the first component and the second component. The at least one conductive path (e.g., 61, 62, or 63 of FIG. 7) can be coupled with a nonconductive material (e.g., the nonconductive area 52 of FIG. 7) of the mid-plate 410-4 and insulated from other part of the mid-plate 410-4 which is formed with a metallic material (e.g., the conductive area 51 of FIG. 7).

According to various embodiments of the disclosure, the at least one conductive path (e.g., 61, 62, or 63 of FIG. 7) can include a first contact, a second contact, and a line (e.g., the first connecting line 613, the second connecting line 623, or the third connecting line 633 of FIG. 7) which electrically connects the first contact and the second contact. The first contact can be electrically connected to the first component, and the second contact can be electrically connected to the second component. The electronic device can further include a flexible conductive member for electrically connecting the first contact and the first component, or the second contact and the second component.

According to various embodiments of the disclosure, the first component can be a battery (e.g., 540 of FIG. 5), and the second component can be a PCB (e.g., the first PCB 510 of FIG. 5) on which at least one IC related to power is mounted.

According to various support structure, the first component is at least one IC (e.g., 512 of FIG. 5) for charging a battery mounted in the electronic device (e.g., 101 of FIG. 1, 201 of FIG. 2, or 400 of FIGS. 4A to 4C). The second component can be an external port (e.g., 5210 of FIG. 5) for receiving power from the external device.

According to various embodiments of the disclosure, the first component can be a processor (e.g., 511 of FIG. 5), and the second component can be a circuit comprising a push button switch. The support structure (e.g., 500 of FIG. 5) can include a wall (e.g., the second wall 5092 of FIG. 7) which extends and protrudes from the mid-plate 410-4 to define a gap between the bezel 410-3 and the wall 5092 in the second direction. The circuit including the push button switch can be disposed between the bezel 410-2 and the wall 5092. The at least one conductive path (e.g., the fourth conductive path 64 or the fifth conductive path 65 of FIG. 8) can cross the wall 5092.

According to various embodiments of the disclosure, the support structure (e.g., a bracket) supporting the electronic components, such as a PCB and a display can include at least one conductive path which replaces a signal line of the PCB or a signal line electrically connected to the PCB.

According to various embodiments of the disclosure, the support structure is designed to include at least one conductive path (or signal line) without increasing its volume, and thus can improve the internal mounting space of the electronic device or the PCB size and facilitate the signal line design.

According to various embodiments of the disclosure, the support structure can be designed to include the signal line without substantially degrading the rigidity of the support structure.

According to various embodiments of the disclosure, the support structure including the conductive path can solve difficulty in designing the signal line to improve the heat or the EMI in the limited available space of the electronic device or in the limited area of the PCB.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a housing comprising a first plate, a second plate apart from the first plate and facing the first plate, and a side member which surrounds a space between the first plate and the second plate;
   a touchscreen display exposed through the first plate;
   a printed circuit board (PCB) disposed between the touchscreen display and the second plate;
   a mid-plate disposed between the touchscreen display and the PCB, and extending from the side member, wherein the mid-plate includes a conductive area made of a metallic material and a nonconductive area;
   at least one power related component disposed between the second plate and the mid-plate;
   at least one integrated circuit (IC) mounted on the PCB and relating to power; and
   at least one conductive path formed on the mid-plate,
   wherein the non-conductive area electrically isolates the at least one conductive path from the conductive area,
   wherein the at least one conductive path electrically connects the at least one power related component and the at least one IC,
   wherein the at least one IC includes a power management integrated circuit (PMIC) or a charge IC,
   wherein the at least one power related component comprises a battery, or a connector which is mounted on the PCB and electrically connected with an external power device,
   wherein the at least one conductive path is electrically connected to the at least one IC through the flexible conductive member, and
   wherein the flexible conductive member is in contact with the battery or with an extending portion of the battery.

2. The electronic device of claim 1, further comprising:
   a flexible conductive member disposed between part of the at least one conductive path and the PCB.

3. The electronic device of claim 2, wherein the flexible conductive member comprises at least one of a C clip, a pogo pin, a spring, conductive poron and rubber, a conductive tape, or a copper connector.

4. The electronic device of claim 2,
   wherein the PCB further comprises a contact electrically connected to the at least one IC, and
   wherein the flexible conductive member is disposed between part of the at least one conductive path and the contact.

5. The electronic device of claim 4, wherein the contact is disposed within 10 mm from the at least one IC.

6. The electronic device of claim 1, further comprising:
   a flexible conductive member disposed between part of the at least one conductive path and the PCB,
   wherein the at least one power related component is electrically connected to the at least one conductive path through the flexible conductive member.

7. The electronic device of claim 6,
   wherein the PCB further comprises a contact electrically connected to the at least one power related component, and
   wherein the flexible conductive member is disposed between part of the at least one conductive path and the contact.

8. The electronic device of claim 1, wherein the PCB comprises a first PCB for mounting the at least one IC, and a second PCB for mounting the at least one power related component.

9. The electronic device of claim 1, wherein the metallic material comprises at least one of copper, aluminum, tungsten, zinc, nickel, or magnesium.

10. The electronic device of claim 1, further comprising:

an electrical shielding member disposed between the at least one conductive path and the PCB and covering at least part of the at least one conductive path.

11. The electronic device of claim 1, wherein the side member is attached to the second plate or integrally formed with the second plate.

12. An electronic device comprising:

a first cover forming a first surface which faces a first direction;

a second cover forming a second surface which faces a second direction opposite to the first direction;

a support structure comprising a bezel surrounding a space between the first cover and the second cover, and a mid-plate extending from the bezel to the space, wherein the mid-plate includes a conductive area and a nonconductive area;

a first component and a second component disposed between the support structure and the second cover;

at least one conductive path formed on the mid-plate and including a first contact, a second contact, and a line which electrically connects the first contact and the second contact; and a flexible conductive member for electrically connecting the first contact and the first component, or the second contact and the second component, wherein the non-conductive area electrically isolates the at least one conductive path from the conductive area, wherein the at least one conductive path electrically connects the first component and the second component, wherein the first component includes a power management integrated circuit (PMIC) or a charge IC, and wherein the second component includes a battery, or a connector which is mounted on the PCB and electrically connected with an external power device.

13. The electronic device of claim 12, wherein the first contact is electrically connected to the first component, and wherein the second contact is electrically connected to the second component.

* * * * *